United States Patent
Koyama et al.

(10) Patent No.: US 7,123,107 B2
(45) Date of Patent: *Oct. 17, 2006

(54) PIEZOELECTRIC OSCILLATOR, MANUFACTURING METHOD THEREOF, AND ELECTRONIC DEVICE

(75) Inventors: Yugo Koyama, Ina (JP); Katsuhiko Miyazaki, Minowa-machi (JP); Kazuhiko Shimodaira, Minowa-machi (JP); Yukari Nakajima, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 139 days.

This patent is subject to a terminal disclaimer.

(21) Appl. No.: 10/729,010

(22) Filed: Dec. 8, 2003

(65) Prior Publication Data

US 2004/0135645 A1 Jul. 15, 2004

(30) Foreign Application Priority Data

Dec. 10, 2002 (JP) ............................. 2002-358392
Apr. 10, 2003 (JP) ............................. 2003-106598
Jun. 16, 2003 (JP) ............................. 2003-171195
Sep. 26, 2003 (JP) ............................. 2003-334616

(51) Int. Cl.
*H03B 1/00* (2006.01)

(52) U.S. Cl. ............... 331/68; 331/158; 331/108 D; 310/348; 361/813; 361/753; 257/724; 257/725; 257/783

(58) Field of Classification Search ............ 331/68, 331/158, 108 D; 310/348; 361/813, 753; 257/724, 725, 783

See application file for complete search history.

(56) References Cited

U.S. PATENT DOCUMENTS

| 4,329,613 | A | | 5/1982 | Kinzel et al. |
| 5,463,253 | A | | 10/1995 | Waki et al. |
| 5,479,051 | A | * | 12/1995 | Waki et al. ............ 257/724 |
| 5,579,208 | A | | 11/1996 | Honda et al. |
| 5,912,592 | A | | 6/1999 | Kikushima |
| 6,917,142 | B1 | * | 7/2005 | Koyama et al. ........... 310/344 |
| 2004/0135645 | A1 | * | 7/2004 | Koyama et al. ........... 331/158 |
| 2004/0178858 | A1 | * | 9/2004 | Miyazaki et al. ......... 331/158 |

FOREIGN PATENT DOCUMENTS

| GB | 2 211 021 A | 6/1989 |
| JP | 87544 | 11/1980 |
| JP | 63-305604 | 12/1988 |
| JP | U 1-82507 | 6/1989 |
| JP | A-1-189151 | 7/1989 |
| JP | U-1-145140 | 10/1989 |
| JP | U 2-4312 | 1/1990 |

(Continued)

*Primary Examiner*—Michael B Shingleton
(74) *Attorney, Agent, or Firm*—Oliff & Berridge, PLC

(57) ABSTRACT

To provide a piezoelectric oscillator which can be reduced in size by reducing the planar size. With regard to a layered lead frame comprising two lead frames and, connection leads for connection with a piezoelectric resonator are formed on the upper lead frame and the connection leads are erected upwards so as to form connection terminals, and mounting leads for mounting to a mounting board are formed on the lower lead frame and the mounting leads are erected downwards so as to form mounting terminals, and an IC forming an oscillating circuit is mounted on the layered lead frame, the piezoelectric resonator formed by sealing a piezoelectric resonator element within a package is mounted on the layered lead frame, and the layered lead frame and the piezoelectric resonator are sealed within a resin package such that the principal surface of the mounting terminals are exposed outwards, thereby forming a completed article.

24 Claims, 42 Drawing Sheets

FOREIGN PATENT DOCUMENTS

| | | |
|---|---|---|
| JP | U-4-116416 | 10/1992 |
| JP | A 4-334202 | 11/1992 |
| JP | Y2 5-16724 | 5/1993 |
| JP | A 7-162236 | 6/1995 |
| JP | B2 2621828 | 4/1996 |
| JP | A-9-219491 | 8/1997 |
| JP | 09-260740 | 10/1997 |
| JP | A-10-256475 | 9/1998 |
| JP | A-2000-150720 | 5/2000 |
| JP | A-2000-150768 | 5/2000 |
| JP | 2001-332932 | 11/2001 |
| JP | A-2001-332932 | 11/2001 |
| JP | A-2002-158558 | 5/2002 |
| JP | 2002-330027 | 11/2002 |
| JP | A-2002-330027 | 11/2002 |
| TW | 372370 | 10/1999 |
| WO | WO 96/01524 | 1/1996 |

* cited by examiner

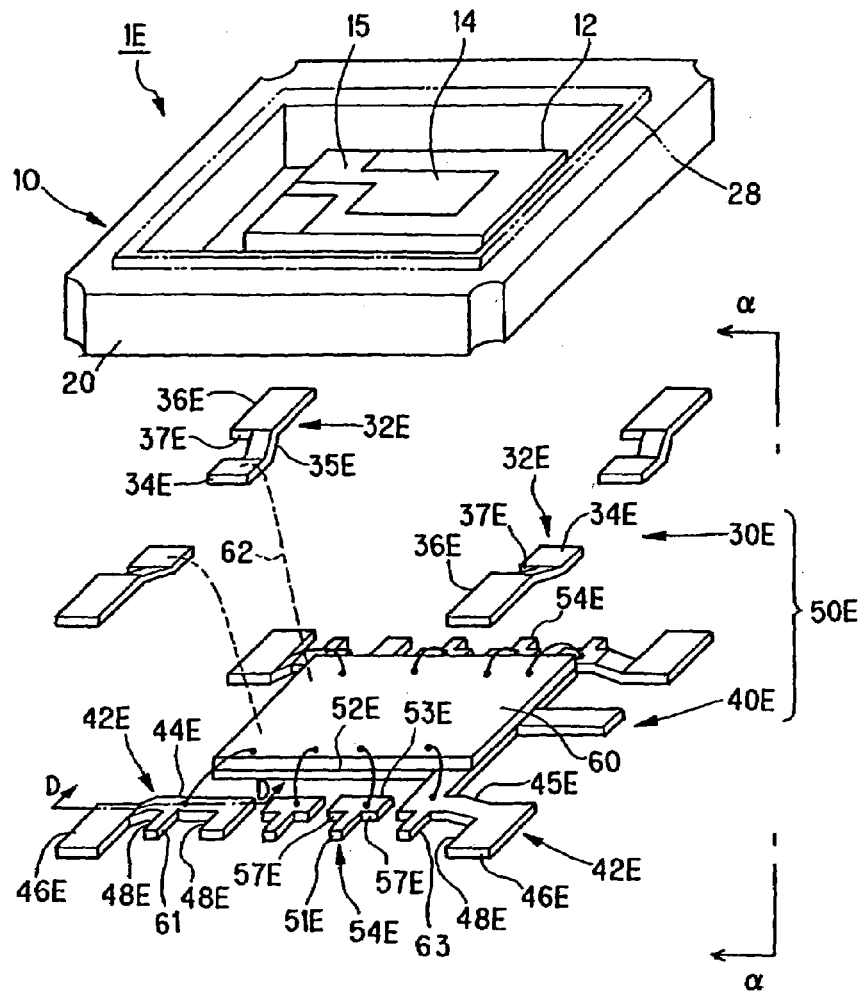
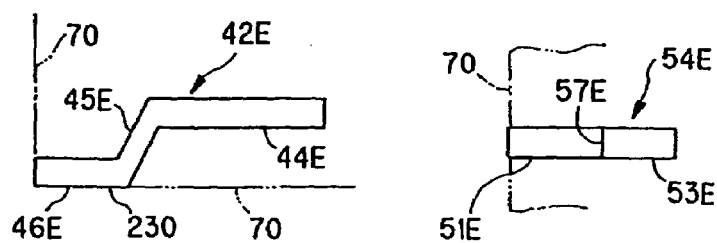
FIG. 19A
FIG. 19B  FIG. 19C

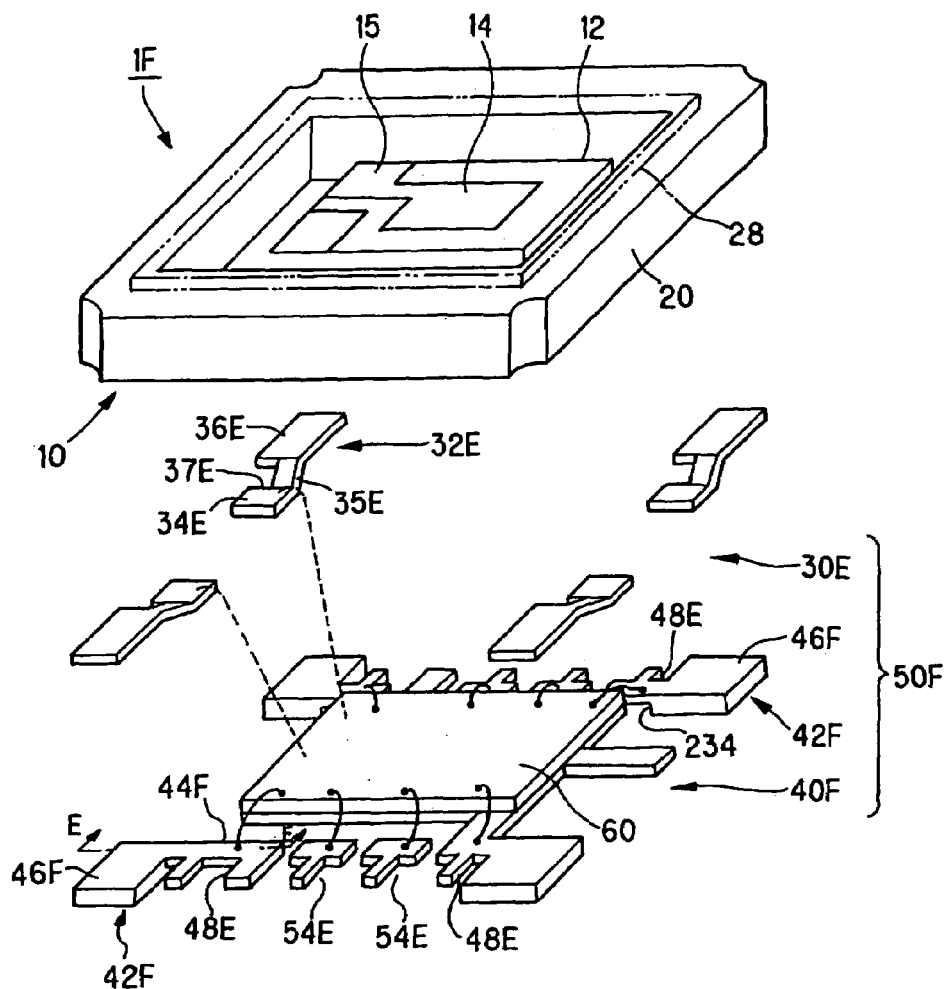
FIG. 20A
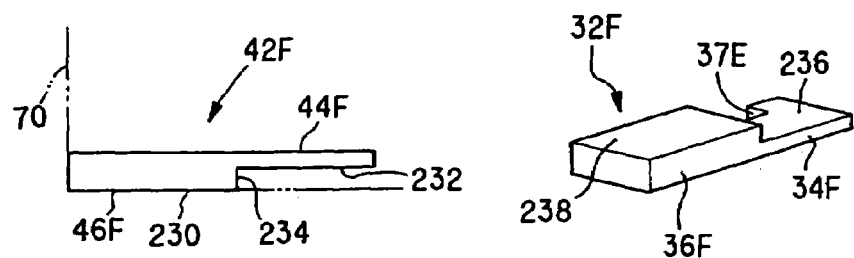
FIG. 20B
FIG. 20C

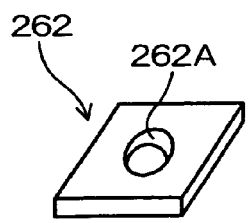
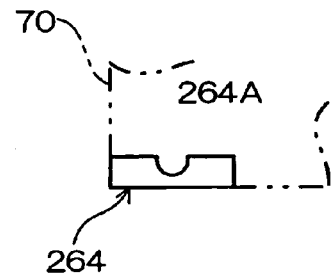
FIG. 25A         FIG. 25B
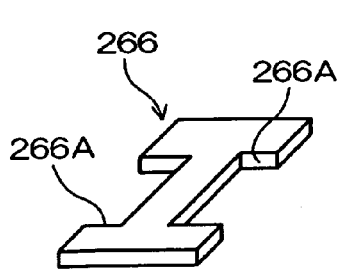
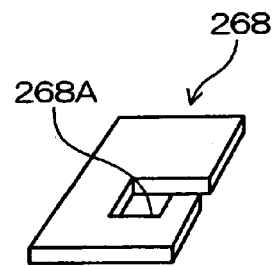
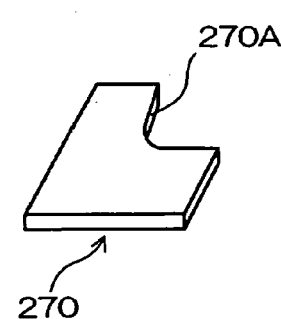
FIG. 25C    FIG. 25D    FIG. 25E
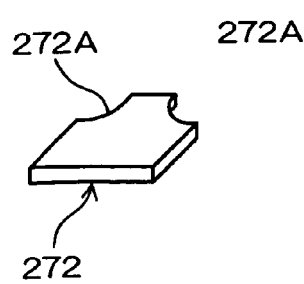
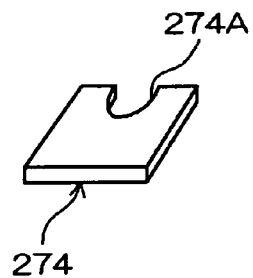
FIG. 25F    FIG. 25G

PIEZOELECTRIC OSCILLATOR, MANUFACTURING METHOD THEREOF, AND ELECTRONIC DEVICE

BACKGROUND OF THE INVENTION

1. Field of Invention

The present invention relates to a piezoelectric oscillator, a manufacturing method thereof, and an electronic device.

2. Description of Related Art

Piezoelectric oscillators are widely used to obtain constant frequency signals in electric circuits. Japanese Examined Utility Model Registration Application Publication No. 5-16724 describes a related art piezoelectric oscillator 501 shown in FIG. 9. Note that FIG. 9(A) is a plan view partway through manufacturing, and FIG. 9(B) is a side cross-sectional diagram at a portion equivalent to the plane H—H in FIG. 9(A). With the piezoelectric oscillator 501 shown in FIG. 9(B), a piezoelectric resonator 510 is mounted on the lower face of a lead frame 530, an integrated circuit device (IC) 560 is mounted on the upper face of the lead frame 530, and a resin package 570 is formed so as to seal the entirety with resin. Note that the cylinder-type piezoelectric resonator 510 shown in FIG. 9 is formed by sealing a piezoelectric resonator element, wherein an excitation electrode has been formed on a piezoelectric plate, within a metal cylinder, and extracting an external lead 524, for conducting between the excitation electrode and the external lead 524, from the cylinder. On the other hand, the IC 560 forms an oscillating circuit.

FIG. 9(A) illustrates the state immediately before forming the resin package 570. A die pad 552 is disposed at the center of the lead frame 530, with the IC 560 mounted thereupon. Also, mounting leads 542 for mounting the piezoelectric oscillator 501 are disposed on the four sides of the die pad 552, with each being electrically connected to the IC 560 by wire bonding. The outer portions of the mounting leads 542 are bent downwards after formation of the resin package 570, thereby forming mounting terminals. Further, connection leads 532 for connecting the piezoelectric resonator 510 and the IC 560 are formed at the intermediate portion of the mounting leads 542 in the vertical direction in FIG. 9(A). External leads 524 of the piezoelectric resonator 510 are connected to the lower face of the connection leads 532, and the upper face of the connection leads 532 are connected to the IC 560 by wire bonding. Thus, the piezoelectric resonator 510 and the IC 560 are electrically connected. The same configuration is illustrated in Japanese Patent No. 2621828 as well.

Piezoelectric oscillators are used in communication devices, such as cellular telephones and the like, but demands for reduction in the size of cellular telephones and the like are intensifying. Accordingly, there is strong demand for reduction in size and thickness of piezoelectric oscillators, as well. As of recent, package-type (plane-mounted) piezoelectric resonators have been developed, wherein a piezoelectric resonator element is sealed within a package, and external electrodes for conducting between excitation electrodes of the piezoelectric resonator element and external electrodes are formed on the rear face of the package. The reason that package-type piezoelectric resonators have been developed to replace the cylinder-type piezoelectric resonator 510 shown in FIG. 9 is in response to the demand for reduction in size and thickness of piezoelectric oscillators.

Along with reduction in size of piezoelectric oscillators, the mounting terminals and the like for joining to mounting boards are also reduced in size. Accordingly, the smaller the piezoelectric oscillators become, the smaller the area of contact between the mounting terminals and the mounting board becomes, reducing the joining strength. Accordingly, in the event that the piezoelectric oscillator is mounted in a portable electronic device such as a cellular telephone or the like, there is an increased probability that dropping the device may result in the piezoelectric oscillator coming loose at the portion of contact with the mounting board due to the great shock. This also holds true for the joining portion between the resin making up the resin package, and the terminals of the lead frame. Accordingly, the smaller piezoelectric oscillators become, the greater the importance is to enhance the strength of joining as to the mounting board and the resin making up the resin package.

However, with the above-described piezoelectric oscillator, there is the problem that the planar size increases, since the connection leads need to be disposed at the intermediate portion of the mounting leads. Consequently, there is a limit to reduction in the size of the piezoelectric oscillator. Accordingly, the present invention reduces the size by reducing the planar size. Also, the present invention enhances joining strength. Further, the present invention enhances mounting strength.

SUMMARY OF THE INVENTION

In order to achieve the above, the piezoelectric oscillator according to an aspect of the present invention is a piezoelectric oscillator having a plurality of leads formed of one or more lead frames, terminals, which are formed on the plurality of leads and distanced one from another, are arrayed in multiple tiers in the vertical direction of a package. Due to an aspect of the present invention being configured thus, the terminals do not need to be arrayed in planar fashion since the terminals are arrayed in multiple tiers in the vertical direction of the package. This enables the planar size to be reduced, and the size thereof to be reduced.

Also, with the piezoelectric oscillator including as the terminals at least connection terminals to connect with a piezoelectric resonator and mounting terminals to mount to a mounting board, the piezoelectric resonator formed by sealing a piezoelectric resonator element within a resonator package is mounted on the connection terminals, an IC forming an oscillating circuit being mounted on the lead frame, and the lead frame and the piezoelectric resonator being sealed within the package, such that the principal surface of the mounting terminals are exposed outwards, thereby forming a resin package. In this case, good-quality piezoelectric resonators and good-quality ICs can be combined to form the piezoelectric oscillator, by adjusting the frequency of the piezoelectric resonator and checking the operation of the IC, before mounting the piezoelectric resonator on the lead frame. This reduces or prevents wasting good ICs, thereby enhancing the yield of ICs, and reducing manufacturing costs.

Further, the configuration has the entirety of the lead frame and the piezoelectric resonator sealed with resin, so even in the event that the combination of the piezoelectric resonator and IC type changes, the same resin molding mold can be used. Accordingly, small lots of a great number of types can be handled. Also, the entirety of the lead frame and the piezoelectric resonator can be insulated, also reducing or preventing intrusion of foreign matter and moisture. Accordingly, electric and chemical failure can be reduced or prevented.

Also with an aspect of the present invention, with regard to a layered lead frame including two lead frames, connection leads to connect with a piezoelectric resonator were formed on one of the lead frames on one side, the connection leads were erected to the one side so as to form connection terminals while mounting leads to mount to a mounting board were formed on the other of the lead frames on the other side, the mounting leads were erected to the other side so as to form mounting terminals, an IC forming an oscillating circuit was mounted on the layered lead frame, the piezoelectric resonator formed by sealing a piezoelectric resonator element within a package is mounted on the layered lead frame, and the layered lead frame and the piezoelectric resonator were sealed within a resin package while the principal surface of the mounting terminals were exposed outwards, thereby yielding a completed article.

In this case, the connection terminals and mounting terminals can be disposed in a layered manner, and these do not need to be disposed side by side. Accordingly, the planar size of the piezoelectric oscillator can be reduced. In this case, good-quality piezoelectric resonators and good-quality ICs can be combined to form the piezoelectric oscillator, by adjusting the frequency of the piezoelectric resonator and checking the operation of the IC before mounting the piezoelectric resonator on the layered lead frame. This reduces or prevents wasting good ICs, thereby enhancing the yield of ICs, and reducing the manufacturing costs.

Further, the configuration has the entirety of the layered lead frame and the piezoelectric resonator sealed with resin, so even in the event that the combination of the piezoelectric resonator and IC type changes, the same resin molding mold can be used. Accordingly, small lots of a great number of types can be handled. Also, the entirety of the layered lead frame and the piezoelectric resonator can be insulated, also reducing or preventing intrusion of foreign matter and moisture. Accordingly, electric and chemical failure can be reduced or prevented.

Also, an aspect of the present invention includes: a layered lead frame configured of a lead frame on one side where connection leads are formed, and a lead frame on the other side where mounting leads are formed, being layered; an IC configuring an oscillating circuit and mounted on the layered lead frame; a piezoelectric resonator mounted to connection terminals provided on the connection leads with a piezoelectric resonator element being sealed within a resonator package; and a resin package, the layered lead frame and the piezoelectric resonator being sealed therein with the principal surface of mounting terminals provided on the mounting leads exposed; one of the connection leads and the mounting leads being bent in the direction opposite to the plane of layering.

The aspect of the present invention arranged thus yields the same advantages as described above, and also the height-wise dimensions can be reduced since the layered lead frame is formed bending only one lead frame, whereby the thickness of the piezoelectric oscillator can be reduced further. Also, there is no need to bend the other lead frame, so the manufacturing process can be simplified.

Also, the resin package may be formed by forming adjusting terminals on the layered lead frame to inspect the properties of the IC, adjusting the properties, and/or confirming conduction between the piezoelectric resonator and the connection terminals, the adjusting terminals being externally exposed, and the layered lead frame and the piezoelectric resonator are sealed inside the resin package. This enables inspecting the properties of the IC, adjusting the properties, and/or confirming conduction between the piezoelectric resonator and the connection terminals, in the state of a completed product after being sealed in the resin.

The mounting terminals maybe at a position higher or lower than the adjusting terminals, but preferably are formed at the same height as the adjusting terminals. Thus, there is no need to erect the mounting leads to the other side to make the mounting terminals and the adjusting terminals to be different heights at the time of working the lead frame on the other side, thereby simplifying the manufacturing process.

The adjusting terminals may be formed exposed at the bottom face of the resin package. Exposing the adjusting terminals at the bottom face of the resin package enables the adjusting terminals to be joined to (mounted on) the mounting board, thereby enhancing the mounting strength of the piezoelectric oscillator, and increasing shock resistance.

Further, the lead frame at the other side may have portions other than the mounting terminals formed thinner than the mounting terminals. Thus, the mounting terminals can be formed without erecting (bending) the mounting leads. Accordingly, the area of the mounting terminals can be increased, thereby increasing the mounting strength (joining strength) to the mounting board. Also, the entire lead frame on the other side is thinner than the mounting terminals, so the resin package can be made thinner. Also, the lead frame at the one side may have the portions thereof other than the connection terminals formed thinner than the connection terminals. Accordingly, the area of the connection terminals can be increased, thereby increasing the mounting strength (joining strength) with the piezoelectric resonator. Also, the entire lead frame on the one side is thinner than the connection terminals, so the resin package can be made thinner.

The mounting terminals may be provided at a position higher than the lower face of the resin package. Accordingly, solder fills in the gap formed between the mounting terminals and the mounting board at the time of mounting the piezoelectric oscillator to the mounting board, so the state of joining of the mounting terminals can be readily confirmed by eye.

Also, the layered lead frame and the piezoelectric resonator may be sealed within a resin package such that the side face of the mounting terminals, as well as the principal surface of the mounting terminals, are exposed outwards, thereby forming a resin package. In this case, the solder not contained within the principal surface of the mounting terminals follows the side face of the mounting terminals upwards. Consequently, a fillet is formed from the electrode of the mounting board to the side face of the mounting terminal. Thus, the joining of the electrode of the mounting board and the mounting terminal of the piezoelectric oscillator can be readily externally confirmed.

Also, the tips of the mounting terminals may protrude from the side face of the resin package. Thus, at the time of joining the mounting terminal to the mounting board, the solder follows the portion of the mounting terminal protruding from the resin package upwards and forms a fillet, so whether or not a good mount (joining) has been made can be readily determined by eye. Also, the solder covers the mounting terminal protruding form the resin package, so the mounting strength can be enhanced.

The mounting leads may be formed with irregular shapes. As the size of piezoelectric oscillators is reduced, it becomes difficult to form portions on the mounting leads to catch on the resin and serve as anchors. Accordingly, forming the mounting leads with irregular shapes, such as protrusions, notches, recesses, and so forth, allows the resin to be caught and provide great anchor effects, thereby enhancing the mounting strength. Also, the mounting terminals may have at least one or more recesses or protrusions formed on the principal surface. Thus, the area of contact between the mounting terminals and the resin making up the resin package substantially increases, and also the anchor effects of the resin which has entered the recesses, or the protrusions, enable the strength of joining with the resin to be enhanced, thereby reducing or preventing the resin from peeling off. Further, the mounting terminals may have at least one or more recesses or protrusions formed on the face joining the resin, opposite to the principal surface. Thus, the area of contact between the mounting terminals and the resin making up the resin package substantially increases, and also the anchor effects of the resin which has entered the recesses, or the protrusions, enables the strength of joining with the resin to be enhanced, thereby reducing or preventing the resin from peeling off.

The connection leads may be formed with irregular shapes. Thus, even in the event that the size of the piezoelectric oscillator is reduced further, this provides great anchor effects as to the resin, thereby enhancing the joining strength. Also, the connection terminals may have at least one or more recesses or protrusions formed on one or both of the principal surface to connect to the piezoelectric resonator, and the opposite face. Thus, the area of contact between the connection terminals and the piezoelectric resonator, or the area of contact between the connection terminals and the resin making up the resin package, increases, and also the anchor effects of the recesses or protrusions provided on connection terminals act to enhance the strength of joining with the piezoelectric resonator or the resin of the resin package to be enhanced.

Notches to permit intrusion of resin may be formed on one or both of the connection leads and the mounting leads. Thus, the resin making up the resin package intrudes into the notches and exhibits anchoring effects, so that the strength of joining between the resin and the connection leads or the mounting leads is enhanced, and shock resistance can be enhanced. Also, recesses or protrusions may be formed on the sides of one or both of the connection terminals and the mounting terminals. Thus, anchoring effects to the resin can be obtained, and mounting strength can be enhanced.

The sides of one or both of the connection terminals and the mounting terminals may be inclined in the thickness direction thereof. As for the direction of inclination of the inclined face, preferably, the side of the terminal at the inner side of the resin package is wider, and the width at the outer side of the resin package narrower. Thus, event in the event that force is applied in the thickness direction of the terminal, the chance that the terminal comes loose from the resin can be reduced.

A portion of the mounting leads may protrude from the side face of the resin package, and bend downwards so as to be capable of being mounted to a mounting board. Thus, the area joining to the mounting board increases, and the mounting strength can be enhanced. The portion of the mounting lead bent downward may be formed as a J-lead with the tip positioned below the resin package, or may be formed as a gull-wing with the tip at the outer side of the resin package. Bending of the portion of the mounting lead downward can be performed according to the usage conditions and the usage environment of the piezoelectric oscillator, thereby enhancing flexibility with regard to mounting.

A portion of the adjusting terminals may protrude from the side face of the resin package, and bend downwards so as to be capable of being mounted to a mounting board. Thus, the mounting terminals and adjusting terminals can be joined to the mounting board, thereby enhancing mounting strength. The adjustment terminal bent downward may be formed as a J-lead with the tip positioned below the resin package, or may be formed as a gull-wing with the tip at the outer side of the resin package. Bending of the portion of the adjustment terminal downward can be performed according to the usage conditions and the usage environment of the piezoelectric oscillator, thereby enhancing flexibility with regard to mounting.

The IC may be mounted to the one lead frame. Thus, even in the event that there is intrusion of water from the lower side of the piezoelectric oscillator, this does not readily reach the IC, so failure of the IC can be reduced or prevented. Also, in the event that a temperature compensation circuit is provided to the IC, the temperature sensor is disposed near the piezoelectric resonator, so the difference in temperature between the temperature sensor and the piezoelectric resonator element can be reduced. Accordingly, the temperature properties of the piezoelectric resonator element can be accurately corrected.

Retaining portions for retaining in the height direction of the piezoelectric resonator may be formed on the side face of the package, and then the layered lead frame and the piezoelectric resonator sealed within the resin package, thereby forming the resin package. Thus, the piezoelectric resonator does not readily come loose from the piezoelectric oscillator.

In order to connect the terminals of the IC and the mounting terminals, a pair of wiring leads may be formed on one lead frame on the one side, with the wiring leads erected in the one side so as to form a pair of wiring terminals, and one of the pair of wiring leads connected to one of the IC terminals or the mounting terminals and the other of the pair of wiring leads connected to the other of the IC terminals or the mounting terminals, and with a pair of electrode pads connected to each of the pair of wiring terminals and a wiring pattern mutually connected to each of the pair of electrode pads having been formed on the piezoelectric resonator. Thus, even in the event that the order of assignment of functions to the IC terminals are not the same as the order of assignment of functions to the mounting terminals, electric connection can be made between the corresponding terminals. Consequently, the same type of IC can be shared between piezoelectric oscillators with different orders of assignment of functions to the mounting terminals. Accordingly, the number of IC types can be reduced, thereby reducing manufacturing costs and the cost of the completed product.

The layered lead frame and the piezoelectric resonator may be sealed within the resin package, with the upper face of the lid of the piezoelectric resonator externally exposed, thereby forming the resin package. The product specifications of the piezoelectric resonator are inscribed on the upper face of the lid, so exposing the lid need not inscribe the product specifications on the surface of the resin package. Also, the position of the lid is fixed within the resin molding mold, so the attitude of the piezoelectric resonator can be stabilized. Also, the lid of the piezoelectric resonator may be sealed within the resin package, thereby forming the resin package. This need not mask the upper face of the lid to reduce or prevent the exposed lid from being covered with solder plate in the step of solder plating the surface of the mounting terminals.

On the other hand, a method for manufacturing a piezoelectric oscillator according to an aspect of the present invention includes: a step to, with regard to a layered lead frame including two lead frames, forming connection leads to connect with a piezoelectric resonator on one of the lead frames on one side and erecting the connection leads to the one side so as to form connection terminals, and forming mounting leads to mount to a mounting board on the other of the lead frames on the other side and erecting the mounting leads to the other side so as to form mounting terminals, and layering the lead frames to form the layered lead frame; a step to mount an IC forming an oscillating circuit on the layered lead frame; a step to mount on the layered lead frame, the piezoelectric resonator formed by sealing a piezoelectric resonator element within a package; and a step to seal the layered lead frame and the piezoelectric resonator within a resin package such that the principal surface of the mounting terminals are exposed outwards. Thus, the planar size of the piezoelectric oscillator can be reduced.

Further, a method for manufacturing a piezoelectric oscillator according to an aspect of the present invention includes: a step to, with regard to a layered lead frame including two lead frames, forming connection leads to connect with a piezoelectric resonator on one of the lead frames on one side and erecting the connection leads to the one side so as to form connection terminals, and forming mounting leads to mount to a mounting board on the other of the lead frames on the other side and reducing the thickness of the base side of the mounting leads to form mounting terminals at the tips there, and layering the lead frames to form the layered lead frame; a step to mount an IC forming an oscillating circuit on the layered lead frame; a step to mount on the layered lead frame, the piezoelectric resonator formed by sealing a piezoelectric resonator element within a package; and a step to seal the layered lead frame and the piezoelectric resonator within a resin package such that the principal surface of the mounting terminals are exposed outwards. Accordingly, the essential joining area of the mounting terminals can be made larger since inclined portions are not formed to the mounting leads, so the strength of joining to the mounting board can be increased. Making the base side of the mounting leads thinner can be readily performed by press plasticity working or etching.

Further, the method may further include a step to remove resin adhering to the principal surface of the mounting terminals. This allows solder plating to the principal face of the mounting terminals. Further, the step to seal within the resin package may be performed by pressing the principal face of the mounting terminals against a mold face, and the unnecessary portions of the mounting terminals being cut off in a subsequent step to cut the resin package off from the frame portion of the lead frame. Thus, the principal surface of the mounting terminals can be pressed tightly against the face of the mold at the time of sealing with resin, so resin can be prevented from adhering to the principal surface of the mounting terminals, and a step to remove the resin adhering to the principal surface can be omitted. Also, cropping off unnecessary portions of the mounting terminals at the time of cutting the resin package off from the frame portion of the lead frame prevents the mounting area from being large.

An electronic device according to an aspect of the present invention has one of the above-described piezoelectric oscillators. Thus, an electronic device can be obtained which is reduced in size, has excellent shock resistance, and high reliability.

BRIEF DESCRIPTION OF THE DRAWINGS

FIGS. 19(A)–19(C) are disassembled perspective views of a piezoelectric oscillator according to a fifth exemplary embodiment;

FIGS. 20(A)–20(C) are disassembled perspective views of a piezoelectric oscillator according to a sixth exemplary embodiment;

FIGS. 25(A)–25(G) are schematics illustrating mounting terminals formed in irregular shapes;

DETAILED DESCRIPTION OF PREFERRED EMBODIMENTS

Preferred exemplary embodiments of the piezoelectric oscillator, manufacturing method thereof, and electronic device, according to aspects of the present invention, will be described with reference to the attached figures. Note that the following are only one arrangement of exemplary embodiments according to aspects of the present invention, and that the present invention is not restricted to these.

Figure 1:
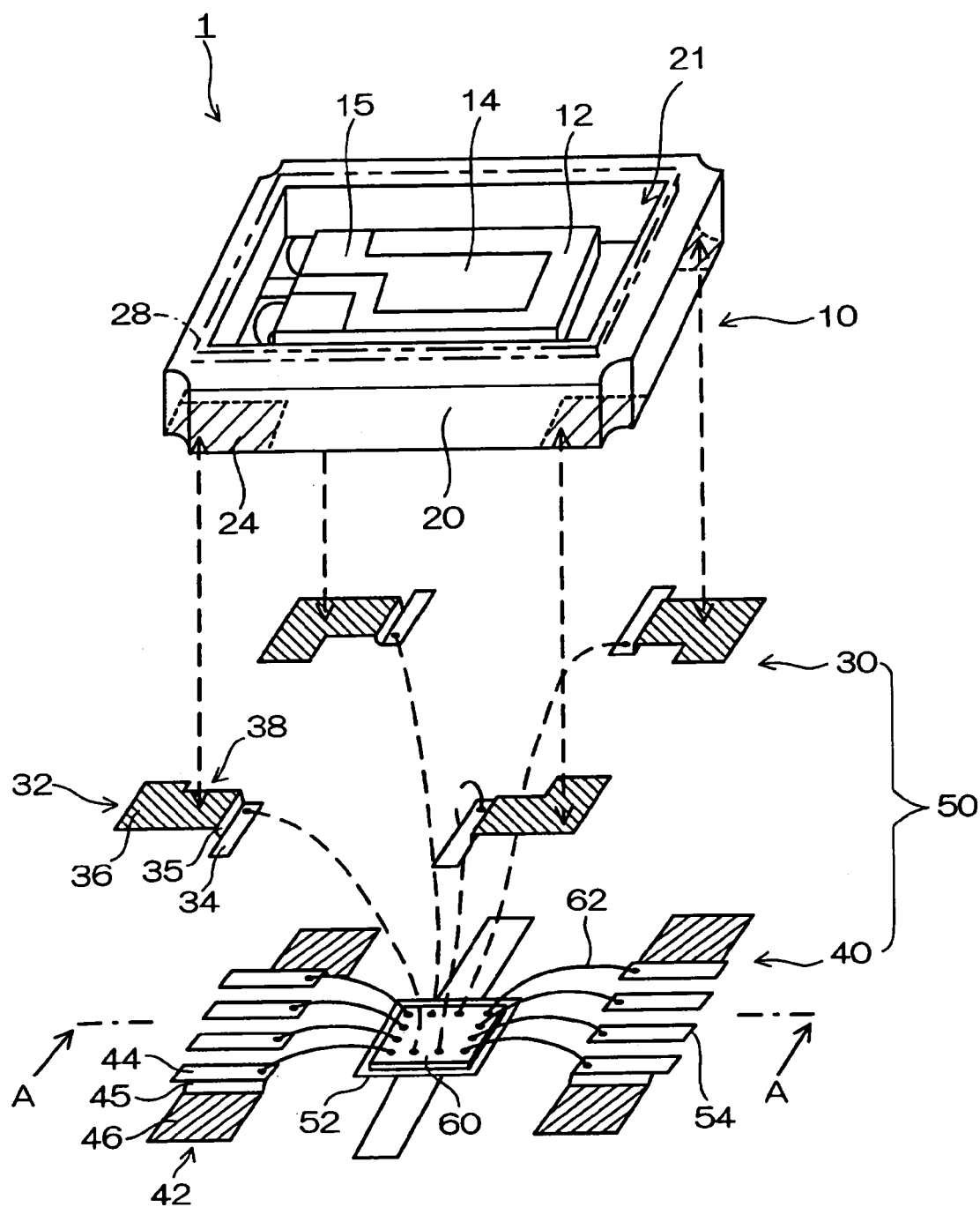
FIG. 1 is a perspective view of a disassembled state of a piezoelectric oscillator according to a first exemplary embodiment.
Figure 2:
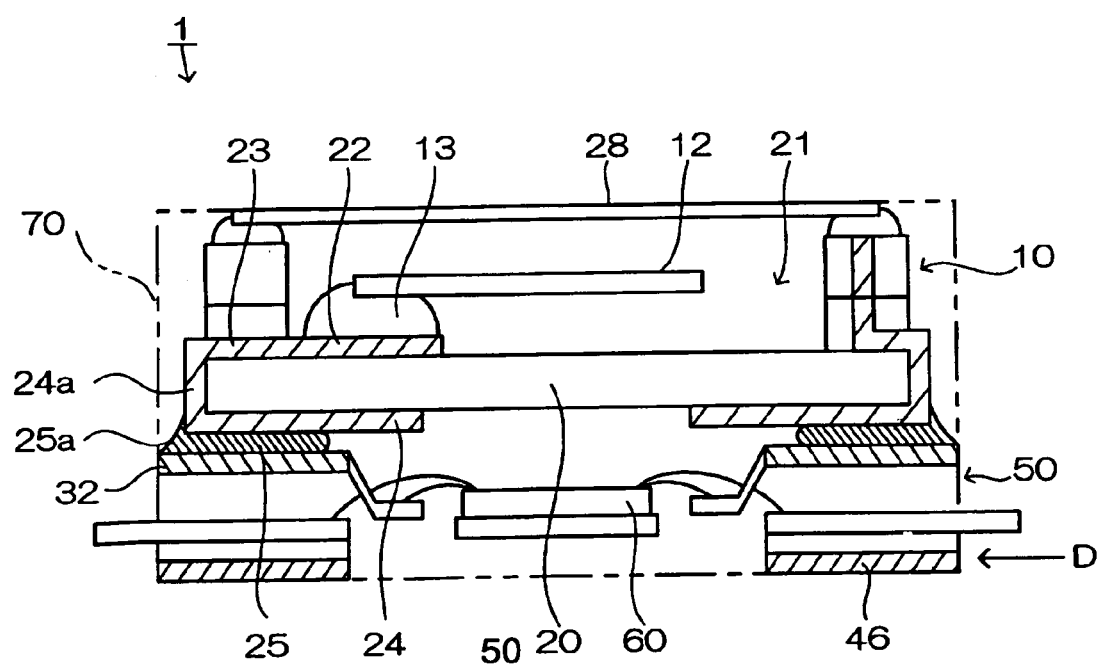
FIG. 2 is a side cross-sectional view of the piezoelectric oscillator according to the first exemplary embodiment.

First, a first exemplary embodiment will be described. FIG. 1 shows a perspective view where a piezoelectric oscillator according to the first exemplary embodiment is in a disassembled state. Also, FIG. 2 shows a side cross-sectional schematic along plane A—A in FIG. 1. Note that FIG. 2 shows the state where the resin package 70 has been removed. That is to say, the cross-section at the portion of the layered lead frame 50 in FIG. 2 also shows terminal portions at positions which are not actually cut, but this has been added to facilitate understanding, and does not indicate a cut face, but rather illustrates the position in the up and down directions (vertical direction) of each of the terminal portions and so forth. The piezoelectric oscillator 1 according to the first exemplary embodiment has a layered lead frame 50 configured of two lead frames 30 and 40, connection leads 32 to connect to a piezoelectric resonator 10 are formed on the upper side lead frame 30 and the connection leads 32 are erected upwards to form connection terminals 36, and mounting leads 42 to mount to a mounting board are formed on the lower side lead frame 40 and the mounting leads 42 are erected downwards to form mounting terminals 46, with the IC 60 forming an oscillating circuit being mounted on the layered lead frame 50, the piezoelectric resonator 10 formed by sealing a piezoelectric resonator element 12 within a package 20 being mounted on the layered lead frame 50, and the layered lead frame 50 and the piezoelectric resonator 10 being sealed within a resin package 70 (see FIG. 2) such that the principal surfaces of the mounting terminals 46 are exposed outwards, thereby yielding a completed article. Note that the IC may be electronic parts, such as resistors or capacitors or the like, as well.

Figure 3A:
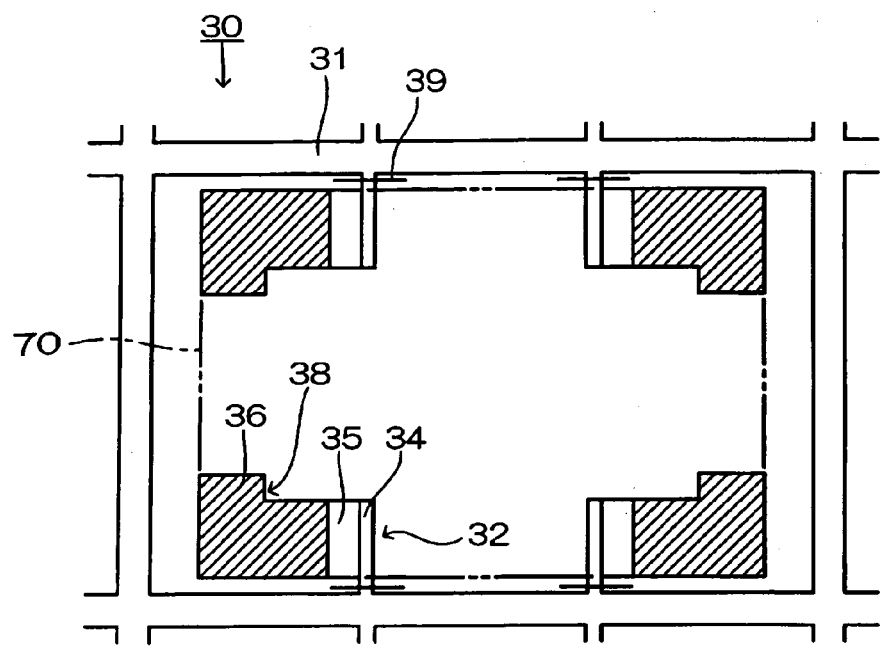
FIGS. 3(A)–3(B) are plan views of a lead frame.
Figure 3B:
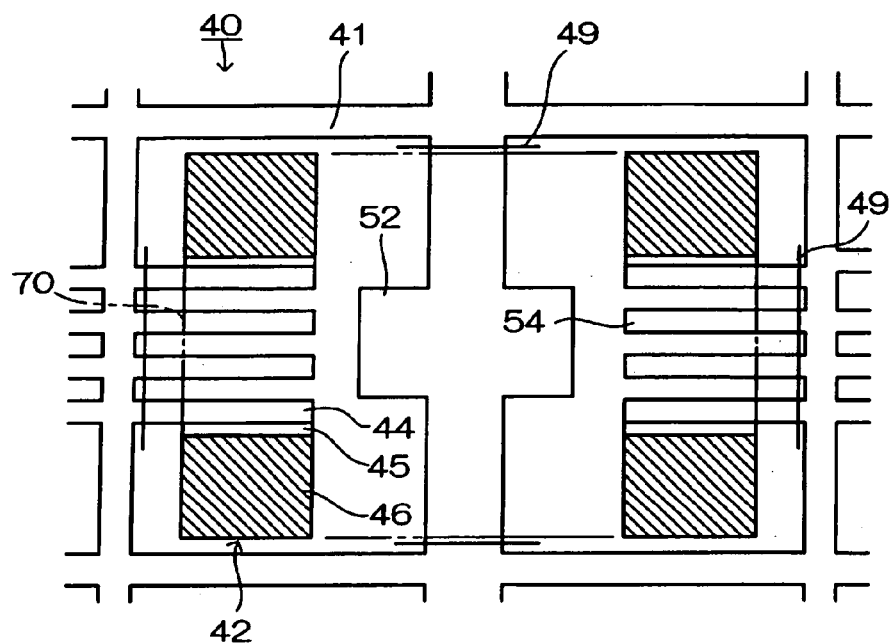

FIGS. 3(A)–3(B) show plan views of a lead frame. Note that FIG. 3(A) is a plan view of the upper lead frame, and FIG. 3(B) is a plan view of the lower lead frame. With the first exemplary embodiment, the two lead frames 30 and 40 are laid one upon the other to form the layered lead frame 50. The lead frames 30 and 40 have parallel-cross shaped frames 31 and 41 on electroconductive metal sheets, with the same pattern being repeatedly formed on the inner side of the frames 31 and 41.

With the upper lead frame 30 which is the one lead frame shown in FIG. 3(A), connecting leads 32 to connect to the piezoelectric resonator are formed at the four corners on the inner side of the frame 31. Note that at least three external electrodes are formed on the piezoelectric resonator, as a total of external electrodes conducting with a pair of exciting electrodes, and a grounding external electrode, so at least three connection leads 32 are formed on the upper lead frame 30. Wire bonding pads 34 are formed on the inner side edge portion of each connection leads 32, in the direction of the long side of the frame 31. Note that the pads 34 are brought into contact with the long side of the frame 31, in order to support the pads 34 on the same plane as the frame 31. Thus, the connection leads 32 are fixed to the frame 31. On the other hand, inclined portions 35 upwards are formed on the outer side of the pads 34, and further, connection terminals 36 are formed on the outer side of the inclined portions 35. Erecting the inclined portions 35 from the pads 34, as shown in FIG. 1, disposes the connection terminals 36 parallel with the upper lead frame 30, at a position distanced therefrom by a predetermined distance. Note that the predetermined distance is a distance greater than the maximum height of the wires 62 bonded to the IC 60.

With the lower lead frame 40 which is the other lead frame shown in FIG. 3(B), mounting leads 42 to mount to the mounting board are formed at the four corners on the inner side of the frame 41. Note that wire bonding pads 44 are formed on the inner side edge portion of each mounting lead 42, in the direction of the short side of the frame 41. Note that the pads 44 are brought into contact with the short side of the frame 41, in order to support the pads 44 on the same plane as the frame 41. Thus, the connection leads 42 are fixed to the frame 41. On the other hand, inclined portions 45 are formed on the outer side of the pads 44, and further, mounting terminals 46 are formed on the outer side of the inclined portions 45. Erecting the inclined portions 45 downwards from the pads 44, as shown in FIG. 1, disposes the mounting terminals 46 parallel with the lower lead frame 40, at a position distanced therefrom by a predetermined distance.

Adjusting terminals 54 to inspect the properties of the IC, adjusting the properties, and/or confirming conduction between the piezoelectric resonator and the connection terminals, are formed at intermediate portions on the mounting leads 42 in the short side direction of the frame 41. Inspecting the properties refers to properties inspection, such as checking the actions of the IC following formation of the resin, properties as a piezoelectric oscillator, and so forth. Also, properties adjustment refers to correcting the frequency change due to the temperature of the piezoelectric oscillator in the event that a temperature compensation circuit has been added to the IC, or adjusting change sensitivity in the event that a function for changing the frequency according to the input voltage has been added to the IC. The adjusting terminals 54 connect to the short side of the frame 41, and are supported on the same plane as the lower lead frame 40. Also, the mounting terminals 46 are disposed below the lower lead frame 40 with a predetermined distance therebetween, so there is no short-circuiting between the adjusting terminals 54 and the electrodes or the like of the mounting board. On the other hand, a die pad 52 is formed at the center portion within the frame 41 of the lower lead frame 40. The die pad 52 is connected to the long sides of the frame 41, and is supported on the same plane as the lower lead frame 40. Note that the adjusting terminals 54 and the die pad 52 may be formed on the upper lead frame as well. Also, the positions where the connection terminals, mounting terminals, adjusting terminals, and die pad are connected to the frames are not restricted to the long sides or short sides. For example, in the event that there is a great number of adjusting terminals, the adjusting terminals are connected to the long sides, and the die pad is connected to the short sides.

The upper lead frame 30 and the lower lead frame 40 are overlaid, thereby forming the layered lead frame. The upper lead frame 30 and the lower lead frame 40 are fixed by performing spot welding or the like on the frames 31 and 41 thereof. The leads of the lead frames are formed on the inner sides of the frames 31 and 41 such that there is no contact between the upper lead frame 30 and the lower lead frame 40. Thus, the layered lead frame 50 has two tiers of terminals mutually separated in a direction substantially perpendicular to a main plane of the lower lead frame 40. That is to say, the layered lead frame 50 has the connection terminals 36 and the mounting terminals 46 overlaid at the same position when viewed in planar fashion.

On the other hand, as shown in FIG. 1, the integrated circuit device (IC) 60 is mounted on the upper face of the die pad 52. The IC 60 has an oscillating circuit formed, with a temperature compensation circuit or voltage control circuit added if necessary. The IC 60 is mounted on the upper face of the die pad 52 using an adhesive agent. Note that the IC 60 may be mounted to the lower face of the die pad 52 as well. Of course, mounting the IC 60 on the upper face of the die pad 52 keeps any moisture which might intrude from the lower side of the piezoelectric oscillator from readily reaching the IC 60, thereby enabling failures of the IC 60 to be reduced or prevented. Also, in the event that a temperature compensation circuit is added to the IC 60, the temperature sensor thereof is disposed near the piezoelectric resonator 10, so the temperature difference between the temperature sensor and the piezoelectric resonator element 12 can be reduced. Accordingly, the temperature properties of the piezoelectric resonator element 12 can be accurately corrected.

Further, the terminals of the layered lead frame 50 and the terminals on the upper face of the IC 60 are electrically connected. Specifically, the pads 34 of the connection terminals 36, the pads 44 of the mounting terminals 46, and the adjusting terminals 54, are connected to the terminals on the upper face of the IC 60, by wire bonding. Note that a notches 38 are formed in the connection leads 32, so the pads 44 of the mounting terminals 46 are exposed upwards. Thus, wire bonding can be performed to the pads 44 of the mounting terminals 46.

On the other hand, a piezoelectric resonator 10 is formed by sealing the piezoelectric resonator element 12 into the package 20. As shown in FIG. 2, the package 20 is formed by layering and baking multiple sheets formed of ceramic materials and the like. Specifically, the sheets are blanked into predetermined shapes, and predetermined wiring patterns are formed on the surface of the sheets, before the sheets are layered and baked. A cavity 21 is formed on this package 20, and a mount electrode 22 is formed on the bottom of the cavity 21. Also, and external electrode 24 is formed on the rear side of the package 20, and conduction with the mount electrode 22 is secured via wiring patterns 23 and 24a. Note that vertical connection may be made through a through hole instead of the side electrode 24a.

As shown in FIG. 1, the piezoelectric resonator element 12 is formed of excitation electrodes 14 on both faces of a plate formed of a piezoelectric material, such as crystal or the like. Note that a connecting electrode 15 is formed on the edge of the piezoelectric plate, for conduction between the excitation electrodes 14. As shown in FIG. 2, the piezoelectric resonator element 12 is mounted within the cavity 21 of the package 20 in a cantilever state. Specifically, an electroconductive adhesive agent 13 is applied to the mount electrode 22 of the package 20, to which the connecting electrode 15 (see FIG. 1) of the piezoelectric resonator element 12 is applied. Thus, electricity can be applied to the excitation electrodes 14 (see FIG. 1) of the piezoelectric resonator element 12 from the external electrode 24 outside of the package 20. Note that the piezoelectric resonator element 12 may be mounted so as to be supported by both sides instead.

Further, a lid 28 is mounted on the opening of the cavity 21 of the package 20, and the interior of the cavity 21 is sealed airtight as a nitrogen atmosphere or a vacuum atmosphere. Metal lids are mounted to the package 20 by seam welding, and glass lids with low-melt glass. Thus, the piezoelectric resonator 10 is completed. The article mounted within the package 20 is not restricted to an AT cut piezoelectric resonator element, and may be a tuning-fork resonator element or a SAW chip instead.

Now, before mounting the piezoelectric resonator 10 to the layered lead frame 50, the piezoelectric resonator 10 is subjected to frequency adjustment and a check of the operations of the IC 60. This allows a good piezoelectric resonator 10 and a good IC 60 to be combined to form the piezoelectric oscillator. Note that with piezoelectric oscillator types, the IC being first mounted within the package and the piezoelectric resonator element being mounted above this, defects on the piezoelectric resonator element may be discovered at the stage of adjusting the frequency following mounting of the piezoelectric resonator element. In this case, the good IC must be discarded along with the defective piezoelectric resonator element. From this point, with the first exemplary embodiment, good ICs are not discarded, so the yield of ICs is enhanced, and manufacturing costs can be reduced.

The piezoelectric resonator 10 is then mounted to the layered lead frame 50. Specifically, the external electrode 24 of the piezoelectric resonator 10 is connected to the connecting terminal of the layered lead frame via solder 25 or electroconductive adhesive agent or the like. Though the external electrode 24 of the piezoelectric resonator 10 may be formed on the rear side of the package 20 alone, extending and forming an external electrode 24a along the side face from the rear face is preferable. In this case, the portion of the solder not contained within the rear face of the package 20 follows the side face of the external electrode 24 upwards. Consequently, a fillet 25a is formed from the connection terminal 36 of the layered lead frame 50 to the external electrode 24a of the package side face. Thus, the connection between the connection terminal 36 of the layered lead frame 50 and the external electrode 24 of the piezoelectric resonator 10 can be readily externally confirmed. Also, the external electrode 24 of the piezoelectric resonator 10 may be formed on the side face of the package 20 alone. Also, while the piezoelectric resonator is supported to the connection terminals alone with the present exemplary embodiment, supporting the piezoelectric resonator by adding electrically isolated dummy connection terminals or the like can enhance supporting strength and reduce or prevent deformation of the lead frame.

The layered lead frame 50 and the piezoelectric resonator 10 are sealed within the resin package 70. Specifically, the layered lead frame 50 mounted with the piezoelectric resonator 10 is placed within a resin molding mold, and the resin package 70 is formed by injection-molding of thermalhardening resin. As shown in FIGS. 3(A)–3(B), the resin package 70 is formed on the inner side of the frames 31 and 41 of the lead frames 30 and 40. Following formation of the resin package 70, the connections between the frames 31 and 41 of the lead frames 30 and 40 and the leads are cut. The cut positions 39 and 49 are preferably near the surface of the resin package 70. The adjusting terminal 54 of the IC is cut in the state of protruding from the resin package 70.

Figure 4A:
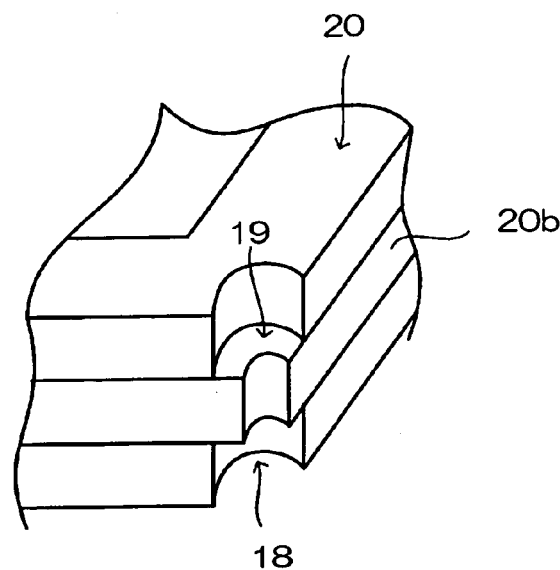
FIGS. 4(A)–4(H) are perspective views of castellation portions of a package.
Figure 4B:
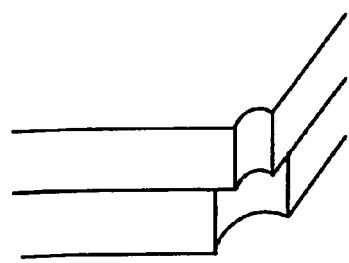
Figure 4C:
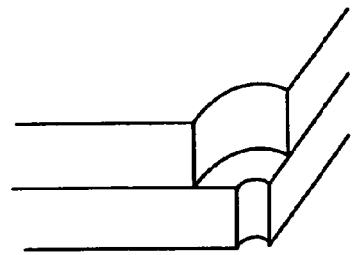
Figure 4D:
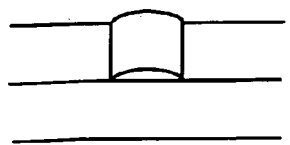
Figure 4E:
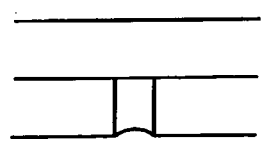
Figure 4F:
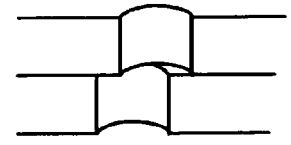
Figure 4G:
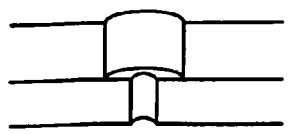
Figure 4H:
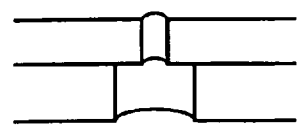

As shown in FIG. 2, sealing the layered lead frame 50 and the piezoelectric resonator 10 within the resin package 70 enables the relative position of the two to be fixed. Note that forming protrusions and recesses on the sides of the package 20 of the piezoelectric resonator 10 to seal the resin creates retaining portions which make it more difficult for the piezoelectric resonator to come loose from the piezoelectric oscillator, thereby firmly fixing the piezoelectric resonator. FIGS. 4(A)–4(H) illustrate castellation formed at the side corner portion of the package of the piezoelectric resonator. A castellation 18 is generally formed at the side of the package 20. Accordingly, a retaining portion 19 is formed to the castellation 18. In order to form the retaining portion 19, the diameter of the through hole to serve as the castellation or the position of boring the through hole should be changed, as shown in FIG. 4(A)–FIG. 4(H), with regard to the portion 20b of the ceramic sheet making up the package 20. Note that FIG. 4(A)–FIG. 4(C) are examples of forming retaining portions at castellation at the package corner, and FIG. 4(D)–FIG. 4(H) are examples of forming retaining portions at castellation at the package side.

On the other hand, the upper face of the lid 28 of the piezoelectric resonator 10 is exposed at the upper face of the resin package 70. The product specifications of the piezoelectric resonator 10 are inscribed on the upper face of the lid 28, so exposing the lid 28 does not need to inscribe the product specifications on the surface of the resin package 70. Also, the attitude of the piezoelectric resonator 10 within the resin molding mold can be stabilized. On the other hand, as described later, the upper face of the lid 28 needs to be masked in the step to solder plate the surface of the mounting terminals 46, to reduce or prevent the exposed lid 28 from being covered with the solder plating. From this point, this is not necessary in the event that the lid 28 is sealed within the resin package 70.

Figure 5A:
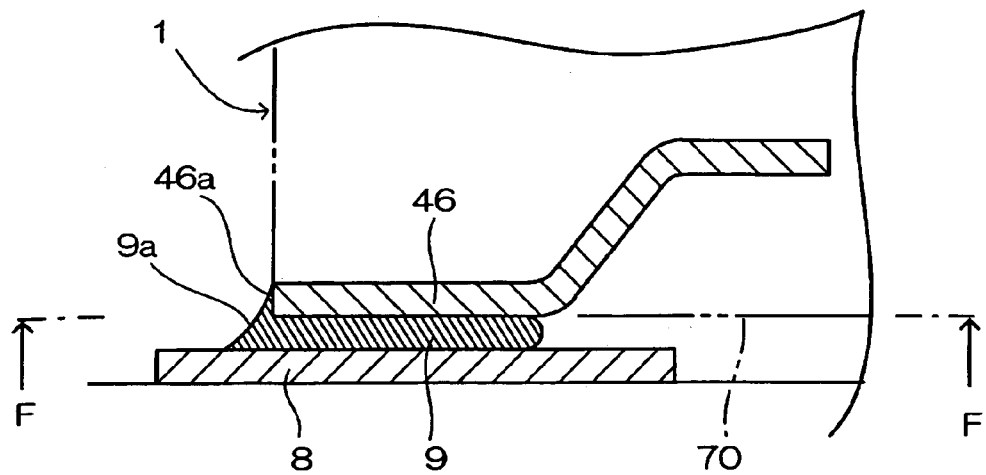
FIGS. 5(A)–5(B) are explanatory schematics of mounting terminals.
Figure 5B:
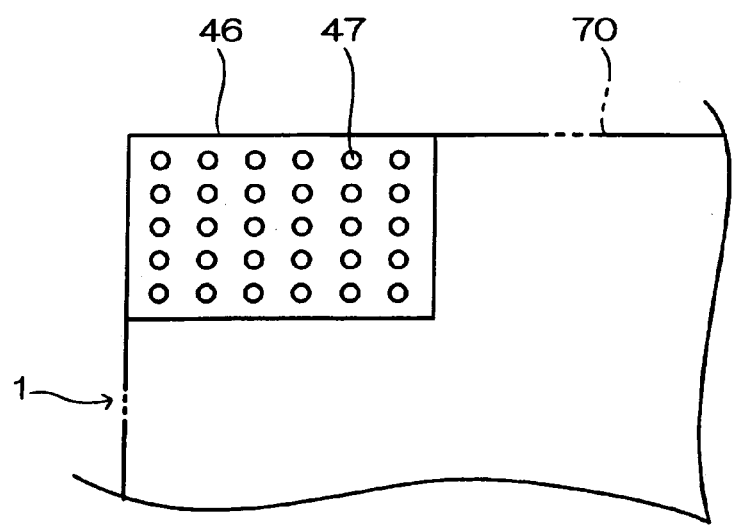

Also, the principal surface of the mounting terminal 46 is exposed at the lower face of the resin package 70. FIG. 5(A) illustrates a view along the arrow D in FIG. 2, and FIG. 5(B) illustrates a bottom cross-sectional view along the plane F—F in FIG. 5(A). As shown in FIG. 5(A), the piezoelectric oscillator 1 according to an aspect of the present invention is mounted to the electrode 8 on the mounting board by solder 9. Now, the sides 46a of the mounting terminal 46 are also preferably exposed, in addition to the principal surface thereof. In this case, the portion of the solder 9 not contained within the principal surface of the mounting terminal 46 follows the side face 46a upwards. Consequently, a fillet 9a is formed from the electrode 8 of the mounting board to the side face 46a of the mounting terminal. Thus, the connection between the electrode 8 of the mounting board and the mounting terminal 46 of the piezoelectric oscillator 1 can be readily externally confirmed.

Also, as shown in FIG. 5(B), dimples (recesses) 47 may be formed on the principal surface of the mounting terminal 46 beforehand. The dimples 47 are formed by masking the portions of the principal surface of the mounting terminal 46 other than the portions for forming the dimples 47, and half-etching the principal surface of the mounting terminal 46. Mounting a piezoelectric oscillator 1 having such mounting terminals 46 results in solder entering the dimples 47 and exhibiting anchoring effects. Accordingly, the mounting terminals 46 of the piezoelectric oscillator 1 can be securely fixed to the electrodes 8 of the mounting board, thereby enhancing the mounting strength of the piezoelectric oscillator 1.

In order to expose the principal surface of the mounting terminals 46 on the lower face of the resin package 70 as shown in FIG. 5(A), injection molding of resin is performed in a state that the principal surface of the mounting terminal 46 is in planar contact with the bottom face of the resin molding mold. However, the injection pressure of the resin causes the resin to intrude between the principal surface of the mounting terminal 46 and the resin molding mold, such that resin adheres to the principal surface of the mounting terminal 46. As described above, solder plating is to be applied to the principal surface of the mounting terminal 46, but in the event that resin has adhered to the principal surface of the mounting terminal 46, the solder plating does not adhere. Accordingly, removal of the resin adhered to the principal surface of the mounting terminal 46 is performed. Removing of the resin is performed by blasting the mounting terminals 46 with a fluid or water containing a polishing agent. Note that the resin may also be removed by methods, such as irradiating the mounting terminals 46 with lasers, applying chemicals, or the like.

Figure 6A:
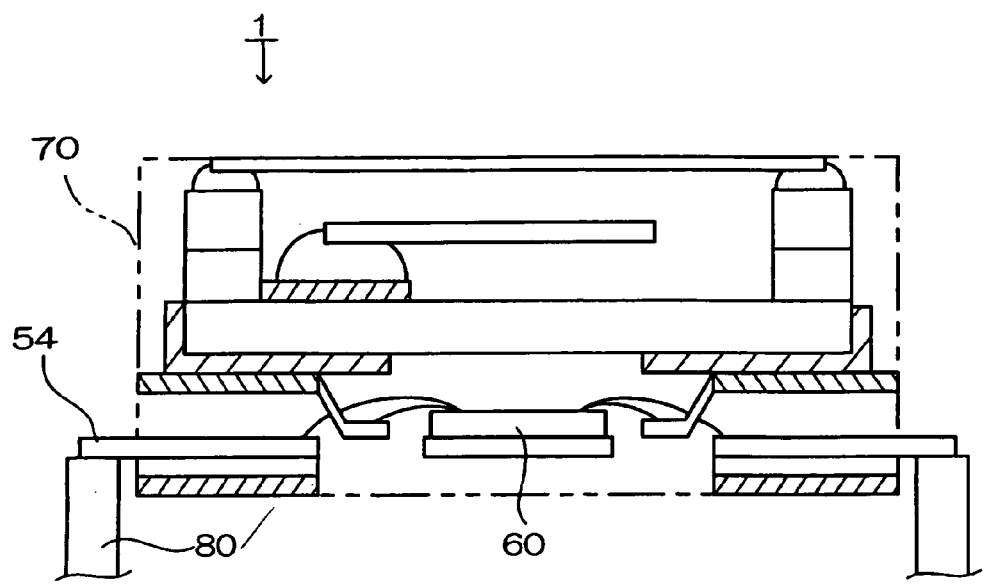
FIGS. 6(A)–6(B) are explanatory schematics of a frequency adjusting step.
Figure 6B:
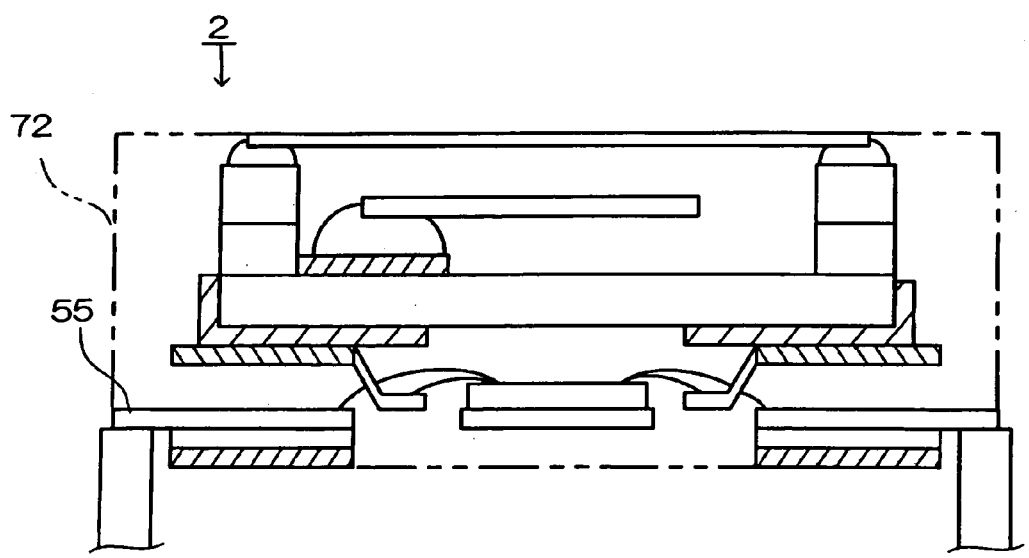

Next, the lower face of the mounting terminals 46 are subjected to solder plating. At this time, the upper face of the lid 28 is masked so that the exposed upper face of the lid 28 (see FIG. 2) is not covered with solder plating. Next, the piezoelectric oscillator is subjected to frequency adjustment. FIGS. 6(A)–6(B) show explanatory schematics of the frequency adjustment process. Note that FIGS. 6(A)–6(B) are side cross-sectional schematics of the portion equivalent to the plane A—A in FIG. 1. As shown in FIG. 6(A), a probe 80 is brought into contact from below with the adjusting terminal 54 which is exposed externally from the resin package 70, and the frequency of the piezoelectric oscillator 1 is adjusted by writing to the IC 60. Note that the probe 80 may be brought into contact from above, as well. Also, the adjusting terminal 54 following frequency adjustment is cut off near the surface of the resin package 70. Also, an arrangement may be made wherein the frequency adjustment of the piezoelectric oscillator 1 is performed while bending the adjusting terminals 54 with probes 80, and the article is shipped as a product without cutting off the adjusting terminals 54 following frequency adjustment. FIG. 6(B) is a modification example of the resin package. With this modification example, a resin package 72 is expanded and formed above the adjusting terminals 55. Frequency adjustment of this piezoelectric oscillator 1 is also performed in the same way as above, but the article is shipped as a product without cutting off the adjusting terminals 55 following frequency adjustment.

Thus, the piezoelectric oscillator 1 according to the first exemplary embodiment, where mutually separated terminals are disposed in multiple tiers (two tiers in the case of the embodiment) in the vertical direction on the package is completed. With the piezoelectric oscillator 1 according to the first exemplary embodiment described in detail above, the planar size can be reduced.

That is, with the first exemplary embodiment, with regard to the layered lead frame configured of two lead frames, the connection leads to connect to the piezoelectric resonator were formed on the upper lead frame and the connection leads were erected upwards to form connection terminals, while the mounting leads to mount to the mounting board were formed on the lower lead frame, and the mounting leads were erected downwards to form mounting terminals, thereby configuring the layered lead frame. In this case, the connection terminals and the mounting terminals can be disposed to be vertically overlapped, so the two do not need to be disposed next to each other. Accordingly, the planar size of the piezoelectric oscillator can be reduced. Also, the area of the mounting terminals can be kept large.

Note that with the first exemplary embodiment, a configuration wherein the entirety of the piezoelectric resonator and the layered lead frame is sealed within the resin package is employed. In this case, even in the event that the combination of piezoelectric resonator and IC changes, the same resin molding mold can be used, so small lots of a great types can be handled. Also, the position of the connection terminals can be accurately determined with regard to the outer shape of the resin package, so the piezoelectric oscillator can be precisely mounted by positioning based on the outer shape. Further, sealing with resin enables the entirety of the piezoelectric resonator and the layered lead frame to be insulated, also reducing or preventing intrusion of foreign matter and moisture. Accordingly, electric and chemical failure can be reduced or prevented.

Figure 8:
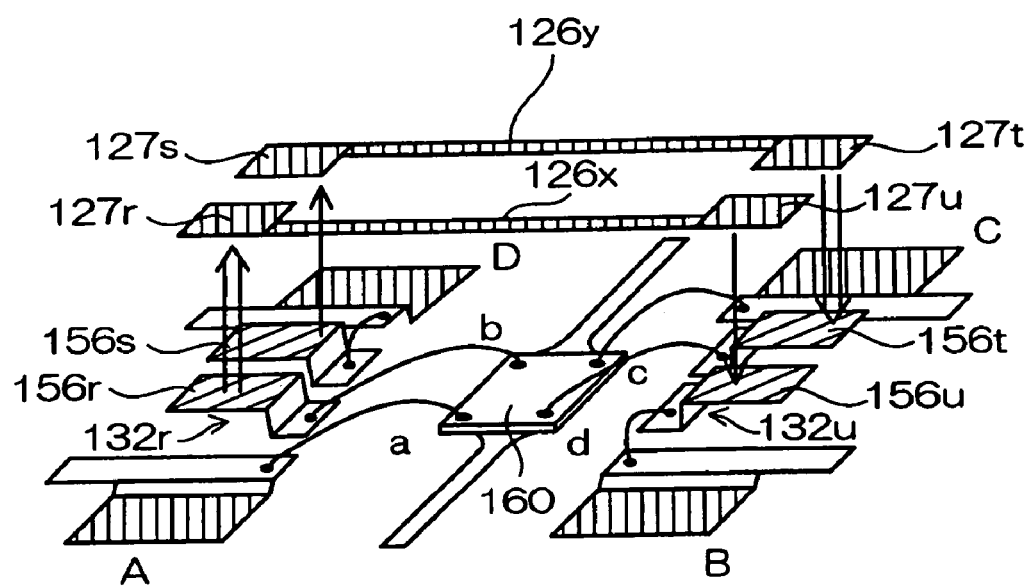
FIG. 8 is an explanatory schematic of a wiring state.
Figure 9A:
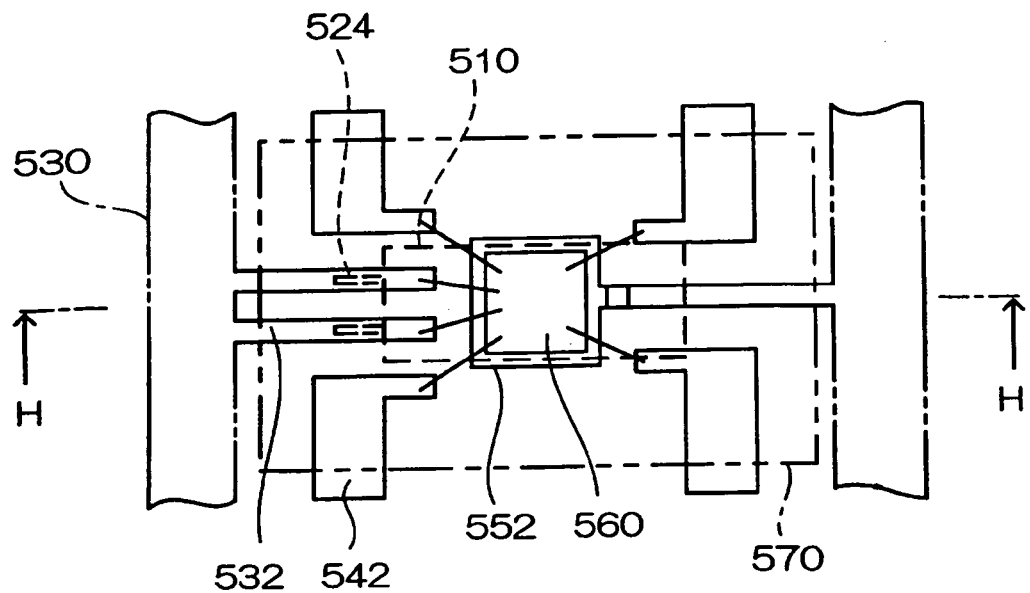
FIGS. 9(A)–9(B) are explanatory schematics of a piezoelectric oscillator according to the related art.
Figure 9B:
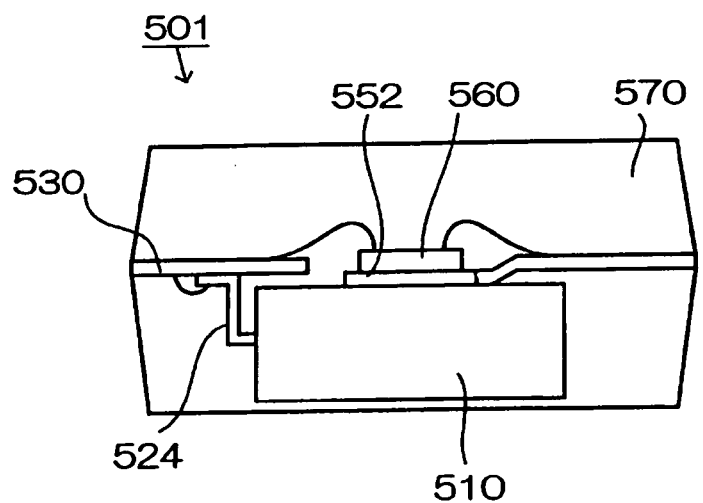

Next, a second exemplary embodiment will be described. FIG. 8 shows an explanatory schematic of the wiring state. The piezoelectric oscillator according to the second exemplary embodiment has a terminal b of the IC 160 connected to a mounting terminal B, and accordingly, a pair of wiring leads 132r and 132u are formed on the upper lead frame 130 and the wiring leads 132r and 132u are erected upwards to form a pair of wiring terminals 156r and 156u, with the wiring lead 132r being connected to the IC terminal b, and also the wiring lead 132u being connected to the mounting terminal B, and the pair of electrode pads 127r and 127u to be connected to each of the pair of wiring terminals 156r and 156u, and a wiring pattern 126x to mutually connect the pair of electrode pads 127r and 127u, are formed on the piezoelectric resonator. Description of portions with the same configuration as the first exemplary embodiment will be omitted.

With the second exemplary embodiment, let us consider a case wherein the functions of A, D, C, and B are assigned in order to the mounting terminals, while the terminals on the upper face of the IC 160 have the functions of a, b, c, and d in that order. Such cases can occur when using general-purpose ICs and assigning functions of the mounting terminals according to the mounting board electrodes. Now, connecting between b-B and d-D with wire bonding may result in the wires crossing and short-circuiting. Accordingly, these terminals cannot be wired by wire bonding. Accordingly, with the second exemplary embodiment, the wiring patterns 126 from the IC to the mounting terminals are formed on the package of the piezoelectric resonator.

Figure 7:
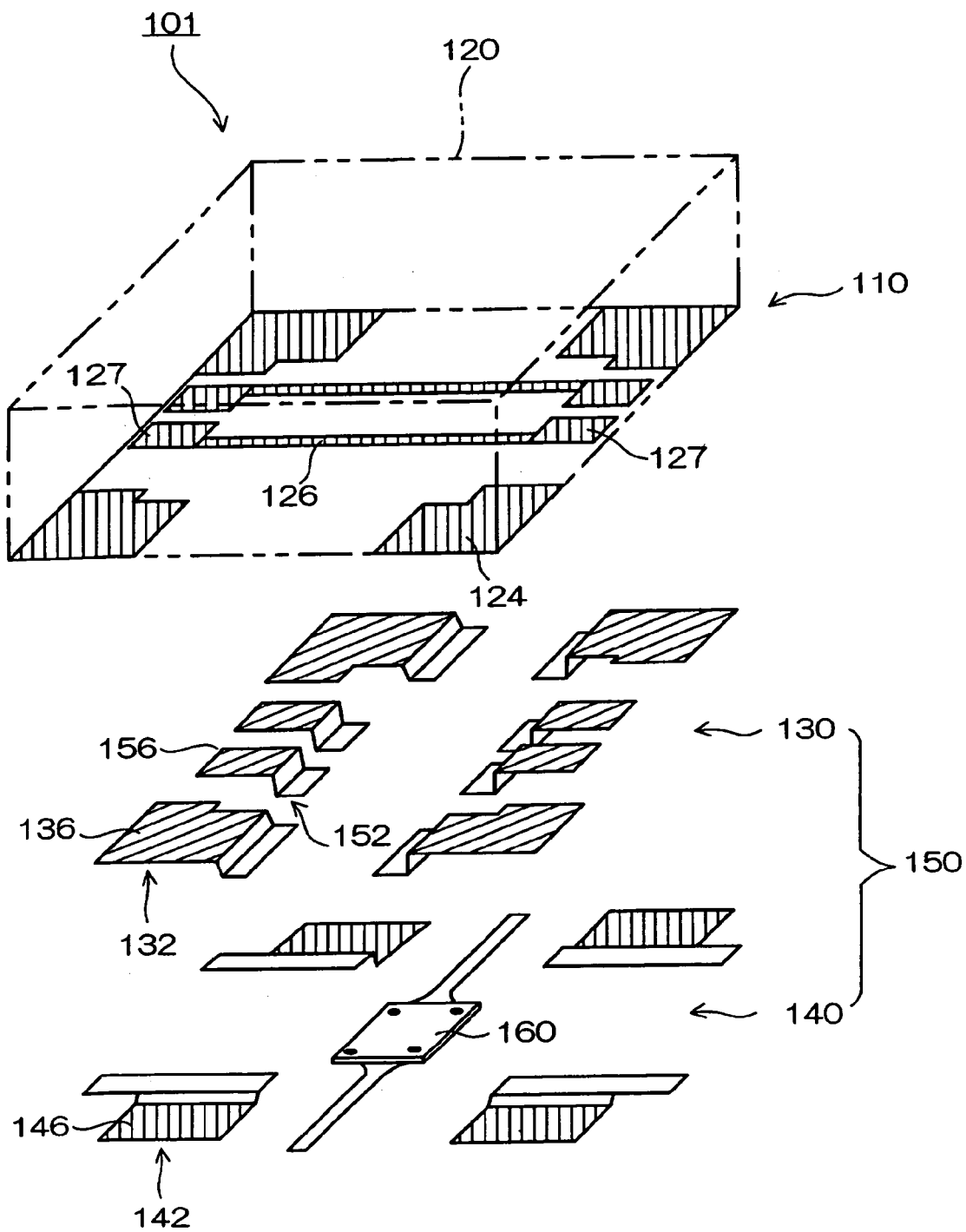
FIG. 7 is a perspective view of a disassembled state of the piezoelectric oscillator according to the first exemplary embodiment.

FIG. 7 illustrates a perspective view of the piezoelectric oscillator according to the second exemplary embodiment in a disassembled state. In the second exemplary embodiment as well, two lead frames 130 and 140 are overlaid to form the layered lead frame 150. Connection leads 132 are formed at the four sides of the upper lead frame 130, and the outer side portions thereof are erected upwards to form connection terminals 136. Wiring leads 152 are formed at the intermediate portion of the connection leads 132 in the depth-wise direction in FIG. 7. The outer side portions of the wiring leads 152 are erected upwards to form wiring terminals 156. Note that with the second exemplary embodiment, two wiring terminals 156 are formed in array at the intermediate portion of the connection terminals 136. On the other hand, mounting leads 142 are formed at the four sides of the lower lead frame 140, and the outer side portions thereof are erected downwards to form mounting terminals 146.

On the other hand, external electrodes 124 are formed on the four corners of the rear side of the package 120 in the piezoelectric resonator 110. Also, electrode pads 127 are formed at the intermediate portions of the external electrodes 124 in the depth-wise direction in FIG. 7. Note that with the second exemplary embodiment, two electrode pad 127 are formed in array at the intermediate portion between the external electrodes 124. Also, the wiring pattern 126 to connect the electrode pads 127 arranged in the horizontal direction in FIG. 7 to each other is formed. Note that with the second exemplary embodiment, two wiring patterns 126 are formed in array. The wiring patterns do not necessarily have to be formed on the rear face of the package, and may rather be formed on the side face or inside of the package 120.

As shown in FIG. 8, the IC 160 and the leads are connected as follows. Note that FIG. 8 omits the connection terminals of the layered lead frame and the external electrodes of the piezoelectric resonator. First, the IC terminal a and mounting terminal A, and the IC terminal c and mounting terminal C, are electrically connected by wiring bonding. Also, the IC terminal b is connected to the wiring lead 132r, and the mounting terminal B to the wiring lead 132u, respectively by wiring bonding. Now, the piezoelectric resonator is mounted on the layered lead frame, and connecting the electrode pad 127r to the wiring terminal 156r, and the electrode pad 127u to the wiring terminal 156u, electrically connects the IC terminal b and the mounting terminal B via the wiring pattern 126x formed on the rear face of the package. In the same way, the IC terminal d is connected to the wiring terminal 156t, and the wiring terminal 156s to the mounting terminal D, respectively. Now, the piezoelectric resonator is mounted on the layered lead frame, and connecting the electrode pad 127t to the wiring terminal 156t, and the electrode pad 127s to the wiring terminal 156s, electrically connects the IC terminal d and the mounting terminal D via the wiring pattern 126y formed on the rear face of the package.

With the piezoelectric oscillator according to the second exemplary embodiment described above in detail, even in the event that the order of assigning IC terminal functions is different from the order of assigning functions to the mounting terminals, the corresponding terminals can be electrically connected. Consequently, ICs of the same type can be shared between piezoelectric oscillators with different orders of assigning mounting terminal functions. Accordingly, the types of ICs are reduced, so manufacturing costs and product costs can be reduced.

Figure 10:
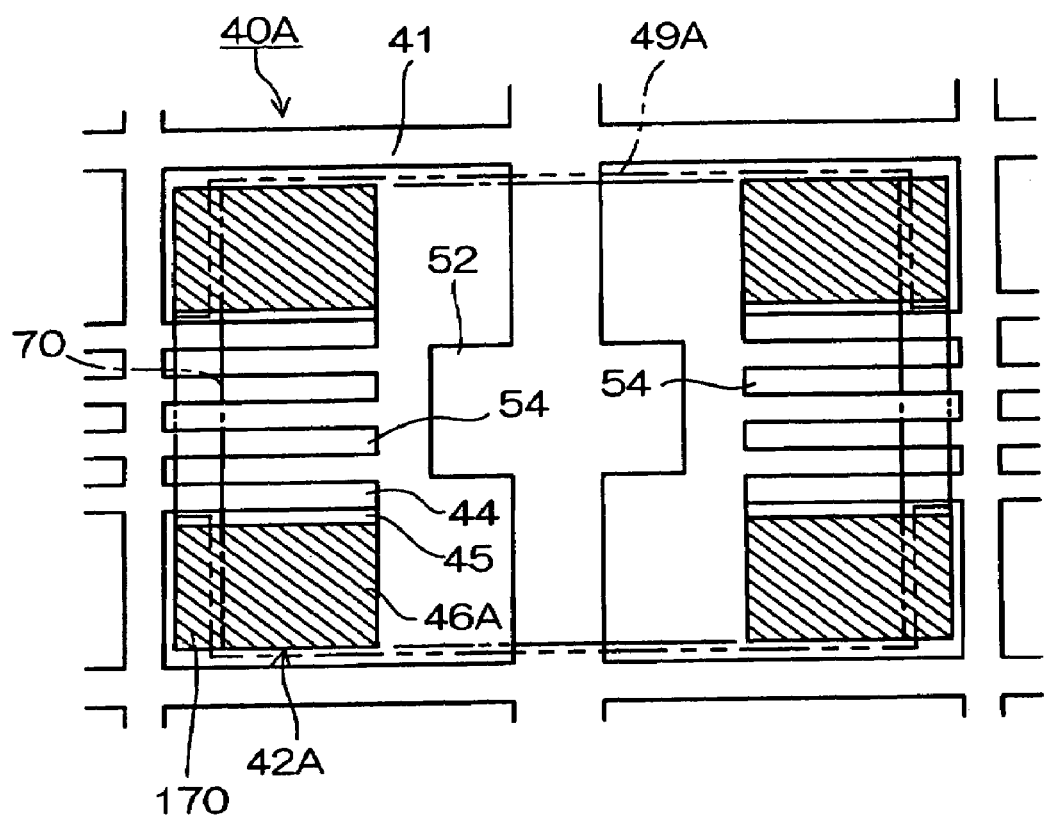
FIG. 10 is an explanatory schematic of a lead frame according to a third exemplary embodiment.
Figure 11A:
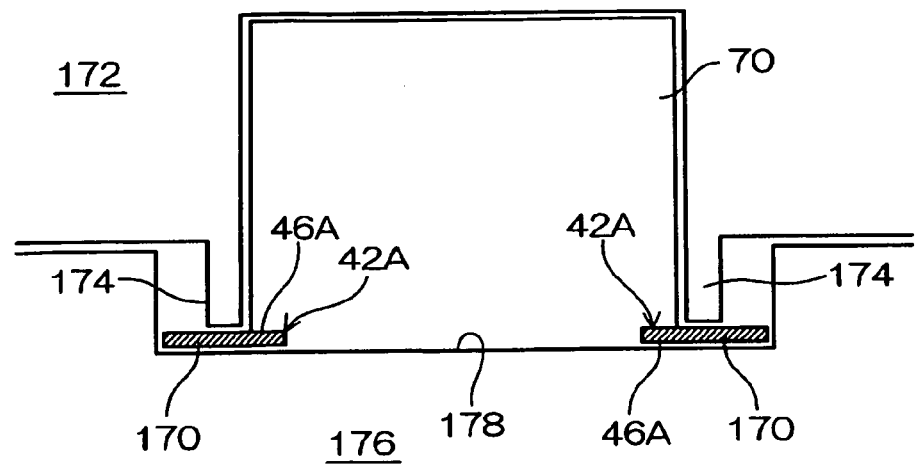
FIGS. 11(A)–11(B) are explanatory schematics of resin sealing of the lead frame according to the third exemplary embodiment.
Figure 11B:
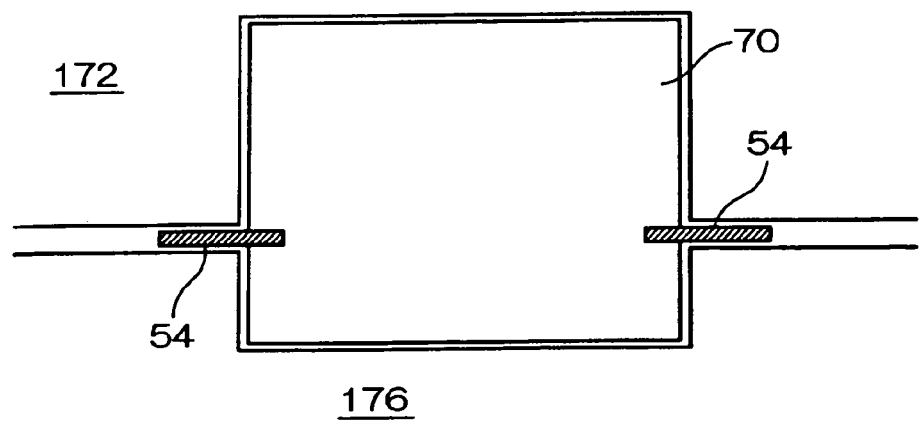

FIG. 10 is a plan view of the lower lead frame according to a third exemplary embodiment. This lower lead frame 40A makes up the layered lead frame along with the upper lead frame 30 shown in FIG. 3(A). With the lower lead frame 40A according to the third exemplary embodiment, the mounting lead 42A differs from the mounting lead 42 of the lower lead frame 40 in the first exemplary embodiment shown in FIG. 3(B), but otherwise is the same as the lower lead frame 40. That is to say, with the lower lead frame 40A, the mounting terminals 46A of the mounting leads 42A are formed larger than the length of the inclined portion 45 in the horizontal direction in FIG. 10, and have a pressing tab 170 protruding to the short side of the frame 41 from the inclined portion 45. This pressing tab 170 is pressed downwards by the upper mold of the mold when forming the lower lead frame 40A and the upper lead frame 30 into the layered frame and sealing the mounted piezoelectric resonator 10 and IC 60 with resin. FIGS. 11(A)–11(B) are schematic representations of a mold to form the resin package 70.

As shown in FIG. 11(A), four pressing protrusions 174 are provided on the upper mold 172 corresponding to the four pressing tabs 170 provided on the lower lead frame 40A. These pressing protrusions 174 press the pressing tabs 170 of the mounting leads 42A from above at the time of forming the resin package 70, thereby bringing the principal surface (lower face) of the mounting terminals 46A into tight contact with the upper face 178 of the lower mold 176. Accordingly, adhesion of resin to the principal surface of the mounting terminals 46A can be reduced or prevented at the time of forming the resin package 70, and the step to remove the resin adhering to the principal surface can be omitted. Note that portions of the upper mold 172 and the lower mold 176 where the pressing protruding portions 174 are not formed are arranged to match at the height position of the adjusting terminals 54, as shown in (B) in the figure.

As for the mounting leads 42A of the lower lead frame 40A, in the step of cutting off the resin package 70 off from the layered lead frame (frame 41 of the lower lead frame 40A) following formation of the resin package 70 as described above, cutting is performed along the cutting line 49A indicated by the two-dot broken line in FIG. 10, whereby the pressing tabs 170 are cut off. However, as shown in FIG. 10, the pressing tabs 170 are cut such that the tips of the mounting terminals 46A protrude from the side face of the resin package 70 by a small amount (e.g., around 0.1 to 0.2 mm).

Figure 12:
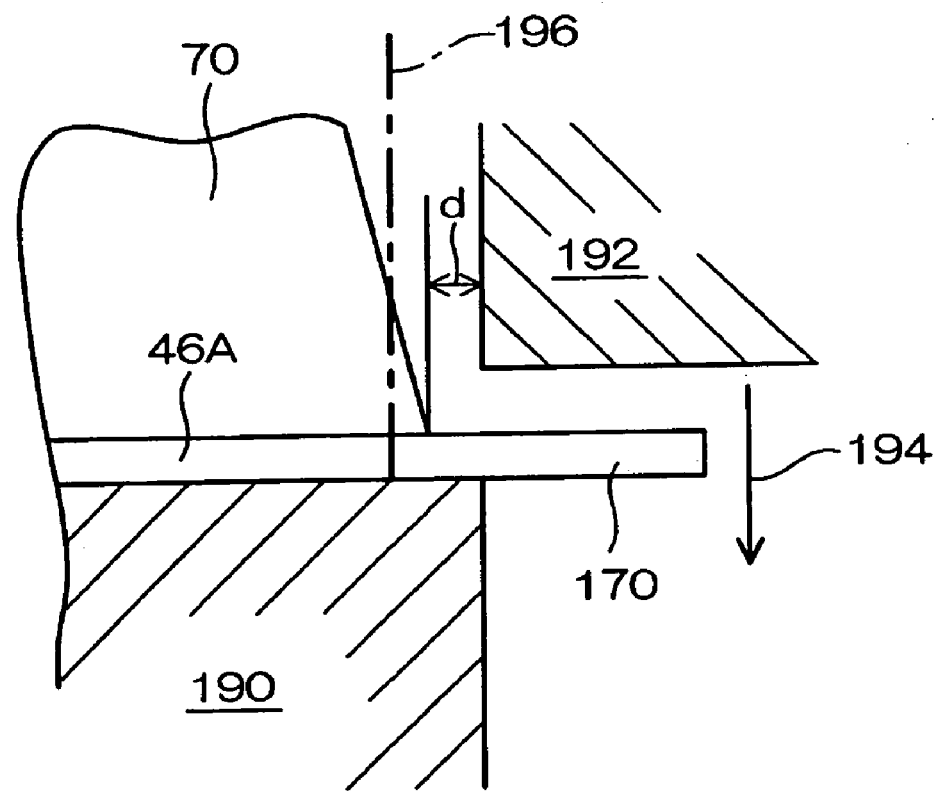
FIG. 12 is an explanatory schematic of a method to cut the pressing tab according to the exemplary embodiment.

FIG. 12 schematically illustrates the cut state of the pressing tabs 170 at the time of cutting the piezoelectric oscillator (resin package 70) off from the layered lead frame. The layered lead frame with the resin package 70 formed thereupon is placed on a lower blade 190 of a cutting machine for example, and an upper blade 192 descends as indicated by the arrow 194, thereby cutting the pressing tabs 170. At this time, the layered lead frame is positioned such that the pressing tabs 170 are cut with the mounting terminals 46A protruding from the resin package 70 by a predetermined length d. Cutting the pressing tabs 170 thus allows the sides (end faces) of the mounting terminals 46A to be exposed from the resin package 70 even in the event that the position of the layered lead frame shifts and is cut at the position indicated by the single-dot broken line 196 in the figures, so solder fillets can be visually configured, and the state of joining can be readily confirmed.

Figure 13A:
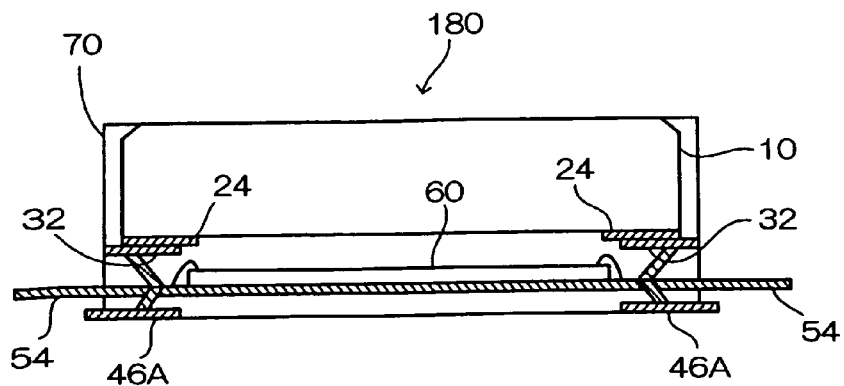
FIGS. 13(A)–13(C) are explanatory schematics of a piezoelectric oscillator according to the third exemplary embodiment.
Figure 13B:
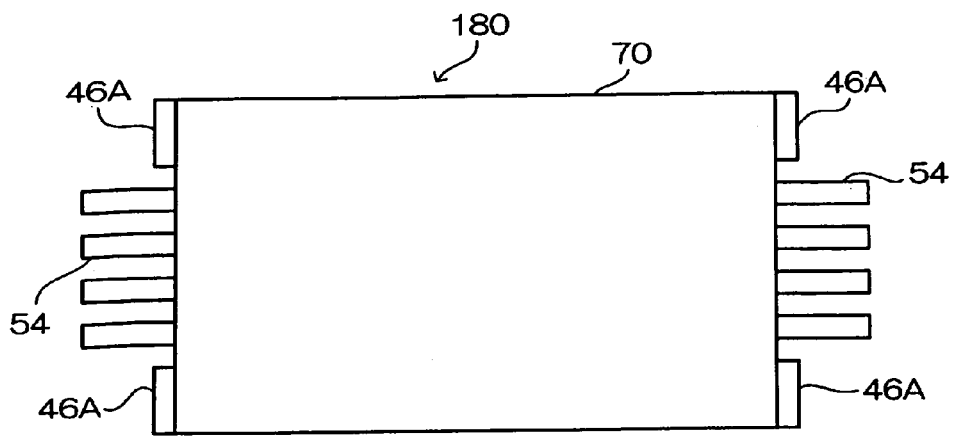
Figure 13C:
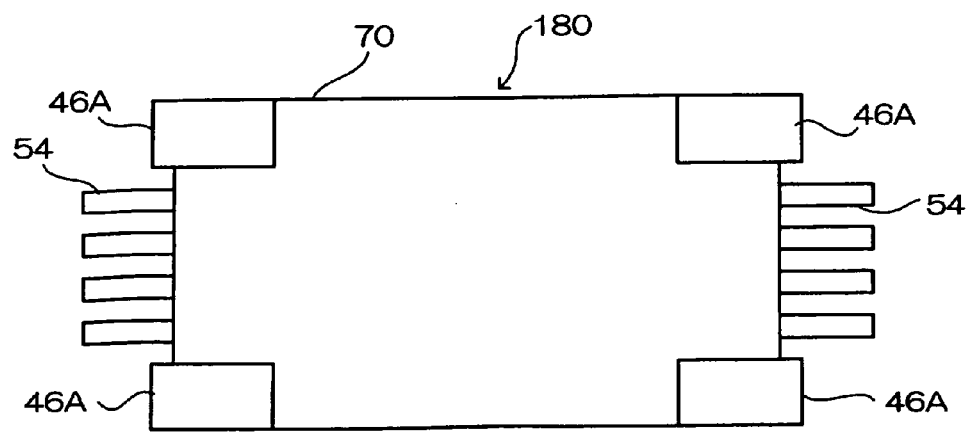
Figure 14A:
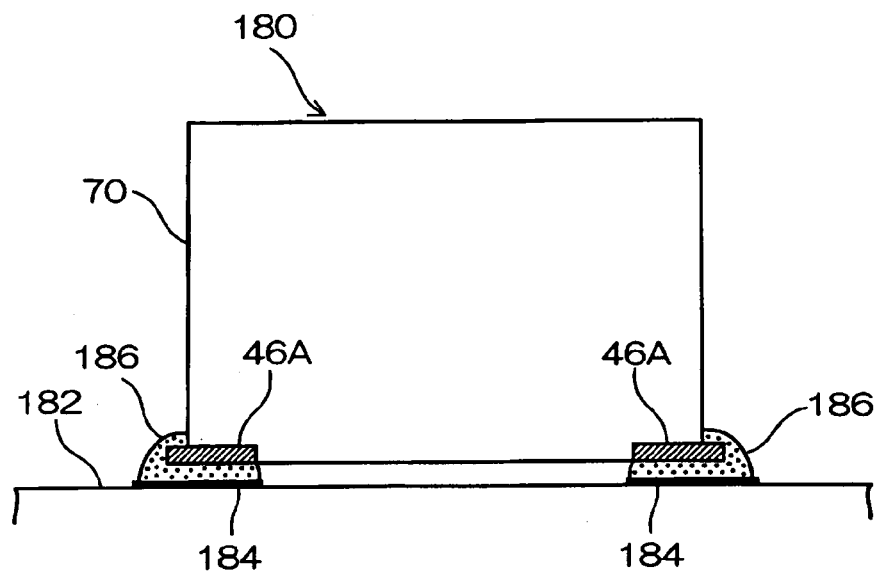
FIGS. 14(A)–14(B) are schematics illustrating the mounting state of the piezoelectric oscillator according to the third exemplary embodiment.

FIGS. 13(A)–13(C) illustrate a piezoelectric oscillator 180 having mounting electrodes 46A cut away from the layered lead frame, wherein (A) is a schematic illustrating of the mounting state of the piezoelectric resonator 10 and the IC 60, (B) is a top view, and (C) is a bottom view. Note however that FIGS. 13(A)–13(C) illustrate a case wherein there are four adjusting terminals 54 on either side. The piezoelectric oscillator 180 has the tips of the solder plated mounting terminals 46A protruding from the side of the resin package 70. Accordingly, as shown in FIG. 14(A), with the piezoelectric oscillator 180, at the point that the mounting terminals 46A are joined with the electrodes 184 of the mounting board 182 by solder 186, the mounting terminals 46A have been solder plated, so the solder 186 follows upward to cover the protruding portions of the mounting terminals 46A and form fillets. Accordingly, with the piezoelectric oscillator 180, the state of joining (mounting) to the mounting board 182 can be readily visually confirmed. Also, the solder 186 covers the protruding portions of the mounting terminals 46A, so mounting strength can be enhanced. Note that the pressing tabs 170 may be cut off at the time of cutting off the adjusting terminals 54. Also, the mounting terminals 46A may have the portions thereof following the long side of the resin package 70 protruding, or may be formed in an L-shape.

Figure 14B:
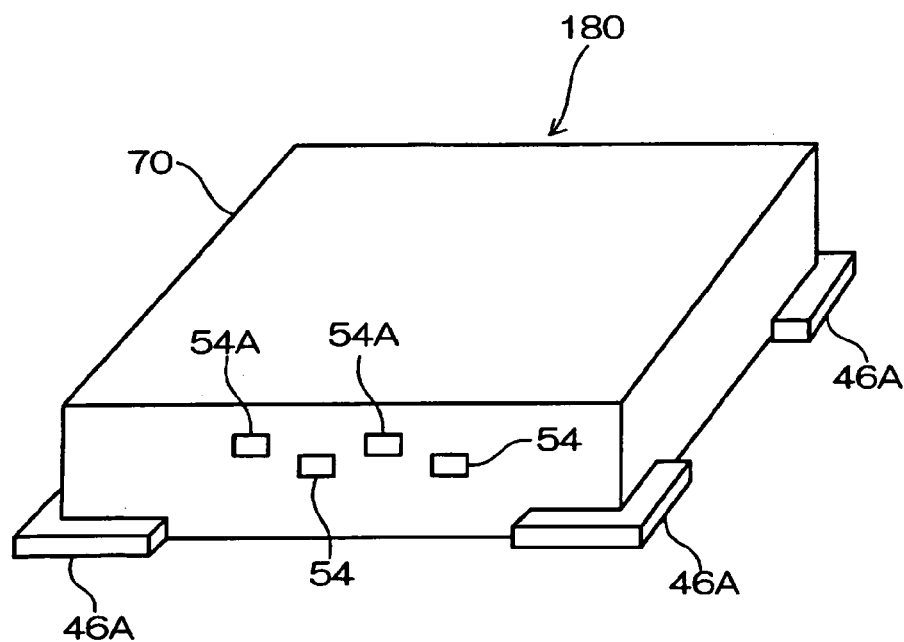

That is to say, as shown in FIG. 14(B), the mounting terminals 46A may have the edges on two sides protruding from the resin package 70. Thus, the area of the mounting terminals 46A covered by the solder 186 becomes greater, and the mounting strength of the mounting board 182 can be enhanced. Also, as shown in this figure, an arrangement may be made wherein the adjusting terminals 54 are formed on the lower lead frame 40A of the layered lead frame, and adjusting terminals 54A on the upper lead frame 30. Further, the adjusting terminals may be formed on the upper lead frame alone.

Figure 15A:
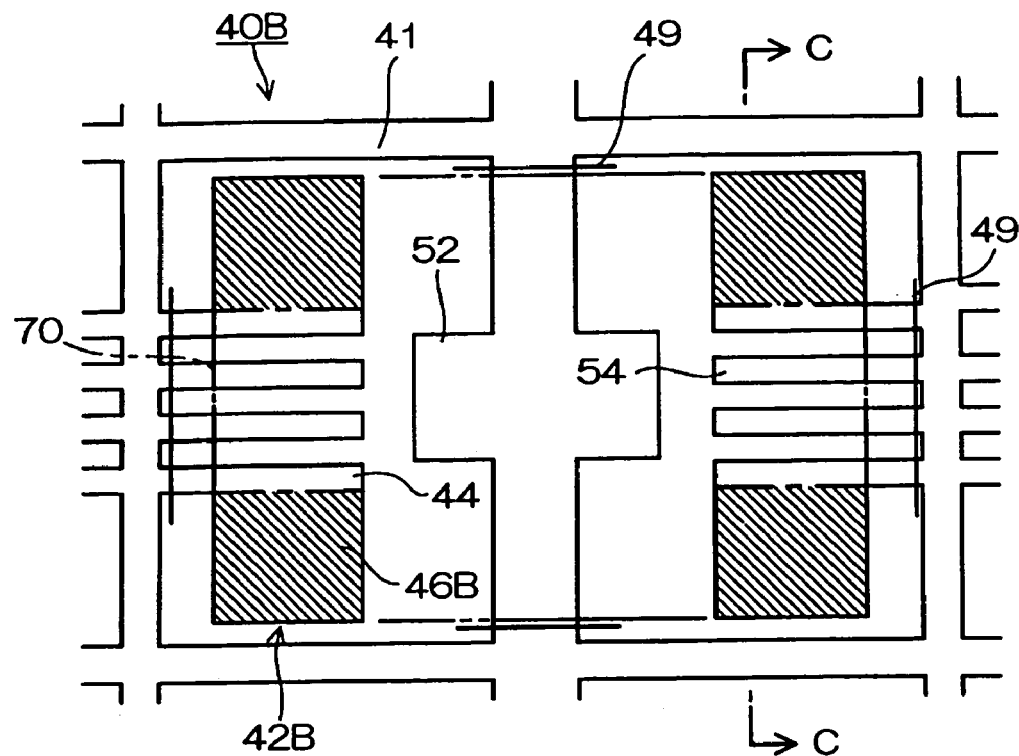
FIGS. 15(A)–15(B) are explanatory schematics of a lead frame according to a fourth exemplary embodiment.
Figure 15B:
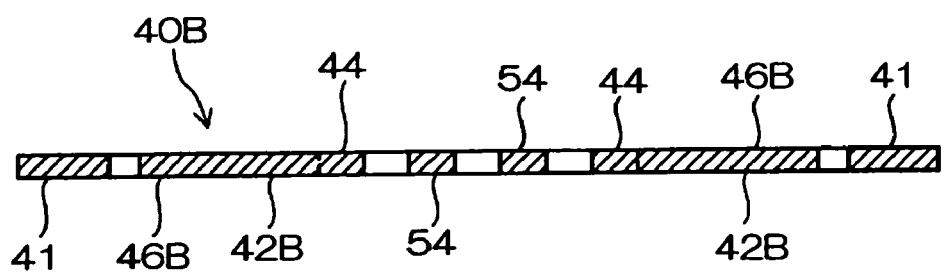

FIGS. 15(A)–15(B) illustrate a lower lead frame according to a fourth exemplary embodiment, wherein (A) is a plan view, and (B) is a cross-sectional view along the plane C—C in (A). The lower lead frame 40B makes up the layered lead frame along with the upper lead frame 30 shown in FIG. 3(A). The lower lead frame 40B according to the fourth exemplary embodiment is arranged such that the mounting leads 42B do not have inclined portions, with the mounting terminals 46B and the pads 44 on the same plane, and at the same height as the adjusting terminals 54 as shown in FIGS. 15(A)–15(B). Accordingly, the lower lead frame 40B does not require the step of bending the mounting terminals 46B to a position lower than the adjusting terminals 54, and the step to form the lower lead frame 40B can be simplified. Accordingly, with regard to the layered lead frame formed by layering the lower lead frame 40B shown in FIGS. 15(A)–15(B) and the upper lead frame 30 shown in FIG. 3(A), only the connection leads 32 of the one lead frame (upper lead frame 30) form the layered lead frame bent to the opposite side of the layering plane. Accordingly, the height-wise dimensions of the layered lead frame can be reduced, and the piezoelectric oscillator can be made thinner.

Figure 16:
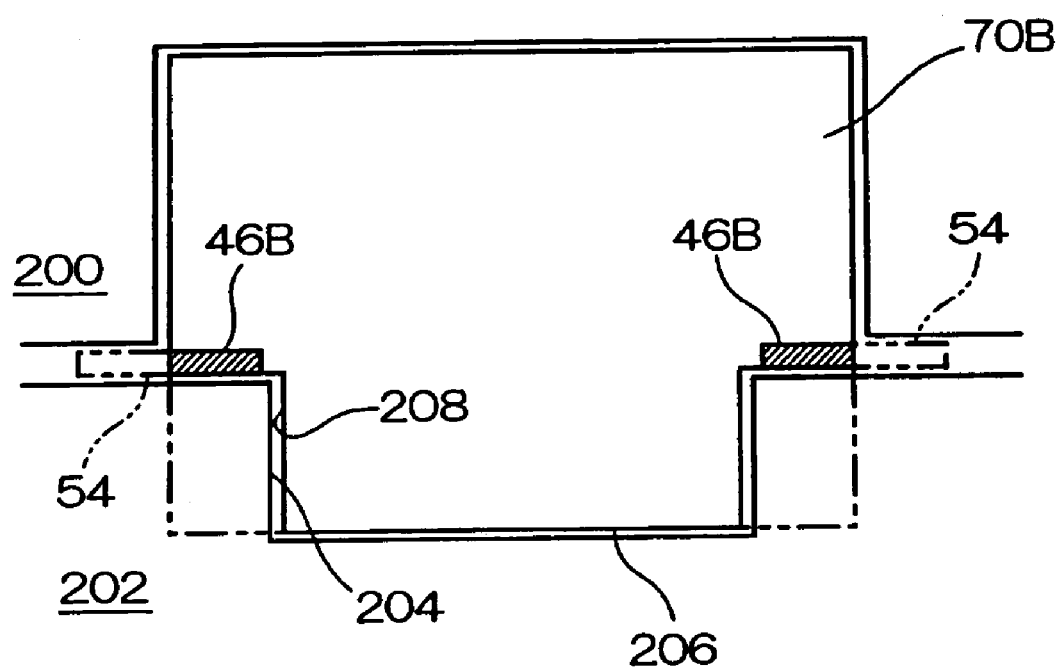
FIG. 16 is an explanatory schematic of resin sealing of the lead frame according to the fourth exemplary embodiment.

Resin sealing with the layered lead frame using the lower lead frame 40B according to the fourth exemplary embodiment is performed as shown in FIG. 16. That is to say, an upper mold 200 and lower mold 202 forming the resin package 70B meet at the height position of the mounting terminals 46B. A recess 204 is provided to the lower mold 202 on the face where the cavity is to be formed, and the lower face 206 of the resin package 70B is positioned below the adjusting terminals 54, i.e., the principal face of the mounting terminals 46B. That is to say, with the resin package 70B, recesses 208 are formed at positions corresponding to each of the mounting terminals 46B, with the mounting terminals 46B being formed at the ceiling face of the recesses 208. This is in order to reduce or prevent the adjusting terminals 54, following cutting, from coming into contact with the mounting board and short-circuiting with the wiring pattern on the mounting board or with other parts. Note that the height of the recesses 208 needs to be just high enough that the adjusting terminals 54 do not come into contact with the surface of the mounting board, and may be around 0.1 mm for example.

Figure 17A:
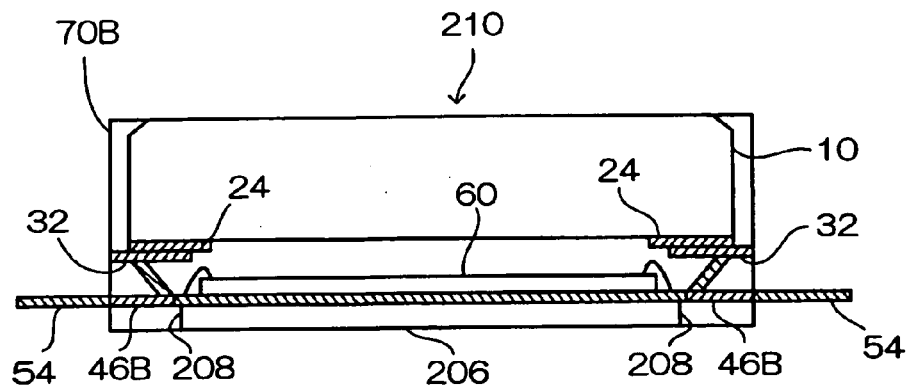
FIGS. 17(A)–17(c) are explanatory schematics of a piezoelectric oscillator according to the fourth exemplary embodiment.
Figure 17B:
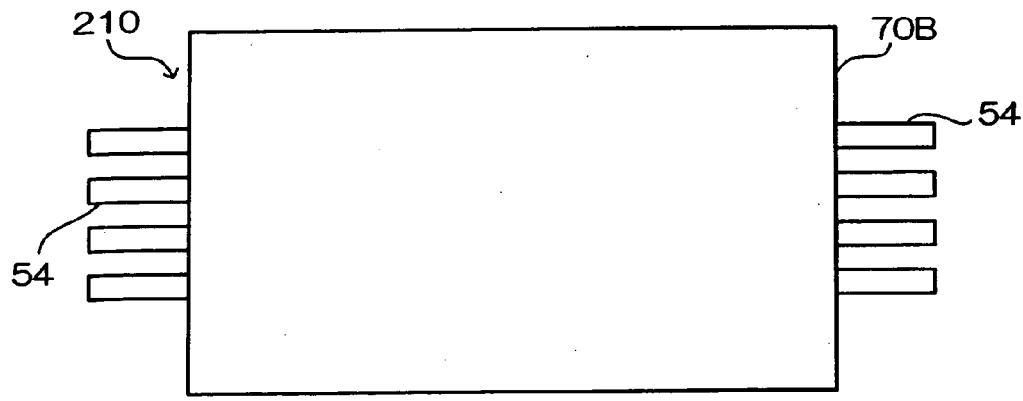
Figure 17C:
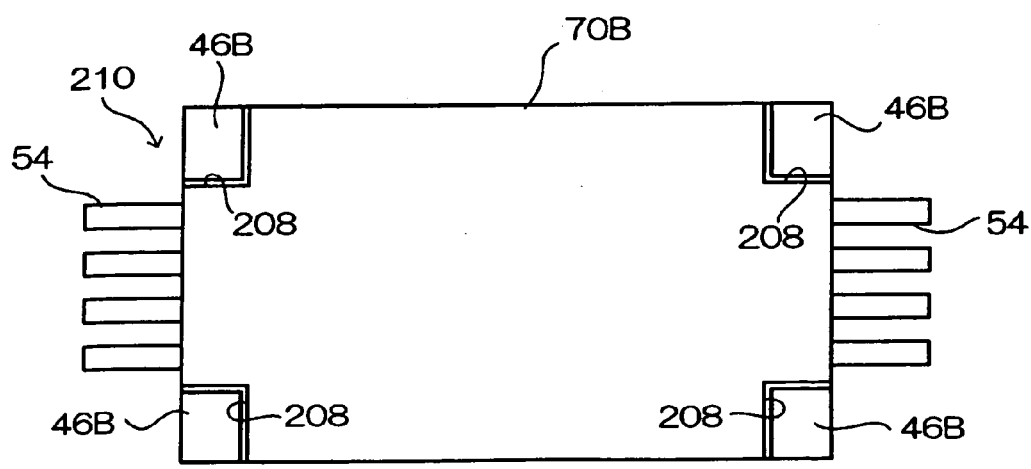
Figure 18A:
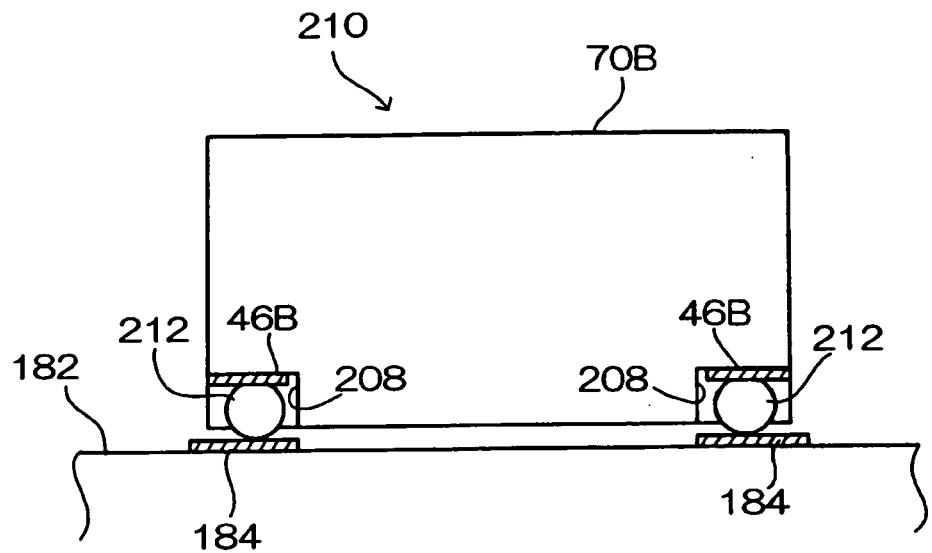
FIGS. 18(A)–18(B) are explanatory schematics of the mounting method of the piezoelectric oscillator according to the fourth exemplary embodiment.
Figure 18B:
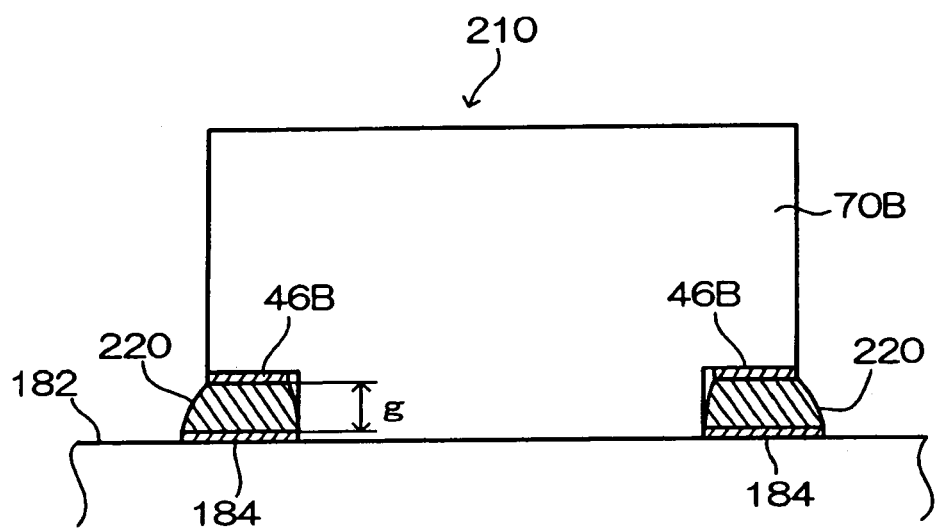

FIGS. 17(A)–17(C) illustrate a piezoelectric oscillator 210 having mounting terminals 46B, wherein (A) is a schematic illustrating the state of mounting the piezoelectric resonator 10 and the IC 60, (B) is a plan view, and (C) is a bottom view. This piezoelectric oscillator 210 can be mounted on the mounting board 182 as shown in FIGS. 18(A)–18(B), for example. With this mounting method, first, as shown in FIG. 18(A), solder balls 212 are provided to each of the mounting terminals 46B of the piezoelectric oscillator 210. The solder balls 212 are then positioned above the electrodes 184 of the mounting board 182. Subsequently, as shown in (B) in this figure, the solder balls 212 are melted, whereby the piezoelectric oscillator 210 can be mounted on the mounting board 182.

The piezoelectric oscillator 210 mounted thus on the mounting board 182 has the mounting terminals 46B provided on the ceiling face of the recess 208, and accordingly a gap g is formed between the mounting terminals 46B and the mounting board 182. The gap g is filled with the solder 220 which made up the solder ball 212. Accordingly, whether or not the mounting (joining) state is good can be readily determined by visually observing whether or not the gap g has been filled in by solder 220.

FIGS. 19(A)–19(C) are disassembled perspective views to describe a fifth exemplary embodiment, and is a figure corresponding to FIG. 1. Note however, in FIGS. 19(A)–19(C), the layered lead frame 50E is rotated by 90° in-plane as compared with that in FIG. 1. In FIG. 19(A), the piezoelectric oscillator 1E is formed by integrally forming the piezoelectric resonator 10 storing the piezoelectric resonator element 12 within the package 20, and the IC 60 where the oscillating circuit and the like are formed, by the layered lead frame 50E. The layered lead frame 50E is formed of an upper lead frame 30E on the one side, and a lower lead frame 40E on the other side. The upper lead frame 30E and lower lead frame 40E are devised so as to reduce or prevent deterioration of joining strength due to reduction in the size of the piezoelectric oscillator 1E and reduction in the contact area with the mold resin. That is to say, the lead frames 30E and 40E have the leads thereof formed as irregular shapes, so as to enhance the strength of joining to the resin as much as possible.

The four connection leads 32E formed of the upper lead frame 30E each have a pad portion 34E, an inclined portion 35E, and a connection terminal 36E. The piezoelectric resonator 10 is mounted on (joined to) the connection terminals 36E via external electrodes not shown in the figure which are provided on the bottom face of the package 20. Also, the connection leads 32E are formed with irregular shapes, having notches (recesses) 37E in the inclined portions 35E. The notches 37E are for allowing resin to enter therein at the time of forming the resin package 70, and reduce or prevent the connection leads 32E from coming loose from and falling out of the resin package due to the anchoring effects of the resin entering the notches 37E.

The mounting leads 42E formed of the lower lead frame 40E each have a pad portion 44E, an inclined portion 45E, and a connection terminal 46E, as indicated by FIG. 19(B) in the figure which is a cross-sectional view along the plane D—D in FIG. 19(A). The mounting leads 42E are formed with irregular shapes, with notches (recesses) 48E, to allow resin making up the resin package 70 to enter, formed at the area from the inclined portions 45E serving as the base side from the mounting terminals 46E to the pad portions 44E, and at the pad portions 44E. Also, the resin package 70 is formed such that the principal surface 230 of the mounting terminals 46E is exposed. Accordingly, the principal surface 230 of the mounting terminals 46E is arranged to be able to join to the electrode pattern of the mounting board through the solder. Note that in the present exemplary embodiment, the mounting lead 42E to the right side of FIG. 19(A) is connected to the ground terminal of the mounting board, and is formed integrally with the die pad 52E.

The adjusting terminals 54E formed of the lower lead frame 40E are disposed between the mounting leads 42E and 42E positioned in the sideways direction in FIG. 19(A) with the present exemplary embodiment. The adjusting terminals 54E are formed of a tip terminal portion 51E and a base portion 53E which is integrally formed with the tip terminal portion 51E, and in a T-shape. That is to say, the adjusting terminal 54E is formed in a T-shape by forming notches 57E by notching both sides of the tip of a lead piece having the width of the base portion 53E (the length in the horizontal direction in FIG. 19(A)). The adjusting terminals 54E shown in the present exemplary embodiment are illustrated in the state that the adjusting step of the piezoelectric oscillator 1E has been completed and the unnecessary portions of the tip side of the tip terminal portions 51E have been cut off, with the base portions 53E being embedded within the resin package 70 as shown in FIG. 19(C). Also, with the present exemplary embodiment, protrusions 61 and 63 forming the notches 48E of the mounting leads 42E are cut with the tips thereof protruding from the resin package 70, at the time of sealing the layered lead frame 50E with resin, and used as adjusting terminals.

With the fifth exemplary embodiment formed thus, notches 37E and 48E are formed on the connection leads 32E and mounting leads 42E, so molding resin making up the resin package 70 enters into the notches 37E and 48E. Accordingly, the connection leads 32E and mounting leads 42E can be reduced or prevented from coming loose from the resin package 70, and the joining strength can be enhanced. Also, with the adjusting terminals 54E, the base portion 53E embedded within the resin is formed wider than the tip terminal portion 51E, and accordingly will not come loose from the resin package 70. Accordingly, with the piezoelectric oscillator 1E, separation of the joining portion between the resin of the resin package and the leads and terminals can be reduced or prevented, and shock resistance can be enhanced.

FIGS. 20(A)–20(C) are disassembled perspective views of a piezoelectric oscillator according to a sixth exemplary embodiment. With the piezoelectric oscillator 1F according to this sixth exemplary embodiment, the lower lead frame 40F making up the layered lead frame 50F is unlike the lower lead frame 40E of the fifth exemplary embodiment, and other portions as the same as with the fifth exemplary embodiment. With the lower lead frame 40F according to this sixth exemplary embodiment, the mounting leads 42F do not have inclined portions. That is to say, the mounting leads 42F are not bent, and the upper face of the pad portions 44F and the mounting terminals 46F are on the same plane. Note however, as shown in FIG. 20(B) which is a cross-sectional schematic along the plane E—E in FIG. 20(A), the mounting leads 42F have the pad portions 44F serving as the base side formed thinner than the mounting terminals 46F.

Accordingly, the mounting leads 42F have stepped portions 234 formed between the principal surface 230 of the mounting electrodes 46F and the lower face 232 of the pad portions 44F. Also, the pad portions 44F include the notches 48E the same as those in the fifth exemplary embodiment. Other configurations of the lower lead frame 40F are the same as those of the fifth exemplary embodiment. Note that the mounting leads 42F can be easily formed by reducing the thickness of the pad portions 44F, by press plasticity working or etching.

With the layered lead frame 50F according to the sixth exemplary embodiment formed thus, there is no inclined portion formed on the mounting leads 42F of the lower lead frame 40F between the pad portions 44F and the mounting terminals 46F, so only the connection leads 32E of the upper lead frame 30E are bent in the opposite way as to the layering plane. Accordingly, with the layered lead frame 50F, the mounting terminals 46F can be increased in size. Thus, the mounting terminals 46F have greater area of joining to the mounting board, and the strength of joining to the mounting board can be enhanced. Also, the layered lead frame 50F does not have inclined portions provided to the mounting leads 42F, so the dimensions in the thickness direction are smaller, and the thickness of the piezoelectric oscillator 1F can be reduced.

Further, due to the mounting leads 42F not having the inclined portions, even in cases wherein the size is reduced, there is no breakage thereof at the time of working or under shock being applied thereto. That is to say, the mounting leads are also reduced in size and thickness along with the reduction in size and thickness of the piezoelectric oscillator. In the event of bending working of the mounting leads (forming) to form the mounting terminals, the inclined portions are thinner that the other portions. Accordingly, in cases of forming the mounting terminals by bending the mounting leads, there is the danger of breakage at the inclined portions in the event that separation occurs with the resin during the bending of the mounting leads or under shock applied to the piezoelectric oscillator. Conversely, the mounting leads 42F according to the exemplary embodiment do not have the inclined portions, so there is no concern of such breakage.

The lower lead frame 40F may have the portions of the mounting terminals 46F alone formed thicker, with the portions other than the mounting terminals, including the die pad, being made thinner by etching or the like. In this case, the principal surface 230 of the mounting terminals 46F is to be made to come lower than the lower face of the other portions made thinner, as shown in FIG. 20(B). Thus, the unnecessary thin portions other than the mounting terminals 46F are sealed within the resin package 70 at the time of resin molding while exposing the principal surface 230 of the mounting terminals 46F, even without forming the mounting terminals by bending. Accordingly, at the time of joining the mounting terminals 46F to the mounting board, there is no short-circuiting between the other portions and the wiring pattern or the like on the mounting board, thereby leading to reduced thickness of the piezoelectric oscillator.

Note that in the sixth exemplary embodiment, connection leads 32F, such as shown in (C) in the figure, may be used instead of the connection leads 32E. The connection leads 32F do not have inclined portions provided between the pad portions 34F and the connection terminals 36F, with the lower face of the pad portions 34F and the connection terminals 36F being on the same plane. With the connection leads 32F, the pad portions 34F are formed thinner than the connection terminals 36F. Accordingly, the upper face 236 of the pad portions 34F are lower than the principal surface 238 of the connection terminals 36F. With such a connection lead 32F, the area of the connection terminals 36F can be increased, and the strength of joining with the piezoelectric resonator 10 can be increased. Also, the piezoelectric oscillator can be made thinner. The connection leads 32F can be formed in the same way as with the mounting leads 42F. The upper lead frame 30E having the connection terminals 36F can have all portions other than the connection terminals 36F formed thinner than the connection terminals 36F.

Figure 21A:
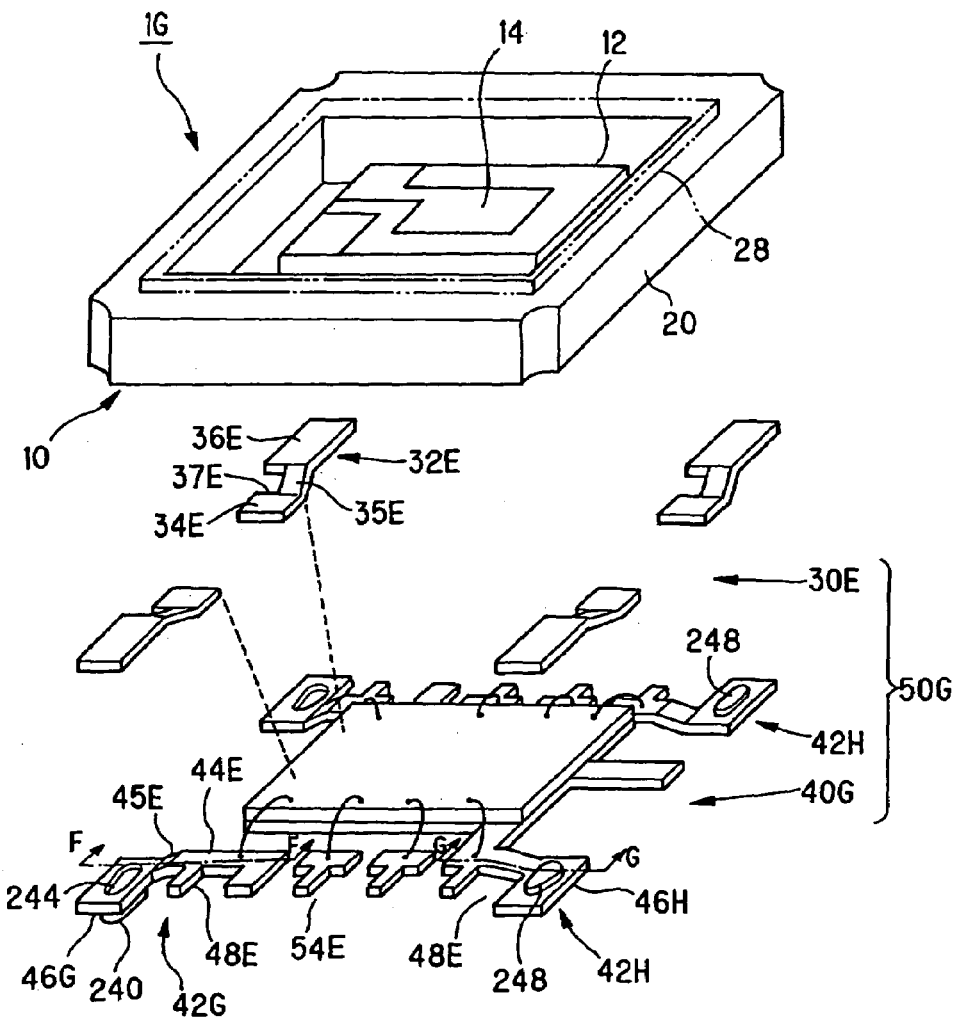
FIGS. 21(A)–21(C) are disassembled perspective views of a piezoelectric oscillator according to a seventh exemplary embodiment.
Figures 21B, 21C:
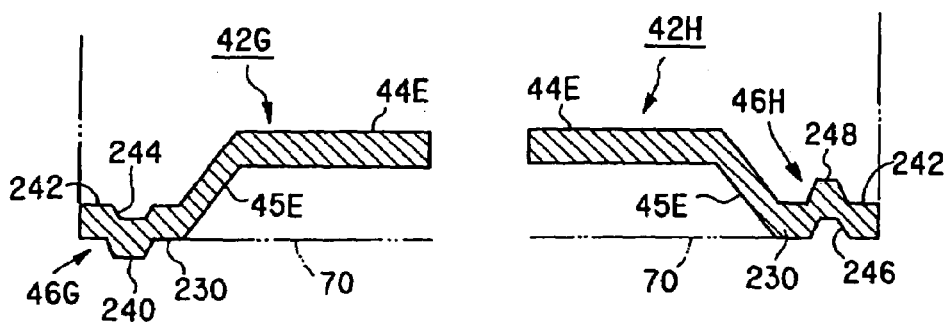

FIGS. 21(A)–21(C) are disassembled perspective views of a piezoelectric oscillator according to a seventh exemplary embodiment. With this piezoelectric oscillator 1G, the lower lead frame 40G making up the layered lead frame 50G, particularly the mounting terminals of the mounting lead, differ from the mounting terminals 46E of the lower lead frame 40G in the fifth exemplary embodiment. Other portions are the same as with the fifth exemplary embodiment. The mounting leads 42G according to the seventh embodiment have pad portions 44E, inclined portions 45E, and mounting terminals 46G, as shown in FIG. 21(B) which is a cross-sectional view along the plane F—F in FIG. 21(A). The mounting terminals 46G have protrusions 240 formed in the principal surface 230 thereof. Also, the mounting terminals 46G have recesses 244 formed at the positions corresponding to the protrusion 240 on the joining face 242 to join to the resin, at the opposite side from the principal surface 230. The protrusions 240 and recesses 244 are readily formed by press forming of the mounting terminals 46F.

With the mounting terminals 46G formed thus, the protrusions 240 are formed on the principal surface 230, so the area of contact with the solder at the time of joining to the mounting board increases, and also, the strength of joining to the mounting board can be enhanced by the anchoring effects due to the protrusions 240. Also, the mounting terminals 46G have the recesses 244 formed on the joining face 242 to join to the resin, so the substantial area of contact with the resin increases, and also the resin enters the recesses 244, so the strength of joining with the resin can be enhanced.

Note that the mounting terminals may be formed as shown by the mounting leads 42H to the right in FIG. 21(A). That is to say, the mounting leads 42H have recesses 246 formed on the principal surface 230 of the mounting terminals 46H, as shown in (C) in the figure which is a cross-sectional view along the plane G—G n FIG. 21(A). Also, the mounting terminals 46H have protrusions 248 formed on the joining face 242 to join to the resin at the opposite side to the principal surface 230. The recesses 246 on the principal surface 230 and the protrusions 248 on the joining surface 242 are corresponding, and are formed by bending by pressing or the like. The mounting terminal 46H formed thus is capable of yielding the same effects as with the mounting terminal 46G in (B) of the figure.

Figure 22:
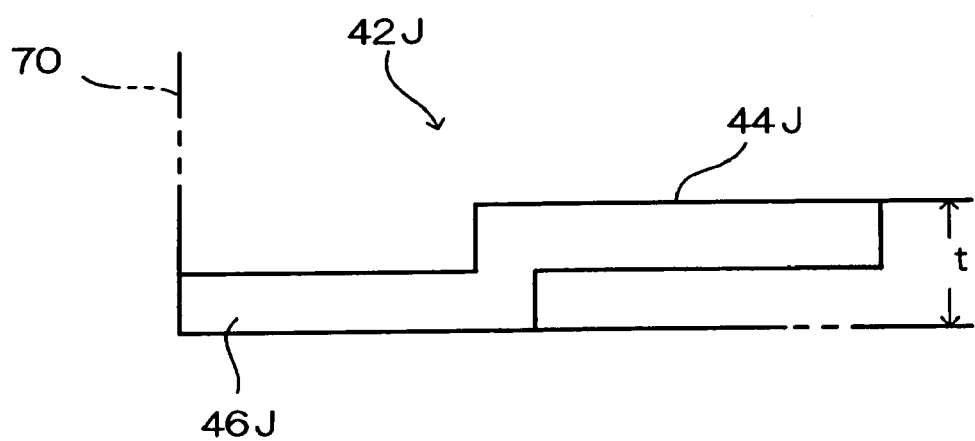
FIG. 22 is an explanatory schematic of a connecting lead according to another exemplary embodiment.

Further, the mounting lead can be formed as shown in FIG. 22. The mounting lead 42J shown in FIG. 22 has the lower face side of the pad portion 44J at the lead piece having a thickness of t, and the upper face side of the mounting terminal 46J, etched to form a crank shape. The area of the mounting terminal 46J can be increased with this mounting lead 42J as well, and the dimensions in the thickness direction can be reduced.

Figure 23A:
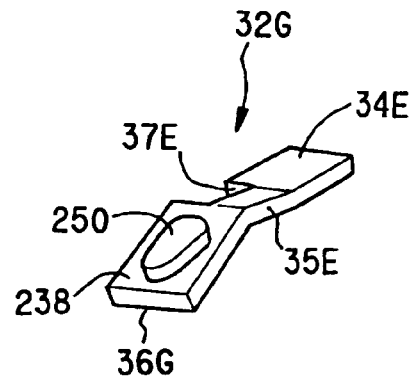
FIGS. 23(A)–23(C) explanatory diagrams of a mounting lead according to another exemplary embodiment.

Also, while the seventh exemplary embodiment has been described with reference to an example wherein one protrusion or one recession is provided to a mounting terminal, a plurality of these may be provided. Also, the connection lead may be formed as shown in FIG. 23, instead of the connection lead 32E. With the connection lead 32G shown in FIG. 23(A), the principal surface 238 on the connection terminal 36G which joins with the piezoelectric resonator 10 has a protrusion 250 formed. The connection terminal 36G has a recess (not shown) formed on the face joining the resin at the opposite side to the principal surface 238. With the connection terminal 36G formed thus, the strength of joining to the piezoelectric resonator 10, and the strength of joining to the resin of the resin package, can be enhanced.

Figure 23B:
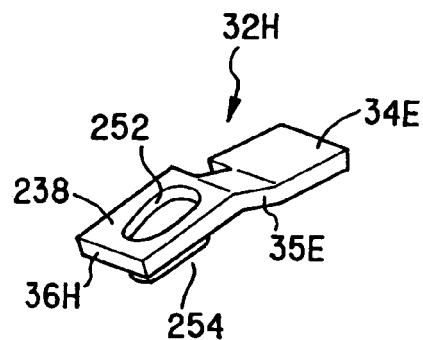
Figure 23C:
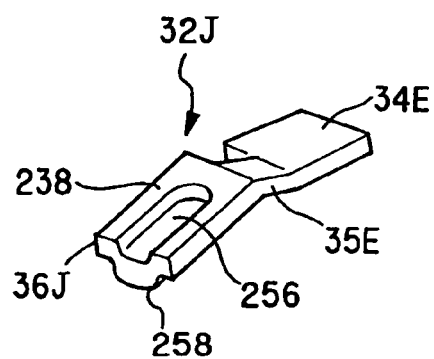

The connection lead 32H shown in FIG. 23(B) has a recess 252 formed on the principal surface 238 of the connection terminal 36H, and a protrusion 254 formed on the face to join to the resin on the opposite side thereof. Also, with the connection lead 32J shown in (C) in the figure, a recess 256 is formed on the principal surface 238 of the connection terminal 36J, and a protrusion 258 is formed on the face on the opposite side thereof. The recess 256 is opened at the tip side of the connection terminal 36J, forming a U-shape. These connection terminals 36H and 36J also yield the same effects as the connection terminal 36G.

Figure 24A:
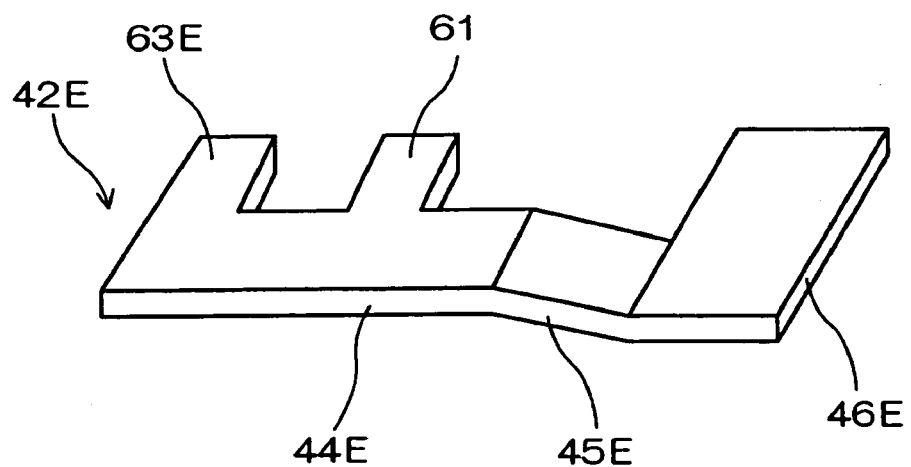
FIGS. 24(A)–24(B) are schematics illustrating a modification of a mounting lead.
Figure 24B:
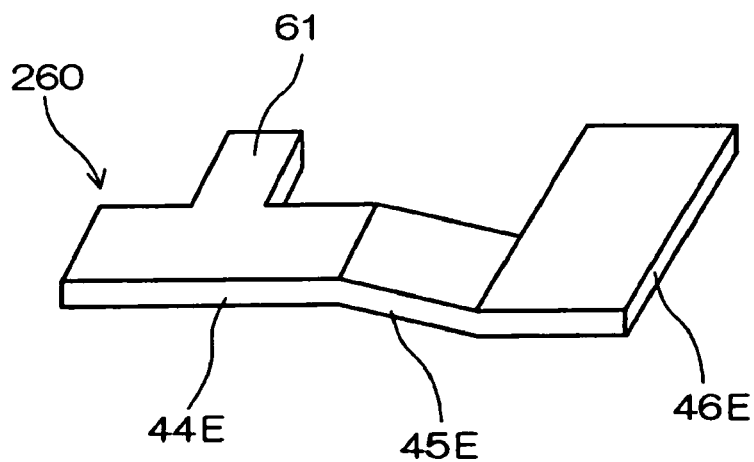

Now, reduction in size and reduction in thickness of electronic devices has led to increased demand for further reduction in size and reduction in thickness of the piezoelectric oscillators. Accordingly, while the fifth exemplary embodiment shown in FIGS. 19(A)–19(C) attempt to enhance the strength of joining to the resin by forming the mounting leads in irregular shapes, cases wherein such mounting leads cannot be formed as shown in the fifth exemplary embodiment can be expected. That is to say, cases may be conceived wherein the mounting leads cannot be formed as the mounting lead 42E shown in FIG. 24(A), and only formed as the mounting lead 260 shown in (B) in the figure. This mounting lead 260 does not have the protrusion 63E shown in the figure formed on the mounting lead 42E for catching on the resin, and accordingly, is somewhat weak regarding force in the direction parallel to the face of the mounting lead 260. Accordingly, the mounting terminal 46E is formed in an irregular shape to enhance the strength of joining to the resin. FIGS. 25(A)–25(G) illustrate an example thereof. Note that in FIGS. 25(A)–25(B), portions other than the mounting terminal of the mounting lead 260 are omitted.

The mounting terminal 262 shown in FIG. 25(A) has a through hole 262A formed therein. With this mounting terminal 262, molding resin to form the resin package 70 enters the through hole 262A, and accordingly anchoring effects can be obtained and the joining strength with the resin can be enhanced. Note that as with the mounting terminal 264 shown in (B) of the figure, a recess 264A may be formed on the face of joining with the resin, instead of the through hole.

FIGS. 25(C) through (F) illustrate examples of forming notches (recesses) on the base portion of the mounting terminal. The mounting terminal 266 shown in FIG. 25(C) has rectangular notches 266A formed at the center of two opposing sides. Also, the mounting terminal 268 shown in (D) of the figure has a C-shaped notch 268A formed. The mounting terminal 270 shown in FIG. 25(E) has a rectangular notch 270A formed on the tip side of one side. Further, the mounting terminal 272 shown in (F) of the figure has the two corners at the tip side of the mounting terminal 272 cut off in arc or rectangular shapes, to form notches 272A. The mounting terminal 274 shown in (G) of the figure has an arc-shaped or a U-shaped notch 274A at the side of the tip.

Figure 26:
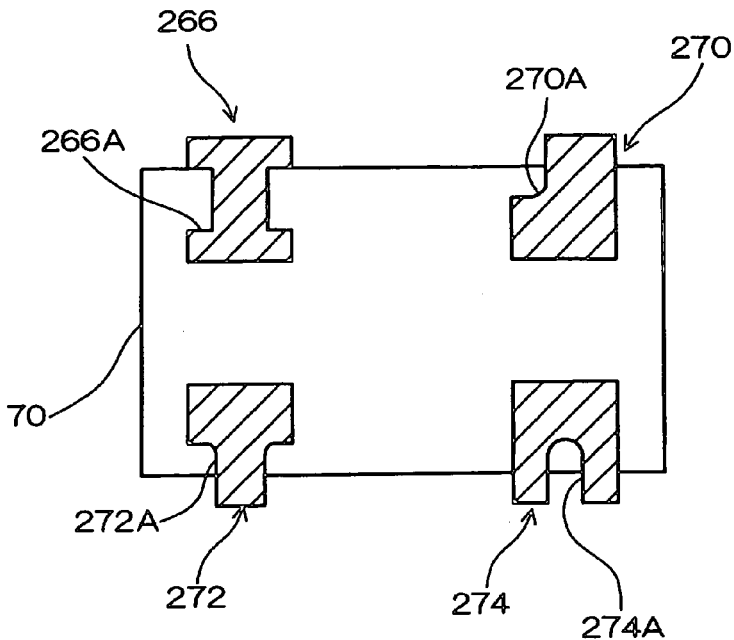
FIG. 26 is a schematic illustrating the state of mounting terminals formed in irregular shapes exposed at the lower face of the resin package.

These mounting terminals 266 through 274 are each arranged so that resin enters the notches and catches, so the strength thereof regarding force acting in the direction parallel to the plane of the mounting terminal can be enhanced. The state of the mounting terminals 266, 270, 272, and 274, exposed at the lower face of the resin package 70 when the layered lead frame is sealed in the resin package 70, is shown in FIG. 26.

Figure 27A:
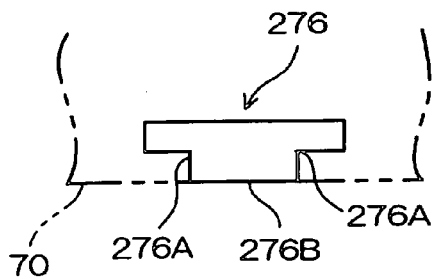
FIGS. 27(A)–27(C) are schematics illustrating an example of the side face of a mounting terminal according to an exemplary embodiment.
Figure 27B:
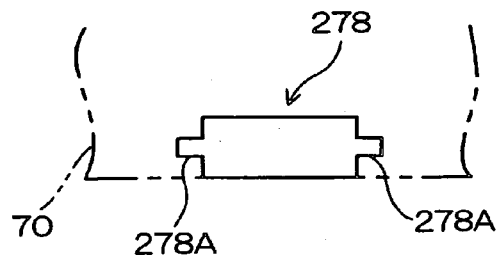
Figure 27C:
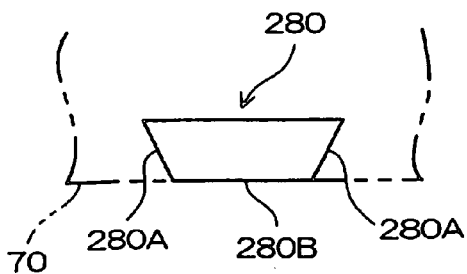

FIGS. 27(A)–27(C) illustrate an example wherein the joining strength in the thickness direction (vertical direction) of the mounting terminal has been enhanced. The mounting terminal 276 shown in FIG. 27(A) has a recess 276A formed in the side thereof and has a step in the thickness direction. That is, with the mounting terminal 276, the width of the principal surface 276B side is narrower than the opposite side. Also, the mounting terminal 278 shown in (B) of the figure has protrusions 278A formed in a band shape at the intermediate portion in the thickness direction of the side face. Note that the protrusions 278A may be formed continuously or may be divided into a plurality. The mounting terminal 280 shown in FIG. 27(C) has inclined faces 280A inclined in the thickness direction at the side faces. The inclined faces 280A are formed such that the width of the principal surface 280B side is narrower than that of the opposite side, i.e., the center side of the resin package 70. In cases where any of the mounting terminals 276, 278, and 280 are joined onto the mounting board, separation from the resin is reduced or prevented in the event that force acting in the thickness direction of the mounting terminals (the vertical direction of the resin package 70) acts thereupon.

Figure 28A:
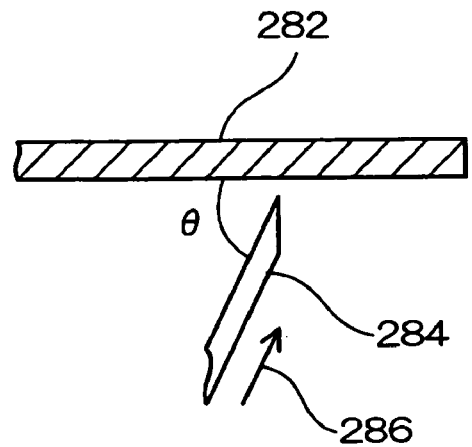
FIGS. 28(A)–28(B) are explanatory schematics of a method to form the sides of the mounting terminal as inclined faces.
Figure 28B:
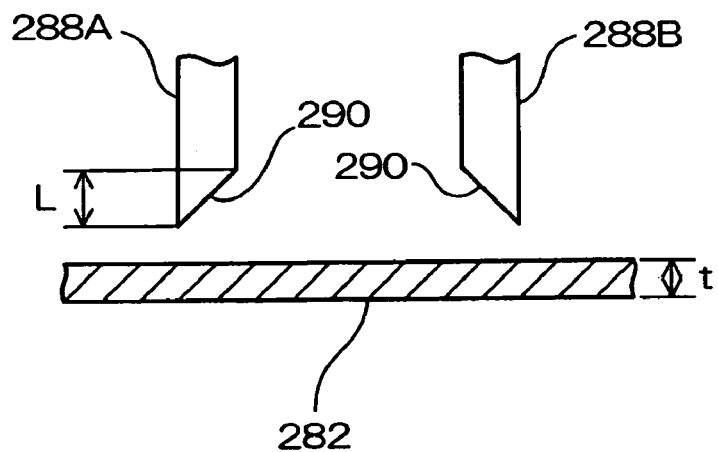

Also, the mounting terminals 276 and 278 can be readily formed by pressing or etching. Also, the inclined faces 280A of the mounting terminal 280 can be formed as shown in FIG. 28. The method shown in FIG. 28(A) uses a cutting blade 284 which is drawn with a predetermined angle θ as to the lead frame 282 as shown with the arrow 286, so as to cut. This method requires the inclined faces 280A to be formed separately. Conversely, with (B) in the figure, the inclined faces 280A can be formed at the same time. That is to say, with the method shown in FIG. 28(B), the width L of the blade portions 290 of cutting blades 288 (288A, 288B) forming the inclined faces 280A is wider than the thickness t of the lead frame 282. The cutting blades 288 are dropped at the same time, and stopped at the point that the tips of the blade portion 290 pass through the lead frame 282, thereby forming the multiple inclined faces 280A at the same time.

Figure 29A:
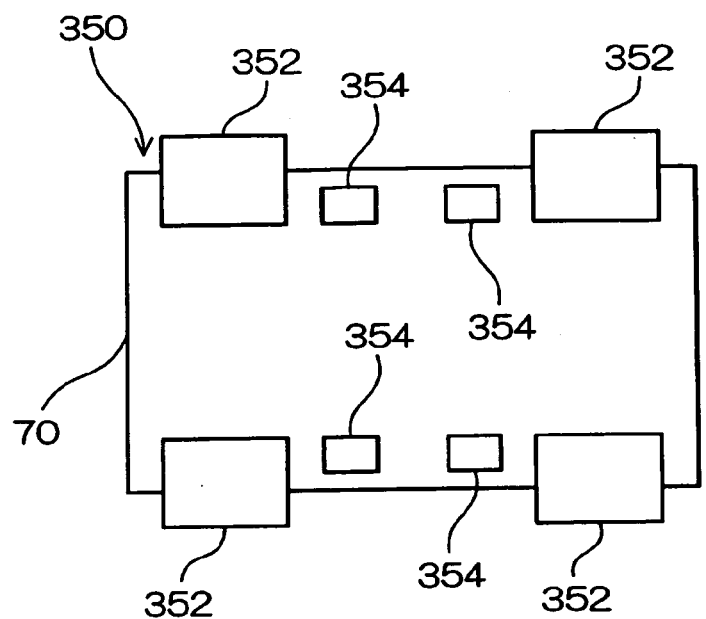
FIGS. 29(A)–29(B) are explanatory schematics of an eighth exemplary embodiment.
Figure 29B:
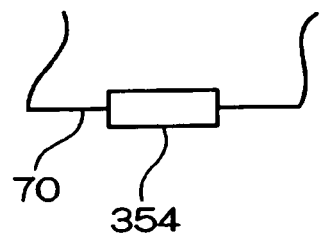

FIG. 29 is an explanatory schematic of an eighth exemplary embodiment. As shown in FIG. 29(A), with the piezoelectric oscillator 350 according to the eighth exemplary embodiment, four mounting terminals 352 and multiple (four, in the case of the embodiment) adjusting terminals 354 are provided on the bottom face of the resin package 70, so as to be joined to (mounted on) a mounting board not shown in this figure. The sides of the adjusting terminals 354 may be exposed from the resin package 70, as with the mounting terminals 352 as shown in (B) in the figure. With the piezoelectric oscillator 350 arranged thus, the adjusting terminals 354 are joined to dummy terminals or the like provided on the mounting board by solder or the like. Accordingly, the piezoelectric oscillator 350 is joined with the mounting board by the mounting terminals 352 and the adjusting terminals 354, whereby the mounting strength is enhanced, and shock resistance can be greatly enhanced.

Figure 30A:
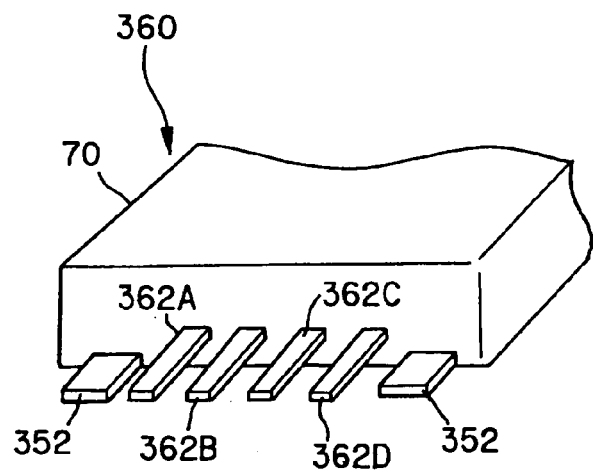
FIGS. 30(A)–30(C) are explanatory schematics of a ninth exemplary embodiment.
Figure 30B:
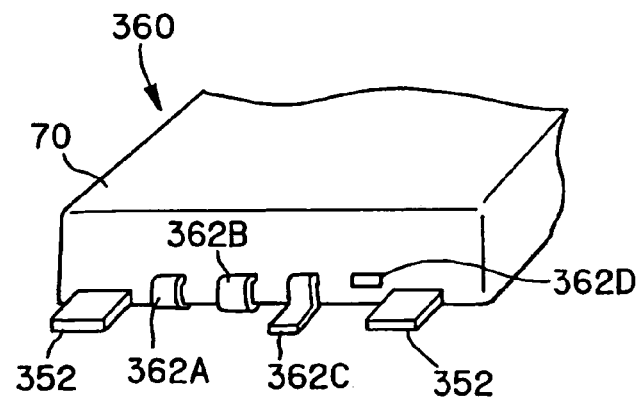

FIG. 30 is an explanatory diagram of a ninth exemplary embodiment. With the piezoelectric oscillator 360 according to the present exemplary embodiment, adjusting terminals 362 (362A through 362D) are formed protruding from the side of the resin package 70, as shown in FIG. 30(A). Of these adjusting terminals 362, the adjusting terminals 362A and 362D on both sides are formed of a part of the mounting lead, and are integral with the mounting terminals 352. The adjusting terminals 362 are bent downwards as shown in (B) in the figure following properties adjusting and inspection of the piezoelectric oscillator 360, so as to be mountable to the mounting board. Bending of the adjusting terminals 362 may be performed so as to form J terminals by folding under the resin package 70 as illustrated by the adjusting terminals 362A and 362B, or so as to be in gull-wing fashion as illustrated by the adjusting terminal 362C. Or, the portion protruding from the resin package 70 may be cut off as with the adjusting terminal 362D.

Figure 30C:
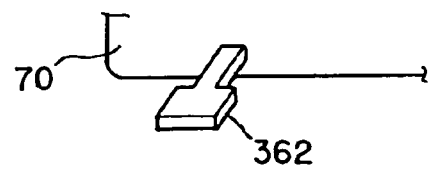

Thus, with the piezoelectric oscillator 360 according to the ninth exemplary embodiment, the adjusting terminals (including those formed of a portion of the mounting lead) 362 can be joined onto the mounting board according to the usage environment and the usage conditions, with flexibility regarding mounting, and the mounting strength can be enhanced. Note that the tip portion of the adjusting terminals 362 can be made wider, as shown in FIG. 30(C). Widening the tip portion thus not only facilitates contact by probes of inspection and adjusting devices, but also further enhances the joining strength at the time of joining to the mounting board.

Figure 31:
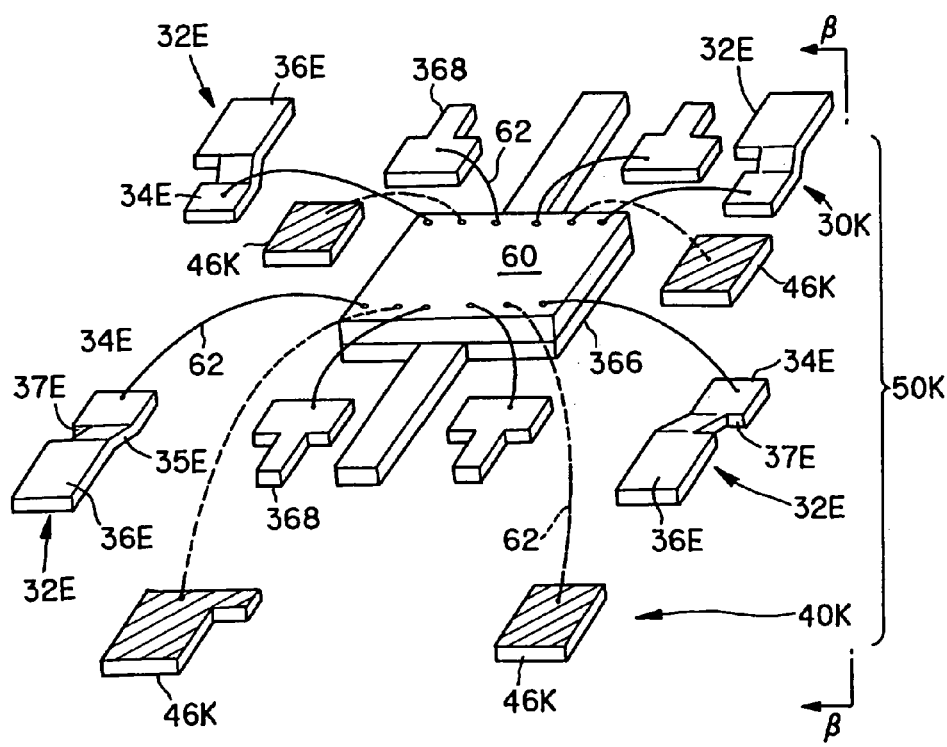
FIG. 31 is an explanatory schematic of a tenth exemplary embodiment.

FIG. 31 is a perspective view of a layered lead frame portion according to a tenth exemplary embodiment. The layered lead frame 50K according to the tenth exemplary embodiment is formed by layering the upper lead frame 30K and lower lead frame 40K. The lower lead frame 40K forms four mounting terminals 46K, indicated by hatching, to mount onto the mounting board. With the lower lead frame 40K, the mounting lead has only plate-shaped mounting terminals 46K to mount at the time of being formed into the layered lead frame 50K and cut from the frame portion, and has no bent portions.

On the other hand, the upper lead frame 30K has connection leads 32E having connection terminals 36E formed, and also forms a die pad 366 to mount the IC 60 and also multiple adjusting terminals 368. The adjusting terminals 368 are formed in a T-shape wherein the width of the base side being wider than that of the tip side. The IC 60 is mounted on the upper face of the die pad 366 provided to the upper lead frame 30K. Also, the piezoelectric resonator which is not shown in the figures is mounted on the connection terminals 36E of the upper lead frame 30K. The upper lead frame 30K has the connection leads 32E bent toward the side opposite of the face of layering with the lower lead frame 40K, i.e., upwards. The lower lead frame 40K is not bent as described above. Accordingly, the vertical position of the mounting terminals 46K is the position where the upper face comes into contact with the lower face of the die pad 366 of the upper lead frame 30K.

Figure 32A:
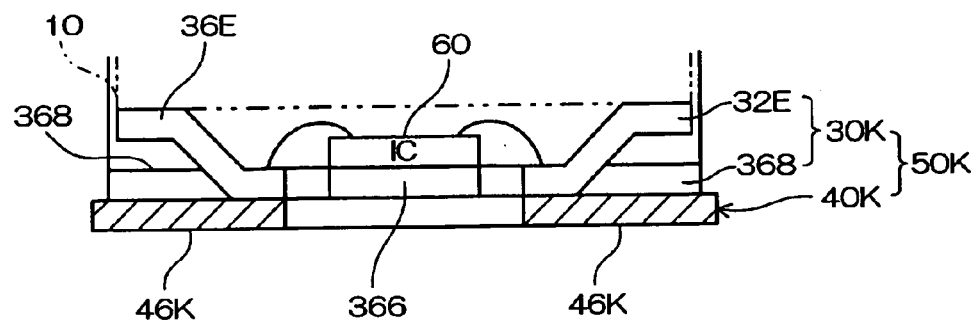
FIGS. 32(A)–32(C) are cross-sectional views of a layered lead frame of the piezoelectric oscillator according to the exemplary embodiment.
Figure 32B:
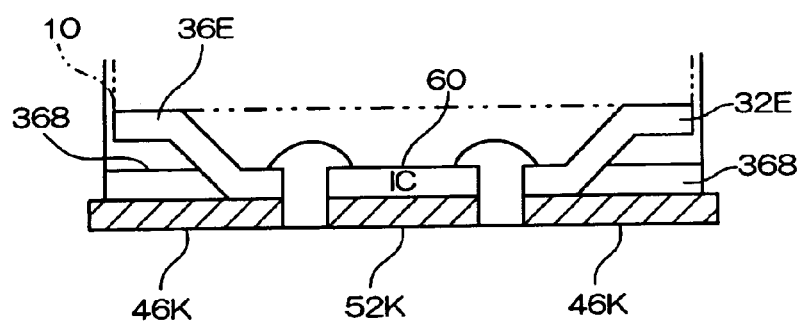
Figure 32C:
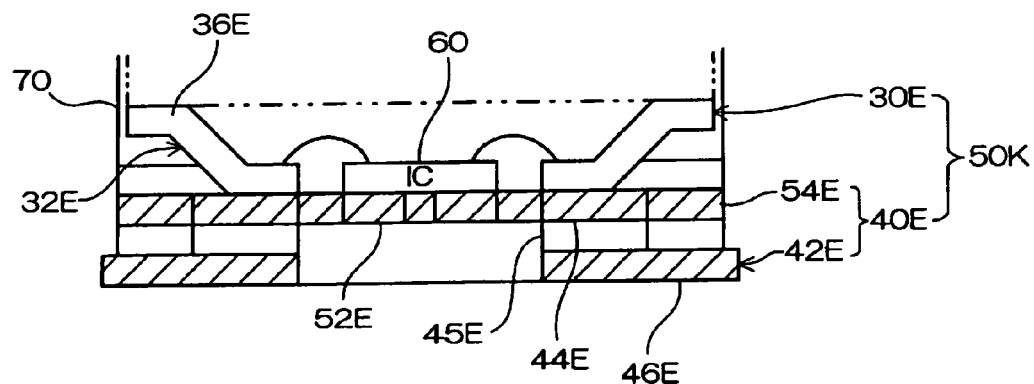

That is to say, the layered lead frame 50K has only the connection leads 32E of the upper lead frame 30K bent in the opposite side of the layering face. Accordingly, with the layered lead frame 50K, the height-wise dimension can be reduced, and the piezoelectric oscillator can be made thinner. FIG. 32(A) is a schematic illustration along the plane β—β in FIG. 31 in the direction of the arrows, in the state of the layered lead frame 50K sealed in resin. Note that (B) in the figure illustrates a modification example of the tenth exemplary embodiment, and illustrates a state wherein a die pad 52K is provided to the lower lead fame 40K, and the IC 60 is mounted to the lower lead frame 40K. Also, (C) in the figure is a schematic illustration along the plane α—α in FIG. 19 in the direction of the arrows with regard to the fifth exemplary embodiment, for the sake of comparison with the tenth exemplary embodiment.

Figure 33A:
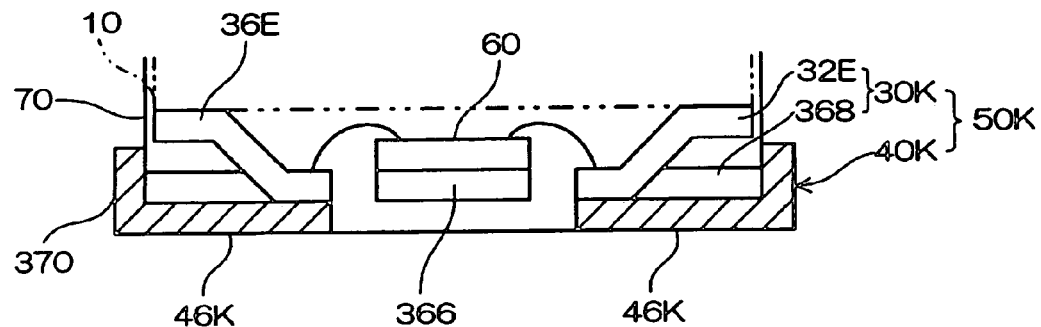
FIGS. 33(A)–33(B) are schematics illustrating a modification of the tenth exemplary embodiment.
Figure 33B:
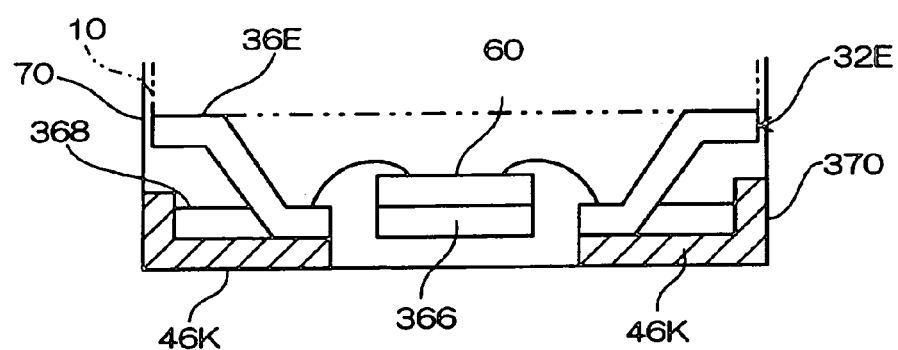

FIGS. 33(A)–33(B) illustrate a modification of the tenth exemplary embodiment. With this modification, the tip portions of the mounting terminals 46K of the lower lead frame 40K are bent upwards. That is to say, with the modification illustrated in FIG. 33(A), the tips of the mounting terminals 46K protrude from the side face of the resin package 70, and the protruding portions form bent portions 370 which are bent upwards following the outer side face of the resin package 70. Forming such bent portions 370 forms a large fillet, so whether or not the mounting is good can be readily confirmed by eye, and also the mounting strength can be enhanced. Note that the bent portions 370 may be positioned within the resin package 70 such that the outer faces of the bent portions 370 of the mounting terminals 46K match the side faces of the resin package 70, as indicated by (B) in the figure.

Figure 34A:
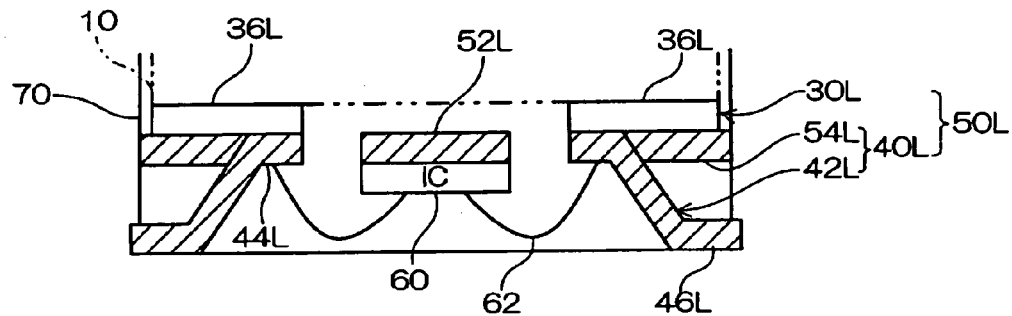
FIGS. 34(A)–34(B) are schematics illustrating an eleventh the exemplary embodiment and a modification thereof.
Figure 34B:
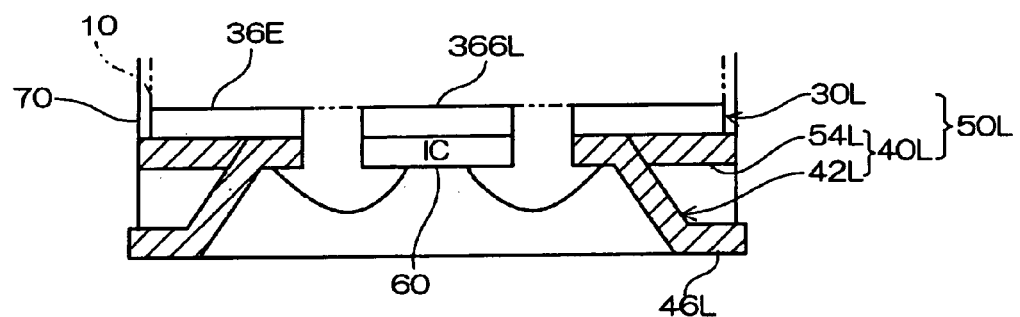

With the tenth exemplary embodiment, the connection leads 32E of the upper lead frame 30K are bent, and the leads of the lower lead frame 40K are not bent, but an arrangement may be made wherein conversely, the leads of upper lead frame are not bent, and the leads of the lower lead frame are bent. FIGS. 34(A)–34(B) are cross-sectional schematics illustrating this example as an eleventh exemplary embodiment. As shown in FIG. 34(A), the layered lead frame 50L is formed of the upper lead frame 30L where the connection terminals 36L are formed, and the lower lead frame 40L. The upper lead frame 30L does not have the connection leads bent, and includes only the connection terminals 36L at the time of being formed into the layered lead frame 50L and cut off from the frame portion. On the other hand, the lower lead frame 40L has the die pad 52L to mount the IC 60, mounting leads 42L, and adjusting terminals 54L. The mounting leads 42L have pads 44L, inclined portions 45L, and mounting terminals 46L at the tip portions. The mounting leads 42L are bent at the tip side to the opposite side from the face of layering (downwards), thereby forming a displacement space for wires 62 to electrically connect the IC 60 mounted on the lower face of the die pad 52L with the pad 44L. Only one lead frame is bent in this eleventh exemplary embodiment as well, so the vertical dimensions of the layered lead frame 50L can be reduced, and the piezoelectric oscillator can be made thinner.

FIG. 34(B) illustrates a modification of the eleventh exemplary embodiment. That is to say, with this modification, a die pad 366L is provided on the upper lead fame 30L, and the IC 60 is mounted on the lower face of the die pad 366L.

Figure 35A:
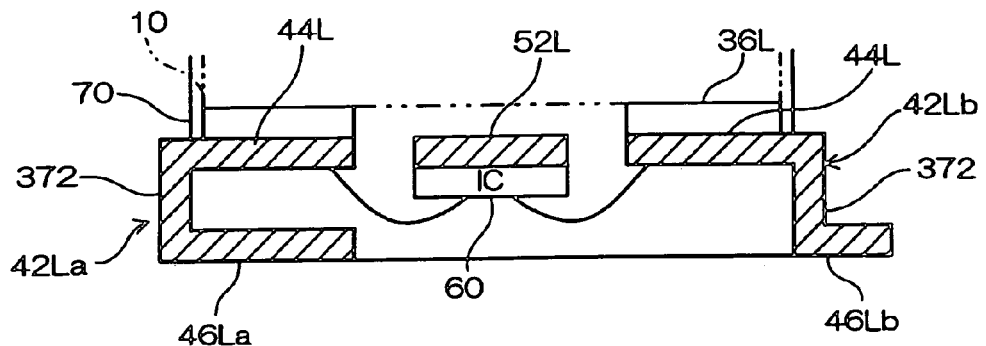
FIGS. 35(A)–35(B) are schematics illustrating another modification of the eleventh exemplary embodiment.
Figure 35B:
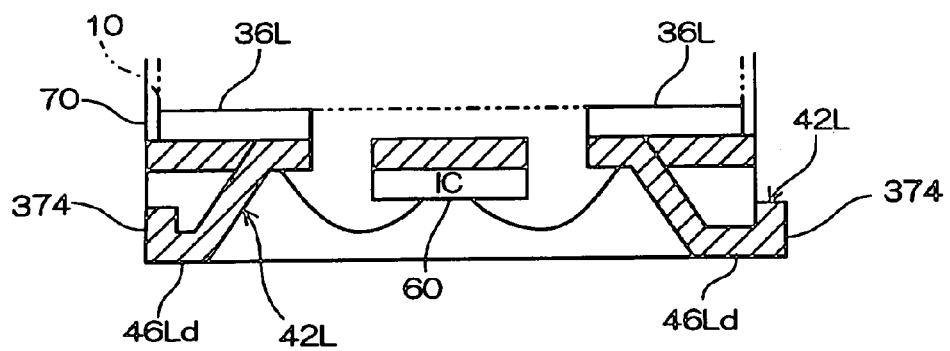

FIGS. 35(A)–35(B) illustrates another modification of the eleventh exemplary embodiment. With the modification illustrated in FIG. 35(1), the mounting leads are formed protruding from the resin package 70, and the protruding portions 372 are bent downwards. The mounting leads 42La shown to the left in the figure are formed into J-leads, with the mounting terminals 46La at the tips positioned at the lower face of the resin package 70. Also, the mounting lead 42Lb shown to the right in the figure is formed in gull-wing fashion, with the mounting terminal 46Lb positioned outside the resin package 70.

The modification shown in FIG. 35(B) has the tip portion of the mounting terminal bent upwards. The modification shown to the left in the figure has the bent portion 374 positioned within the resin package 70 such that the output face of the tip bent portion 374 of the mounting terminal 46Ld matches the side face of the resin package 70. Also, with the modification shown to the right in the figure, the bent portion 374 is positioned outside the resin package 70. With these modifications shown in FIGS. 35(A)–35(B) as well, a great fillet is formed at the time of mounting the piezoelectric oscillator on the mounting board, so whether or not the mounting is good can be readily determined by eye, so the mounting strength can be enhanced.

Figure 36:
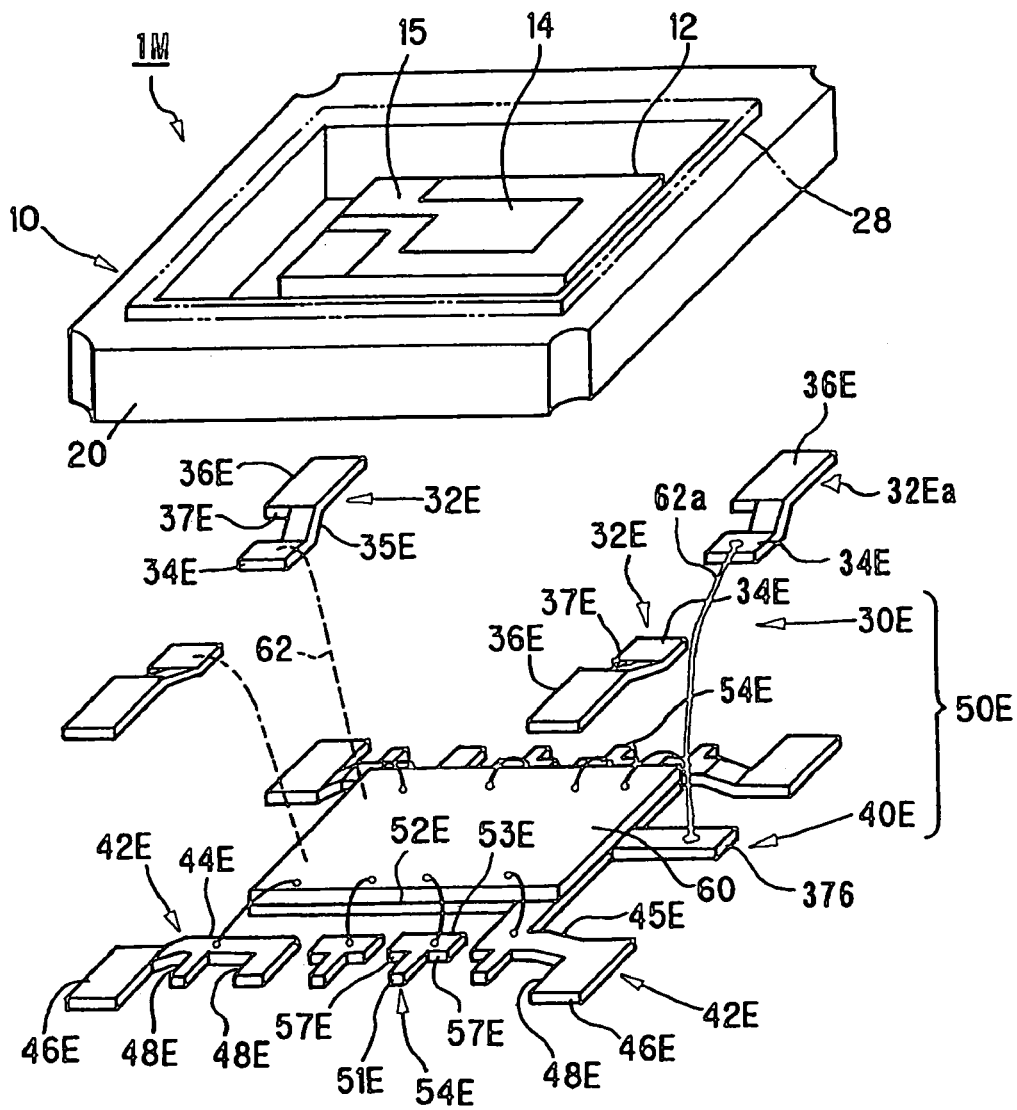
FIG. 36 is an explanatory schematic of a twelfth exemplary embodiment.

FIG. 36 is a disassembled perspective view of a twelfth exemplary embodiment. The piezoelectric oscillator 1M according to this twelfth exemplary embodiment is formed by electrically connecting a tie bar 376 integrally formed with the die pad 52E of the lower lead frame 40E and a connection lead 32Ea of the upper lead fame 30E, with a wire 62a as shown to the right in FIG. 36. There are cases wherein it is advantageous to set the external terminals 24 of the piezoelectric resonator 10 and the die pad 52E at the same potential, and the present exemplary embodiment is effective in such cases. Note that the electrical connection between the connection lead of the upper lead frame and the tie bar of the lower lead frame may be made as shown in FIGS. 37(A)–37(B).

Figure 37A:
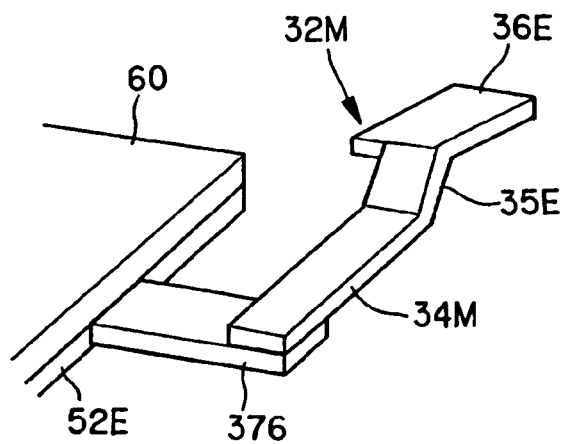
FIGS. 37(A)–37(B) are schematics illustrating another method to connect, a connection lead and a tie bar.

With the example shown in FIG. 37(A), a connection lead 32M, which comes into contact with the upper face of the tie bar 376 formed on the lower lead frame 40E, is formed on the upper lead frame. That is to say, the connection lead 32M has the end portion of the connection portion 34M on the base side positioned above the tie bar 376, such that the lower face thereof comes into contact with the upper face of the tie bar 376. At the time of forming the layered lead frame, the connection portion 34M and the tie bar 376 are joined by spot welding. However, joining of the two may be effected by a silicon or epoxy electroconductive adhesive agent, or an electroconductive material, such as solder or the like.

Figure 37B:
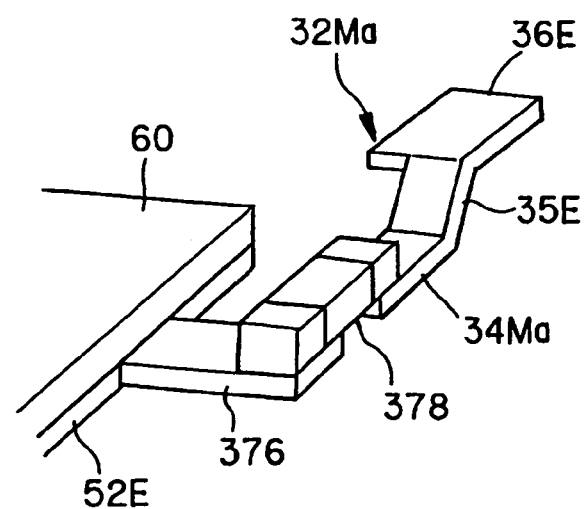

The example shown in FIG. 37(B) is an example wherein connection is made through an electronic part 378. In this case, the connection lead 32Ma formed on the upper lead frame is formed such that the connection portion 34Ma at the base side is positioned at the side of the tie bar 376. The connection portion 34Ma of the connection lead 32Ma and the tie bar 376 are electrically connected through the electrical part 378, such as a capacitor or a resistor or the like.

Figure 38A:
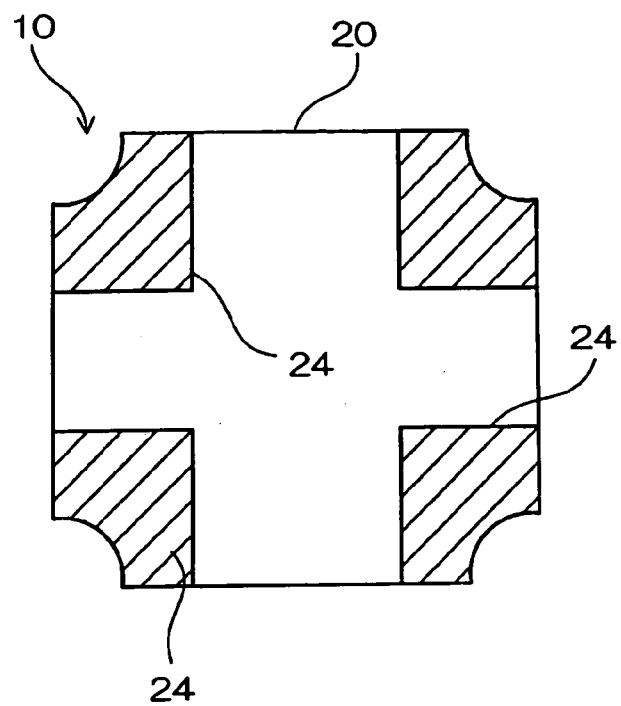
FIGS. 38(A)–38(B) are schematics describing modifications of external electrodes.
Figure 38B:
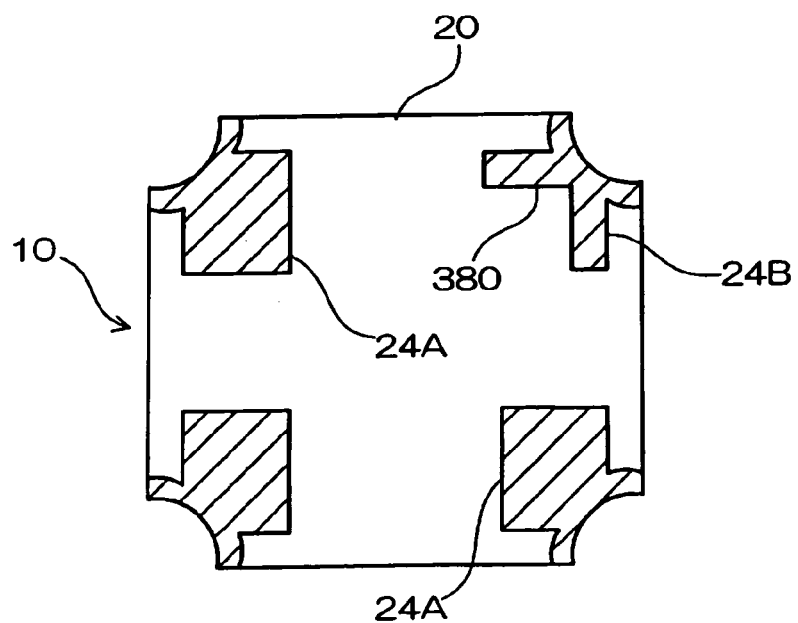

FIGS. 38(A)–38(B) illustrate a modification of the external electrodes formed on the lower face of the package 20 of the piezoelectric resonator 10. The external electrodes 24 are usually formed in a generally rectangular or square shape, and formed such that two sides adjacent across the castellation agree with the sides of the package 20, as shown in FIG. 38(A). However, an arrangement may be made as with the external electrode 24A shown in (B) of the figure, wherein the two sides adjacent across the castellation are distanced from the sides of the package 20. In the event that there is concern of the wires 62 electrically connecting the IC 60 and the lead frame coming into contact with the lower face of the package 20, a notch 380 may be formed to give an L-shape as indicated by the external terminal 24B in the figure. Forming the notch 380, as indicated by the external terminal 24B, allows the area where the wire 62 can come into contact with the package 20 to be enlarged, thereby increasing the degree of freedom in design of the piezoelectric oscillator.

Figure 39A:
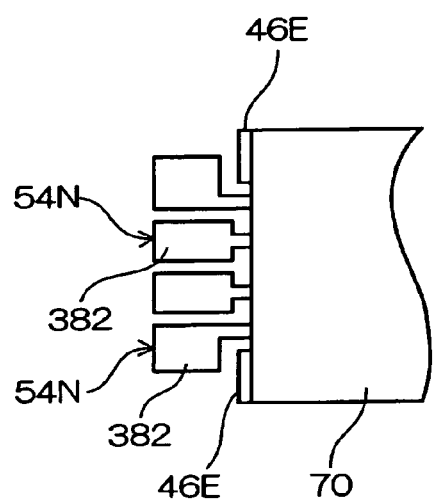
FIGS. 39(A)–39(B) are schematics illustrating modifications of adjusting terminals.
Figure 39B:
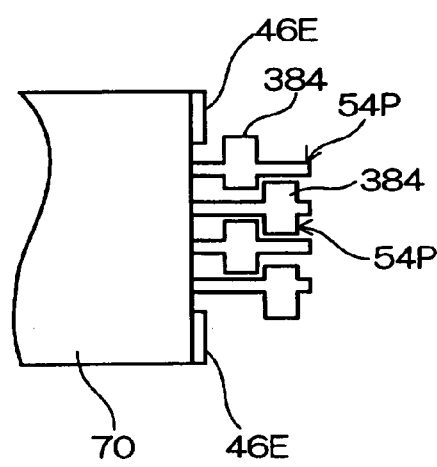

FIGS. 39A—39(B) illustrate a modification of the adjustment terminals. The adjustment terminals 54N shown in FIG. 39(A) have a wide portion 382 at the tip portion. As the size of piezoelectric oscillators are reduced, the width of the adjustment terminals is reduced as well. Accordingly, bringing probes of measuring devices and the like into contact with the adjustment terminals has become difficult. Accordingly, the adjustment terminal 54N has a wide portion 382 at the tip portion thereof provided. Thus, the probe of the measurement device can be readily brought into contact therewith, so property adjustment and inspection can be performed easily and speedily. Also, the adjustment terminals 54P shown in FIG. 39(B) have a wide portion 384 provided to each adjustment terminal 54P, and also the position of the wide portions 384 of the adjacent adjustment terminals 54P are offset in the longitudinal direction of the adjustment terminals. Accordingly, wide portions 384 with a relatively great width can be formed even in the event that the pitch between the adjustment terminals is small.

Figure 40A:
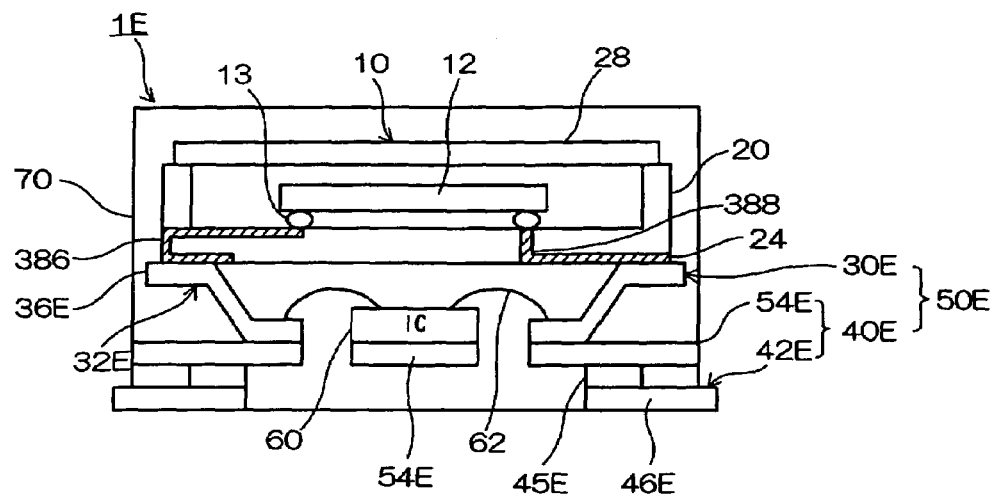
FIGS. 40(A)–40(B) are schematics describing a thirteenth exemplary embodiment.

Now, with the above exemplary embodiments, the space to place the wire 62 to electrically connect the IC 60 and the lead frame has been formed by bending the leads of the lead frame. For example, as shown in FIG. 40(A), with the piezoelectric oscillator 1E according to the fifth exemplary embodiment, space to place the wires 62 is secured by bending the connection leads 32E of the upper lead frame 30E upwards. Note that a part of the external electrodes 24 formed on the lower face of the package 20 of the piezoelectric resonator 10 is electrically connected to an electrode formed on the piezoelectric resonator element 12 via a wiring pattern 386 through the side face of the package 20 or a wiring pattern through a via hole 388.

Figure 40B:
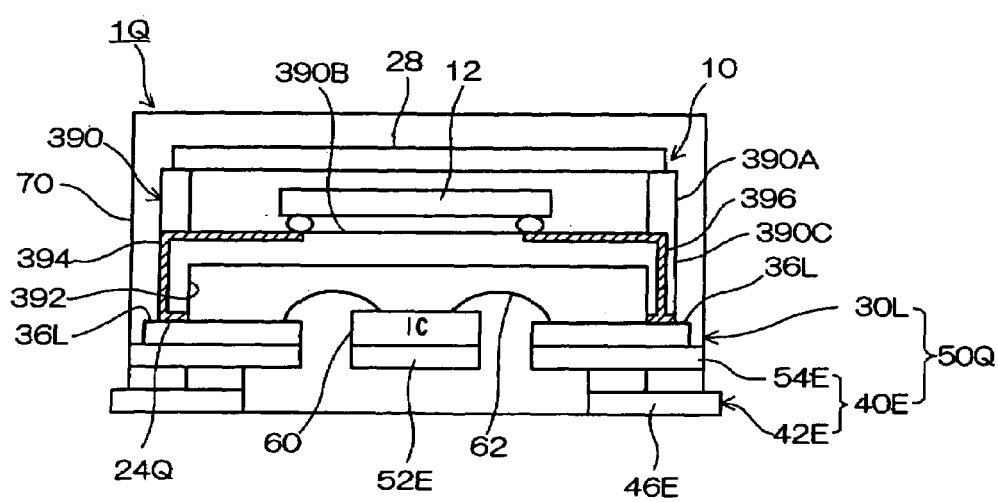

However, the space to place the wires 62 may be formed as with the thirteenth exemplary embodiment shown in FIG. 40(B). The piezoelectric oscillator 1Q according to this thirteenth exemplary embodiment has the upper lead frame 30L of the layered lead frame 50Q formed of plate-shaped connection terminals 36L alone. A base 390A of a resonator package 390 making up the piezoelectric resonator 10 is formed of ceramic, with a spacer portion 390C on the perimeter of the lower face of a bottom portion 390B. Accordingly, the resonator package 390 has a recess 392 to position the wires 62 below the bottom portion 390B formed. The spacer portion 390C may be provided on just two opposing sides of the resonator package 390, or on the four corners in a pillar shape.

External electrodes 24Q joined to the connection electrodes 36L are formed on the lower face of the spacer portion 390C. The external electrodes 24Q are electrically connected to electrodes formed on the piezoelectric resonator element 12 via a wiring pattern 394 through the side face of the resonator package 390 or via a wiring pattern through a via hole 396.

Figure 41:
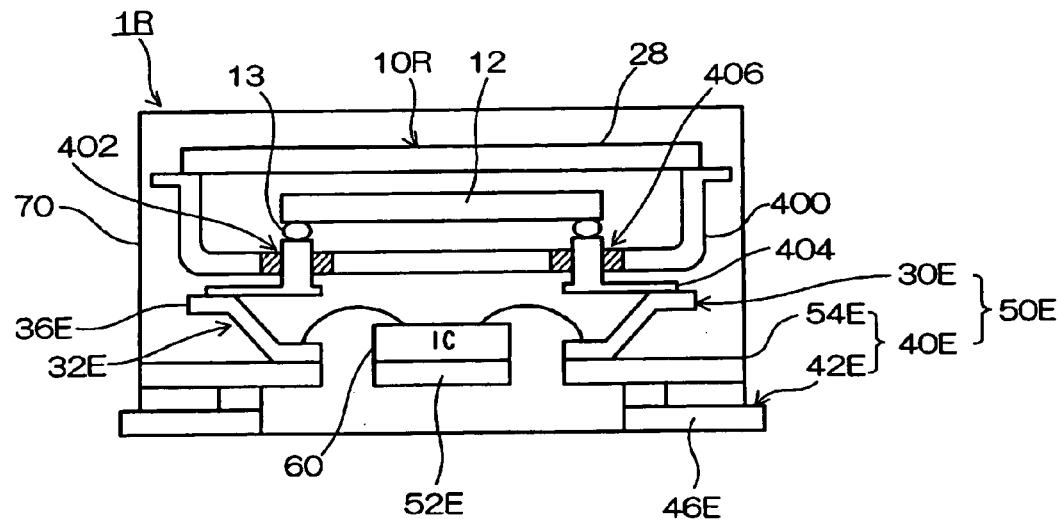
FIG. 41 is an explanatory schematic of a fourteenth exemplary embodiment.

FIG. 41 is a cross-sectional schematic of a fourteenth exemplary embodiment. The piezoelectric oscillator 1R according to this fourteenth exemplary embodiment has a so-called metal package wherein the base 400 of the piezoelectric resonator 10R is formed of metal. Terminal holes are formed on the bottom of the base 400, and terminal members 402 pass through the terminal holes. External terminals (external electrodes) 404 are formed on the bottom portion of the terminal members 402, and the external terminals 404 join to the connection terminals 36E of the upper lead frame 30E. Also, with the terminal members 402, the intermediate portion in the vertical direction is supported by the bottom portion of the base 400 through an insulating member 406, such as borosilicate glass or the like. The tops of the terminal members 402 protrude into the base 400, and are electrically connected to electrodes provided on the piezoelectric resonator element 12, through an electroconductive adhesive material 13. With the piezoelectric oscillator 1R thus formed, the base 400 is formed of metal, so high airtightness can be obtained even if formed thin, and the size and thickness of the resonator package can be reduced. Accordingly, the piezoelectric oscillator 1R can be further reduced in size and thickness.

Figure 42:
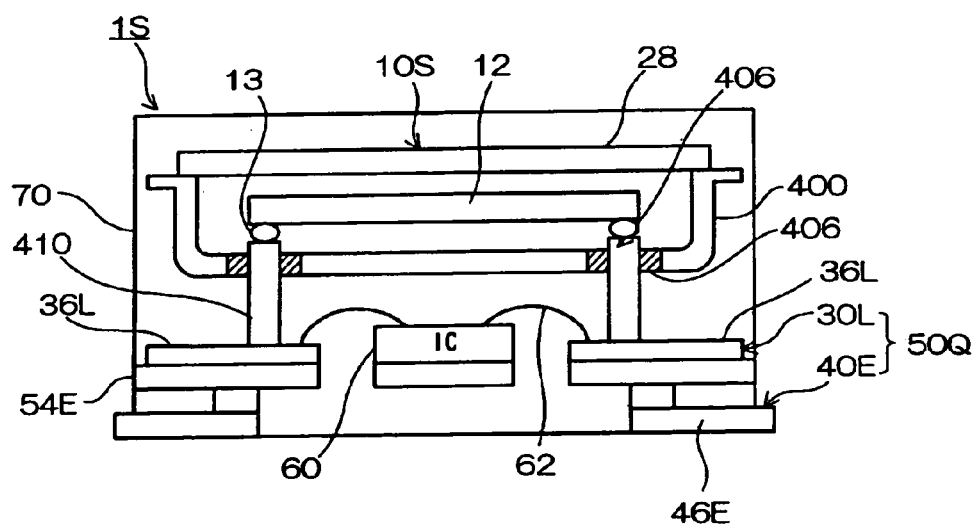
FIG. 42 is an explanatory schematic of a fifteenth exemplary embodiment.

FIG. 42 is a cross-sectional view of a fifteenth exemplary embodiment. The piezoelectric oscillator 1S according to the fifteenth exemplary embodiment has the piezoelectric resonator 10S mounted on the layered lead frame 50Q. With the piezoelectric resonator 10S, terminal members 410 passing through the bottom portion of the metal base 400 are formed in a pillar-like shape. The pillar-shaped terminal members 410 have a larger length of protrusion from the lower face of the base 400, forming a displacement space for the wires 62 between the upper lead frame 30L and the lower face of the base 400. Also, the terminal members 410 are joined at the lower end thereof to connection terminals 36L of the upper lead frame 30 via electroconductive material.

FIGS. 43(A)–43(D) are explanatory schematics of a sixteenth exemplary embodiment. The piezoelectric oscillator 1T shown in FIG. 43(A) has two recesses 420 and 422 at diagonally opposite positions on the upper face of the resin package 70. The recesses 420 and 422 are formed by extrusive ejector pins (not shown) to separate the molded resin package 70 from the mold. One of these recesses 420 and 422, the face of the recess 420 for example, is formed to a mirror surface, while the face of the other recess 422 is formed to a coarse surface, such that the reflectivity of light differs between the two. Accordingly, the recess 420 can be used as an indicator to confirm the direction. That is to say, in the event of mounting the piezoelectric oscillator 1T on a mounting board, this is performed automatically with an image processing device confirming the direction of mounting. Accordingly, recognition of the recess 420 can be facilitated for image processing by forming the face of the recess 420 to a mirror surface and increasing the reflectivity of light, which can be used for an indicator to confirm the direction, thereby making the direction of mounting the piezoelectric oscillator 1T constant in an easy and sure manner.

Figure 43A:
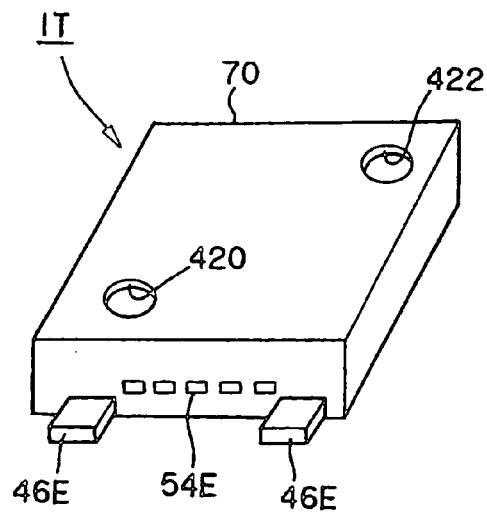
FIG. 43 is an explanatory schematic of a sixteenth exemplary embodiment.
Figure 43B:
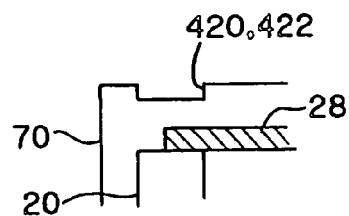
Figure 43C:
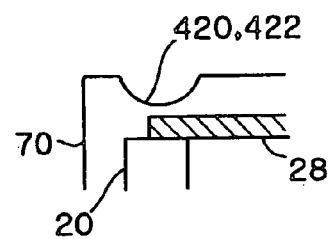
Figure 43D:
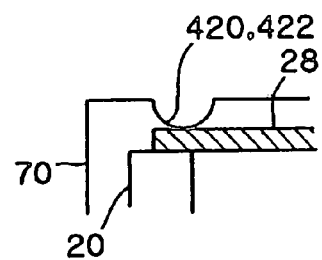

Note that the shape of the recesses 420 and 422 may be cylindrical as shown in FIG. 43(B), or so as to form part of a spherical face as shown in (C) in the figure. Further, the recess 420 and 422 may be formed such that the upper face of the lid 28 is exposed as shown in FIG. 43(D). Also, the recess 420 and recess 422 may have shapes different from each other. The number of recess to be formed on the upper face of the resin package 70 may be three or more.

Figure 44:
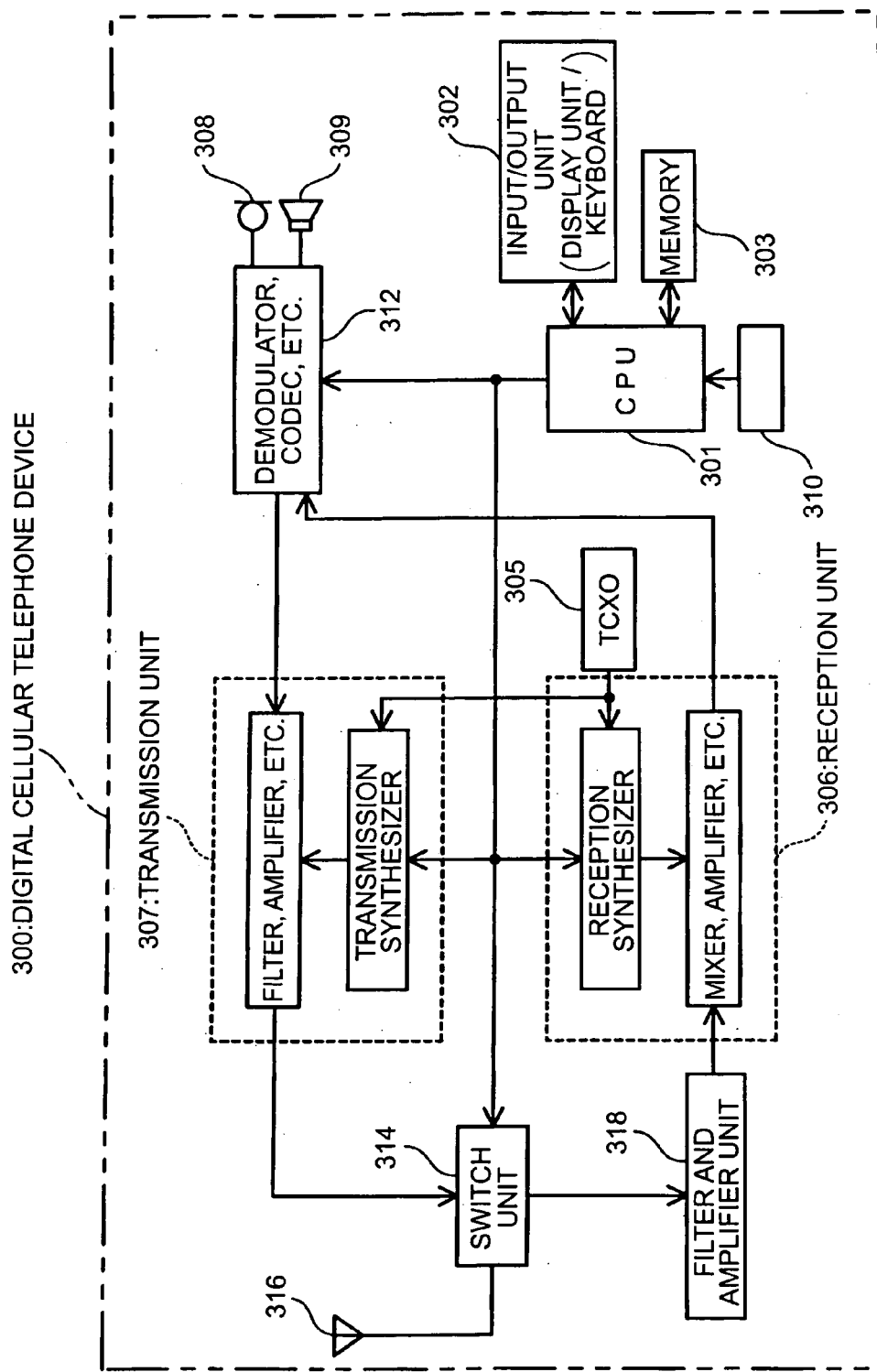
FIG. 44 is a block schematic of a digital cellular telephone device according to an exemplary embodiment.

FIG. 44 is a schematic configuration of a digital cellular telephone device, illustrated as an example of an electronic device using the piezoelectric oscillator according to the above-described exemplary embodiments of the present invention. In FIG. 44, the digital cellular telephone device 300 has a microphone 308 to convert the voice of the originator into electric signals. The electric signals from the microphone 308 are subjected to digital modulation at a demodulator and CODEC unit 312, subjected to frequency conversion to RF (Radio Frequency) band at a transmission unit 307, and then sent to an antenna 316 via a switch unit 314, and transmitted from the antenna 316 to a base station (not shown). The RF signals from the base station are received by the antenna 316, and then input to a reception unit 306 through the switch unit 314 and a filter and amplifier unit 318, and subjected to frequency conversion at the reception unit 306. The received signals subjected to frequency conversion are converted into audio signals at the demodulator and CODEC unit 312, and output from a speaker 309.

Switching of the switch unit 314 is controlled by a CPU (Central Processing Unit) 301, and connects the antenna 316 to the reception unit 306 at normal times and connects the antenna 316 to the transmission unit 307 when transmitting. Also, the CPU 301 controls the operations of the entire digital cellular telephone device 300, including an input/output unit 302 including a liquid crystal display device (display unit) and keyboard, and memory 303. The memory 303 is information storage device formed of RAM (Random Access Memory) and ROM (Read Only Memory), wherein is stored information, such a control programs for the digital cellular telephone device 300 and telephone books and the like.

An example of an application of a piezoelectric oscillator according to an exemplary embodiment of the present invention is a TCXO (Temperature Compensated Crystal Oscillator) 305. This TCXO 305 is a piezoelectric oscillator wherein frequency change due to ambient temperature change is small, and is widely used as a frequency reference source for the reception units 306 and transmission units 307. Demand for reduction in size of the TCXO 305 has increased along with the reduction in size of cellular telephone devices in recent years, and the reduction in size of the piezoelectric oscillator according to the exemplary embodiments of the present invention is extremely advantageous. Also, the piezoelectric oscillator according to the exemplary embodiments of the present invention can be applied to a real-time clock 310 to provide date-and-time information to a cellular telephone device including a CPU 301, for example.

The piezoelectric oscillator according to the exemplary embodiments of the present invention is not restricted to the above digital cellular telephone device 300, and can be applied to, for example, electronic devices which obtain control clock signals from piezoelectric oscillators, such as personal computers, workstations, PDAs (Personal Digital [Data] Assistants: portable information terminals), and the like.

In this way, using the piezoelectric oscillator according to the above-described exemplary embodiments allows electronic devices which are smaller in size and have high reliability to be realized.

What is claimed is:

1. A piezoelectric oscillator including a layered lead frame, comprising:

two lead frames;

connection leads to connect with a piezoelectric resonator being formed on one of said lead frames on one side and said connection leads have an inclined portion, the inclined portion of the connection leads being erected to one said side so as to form connection terminals;

mounting leads to mount to a mounting board are formed on the other of said lead frames on said other side and said mounting leads have an inclined portion, the inclined portion of the mounting leads being erected to the other side so as to form mounting terminals; and an IC forming an oscillating circuit being mounted on said layered lead frame, said piezoelectric resonator formed by sealing a piezoelectric resonator element within a resonator package being mounted on said layered lead frame; and said layered lead frame and said piezoelectric resonator being sealed within a resin package such that the inclined portions of the connection lead and the inclined portion of the mounting lead are sealed internally and that the principal surface of said mounting terminals are exposed outwards, thereby yielding a completed article.

2. The piezoelectric oscillator according to claim 1, further comprising:
adjusting terminals being formed on said layered lead frame to inspect the properties of said IC, adjust the properties, and/or confirm conduction between said piezoelectric resonator and said connection terminals, said adjusting terminals being externally exposed, and said layered lead frame and said piezoelectric resonator being sealed inside the resin package, thereby forming a resin package.

3. The piezoelectric oscillator according to claim 2, said mounting terminals being formed at the same height as said adjusting terminals.

4. The piezoelectric oscillator according to claim 2, said adjusting terminals being exposed at the bottom face of said resin package.

5. The piezoelectric oscillator according to claim 1, said lead frame at the other side having the portions thereof other than said mounting terminals formed thinner than said mounting terminals.

6. The piezoelectric oscillator according to claim 1, said lead frame at the one side having the portions thereof other than said connection terminals formed thinner than said connection terminals.

7. The piezoelectric oscillator according to claim 1, said mounting terminals being provided at a position higher than the lower face of said resin package.

8. The piezoelectric oscillator according to claim 1, said layered lead frame and said piezoelectric resonator being sealed within a resin package such that the side face of said mounting terminals, as well as the principal surface of said mounting terminals, are exposed outwards, thereby forming a resin package.

9. The piezoelectric oscillator according to claim 1, the tips of said mounting terminals protrude from the side face of said resin package.

10. A piezoelectric oscillator according to claim 1, said mounting leads being formed with irregular shapes.

11. The piezoelectric oscillator according to claim 1, said mounting terminals having at least one or more recesses or protrusions formed on said principal surface.

12. The piezoelectric oscillator according to claim 1, said mounting terminals having at least one or more recesses or protrusions formed on the face joining the resin, opposite to said principal surface.

13. The piezoelectric oscillator according to claim 1, said connection leads being formed with irregular shapes.

14. The piezoelectric oscillator according to claim 1, said connection terminals having at least one or more recesses or protrusions formed on one or both of the principal surface to join to said piezoelectric resonator, and the opposite face.

15. The piezoelectric oscillator according to claim 1, notches permitting intrusion of resin being formed on one or both of said connection leads and said mounting leads.

16. The piezoelectric oscillator according to claim 1, recesses or protrusions being formed on the sides of one or both of said connection terminals and said mounting terminals.

17. The piezoelectric oscillator according to claim 1, the sides of one or both of said connection terminals and said mounting terminals being inclined in the thickness direction thereof.

18. The piezoelectric oscillator according to claim 1, a portion of said mounting leads protruding from the side face of said resin package, and bending downwards, so as to be capable of being mounted to a mounting board.

19. The piezoelectric oscillator according to claim 2, a portion of said adjusting terminals protruding from the side face of said resin package, and bending downwards, so as to be capable of being mounted to a mounting board.

20. The piezoelectric oscillator according to claim 1, said IC being mounted to said one lead frame.

21. The piezoelectric oscillator according to claim 1, retaining portions to retain in the height direction of said piezoelectric resonator being formed on the side face of said resonator package, and then said layered lead frame and said piezoelectric resonator being sealed within the resin package, thereby forming the resin package.

22. The piezoelectric oscillator according to claim 1, in order to connect the terminals of said IC and said mounting terminals, a pair of wiring leads being formed on one lead frame on said one side, said wiring leads being erected in said one side so as to form a pair of wiring terminals, and one of said pair of wiring leads being connected to one of said IC terminals or said mounting terminals and the other of said pair of wiring leads being connected to the other of said IC terminals or said mounting terminals, with a pair of electrode pads connected to each of said pair of wiring terminals and a wiring pattern mutually connected to each of said pair of electrode pads having been formed on said piezoelectric resonator.

23. The piezoelectric oscillator according to claim 1, said layered lead frame and said piezoelectric resonator being sealed within the resin package, with the upper face of a lid of said piezoelectric resonator externally exposed, thereby forming the resin package.

24. The piezoelectric oscillator according to claim 1, said lid of said piezoelectric resonator being sealed within the resin package, thereby forming the resin package.

* * * * *